(12) United States Patent
Nakashima et al.

(10) Patent No.: US 6,469,366 B1
(45) Date of Patent: Oct. 22, 2002

(54) BIPOLAR TRANSISTOR WITH COLLECTOR DIFFUSION LAYER FORMED DEEP IN THE SUBSTRATE

(75) Inventors: Takashi Nakashima; Atsushi Tominaga, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 12 days.

(21) Appl. No.: 09/714,112

(22) Filed: Nov. 17, 2000

(30) Foreign Application Priority Data

Apr. 27, 2000 (JP) ........................................ 2000-126838

(51) Int. Cl.[7] .................... H01L 27/082; H01L 27/102
(52) U.S. Cl. ...................... 257/592; 257/565; 257/622
(58) Field of Search ................................. 257/565, 622, 257/498, 520, 592

(56) References Cited

U.S. PATENT DOCUMENTS

| | | | | |
|---|---|---|---|---|
| 4,338,138 A | * | 7/1982 | Cavaliere et al. ............. | 148/1.5 |
| 4,910,572 A | * | 3/1990 | Kameyama .................. | 357/34 |
| 5,043,786 A | * | 8/1991 | Desilets et al. ............. | 357/325 |
| 5,175,607 A | | 12/1992 | Ikeda | |
| 6,287,930 B1 | * | 9/2001 | Park ........................... | 438/369 |

FOREIGN PATENT DOCUMENTS

| | | |
|---|---|---|
| JP | 62-216356 | 9/1987 |
| JP | 5-304159 | 11/1993 |
| JP | 10-135345 | 5/1998 |
| JP | 11-8252 | 1/1999 |

* cited by examiner

Primary Examiner—Richard Elms
Assistant Examiner—Bradley Smith
(74) Attorney, Agent, or Firm—McDermott, Will & Emery

(57) ABSTRACT

A semiconductor device allowing reduction in area occupied by a bipolar transistor as well as a method of manufacturing the same are obtained. The semiconductor device includes a substrate, first conductivity type regions, a collector region, base regions and emitter regions. The first conductivity type region is formed on the substrate, and has a main surface. The collector region is formed in the first conductivity type region. The base region is located in the first conductivity type region and on the collector region. The emitter region is located in the first conductivity type region and on the base region. The first conductivity type region is provided with grooves extending to the collector region, and isolation grooves disposed around a vertical bipolar transistor. The grooves are filled with conductors of the second conductivity type. The isolation grooves are filled with isolation conductors of the second conductivity type.

15 Claims, 35 Drawing Sheets

BIPOLAR TRANSISTOR WITH COLLECTOR DIFFUSION LAYER FORMED DEEP IN THE SUBSTRATE

BACKGROUND OF THE INVENTION

1. Field of the Invention

The present invention relates to a semiconductor device and a method of manufacturing the same, and particularly relates to a semiconductor device provided with a bipolar transistor and a method of manufacturing the same.

2. Description of the Background Art

Bipolar transistors have been known as a kind of semiconductor devices. Bipolar transistors include npn (npn-type) bipolar transistors and pnp (pnp-type) bipolar transistors. The npn and pnp bipolar transistors may be arranged in a common semiconductor device. This kind of semiconductor device will be referred to as a "bipolar IC (Integrated Circuit)" hereinafter. The process of manufacturing the bipolar IC is executed based on the process of forming the npn bipolar transistor. Therefore, a structure shown in FIG. 28 is often used for producing the pnp bipolar transistor of a good performance in the bipolar IC. FIG. 28 is a schematic perspective view of a bipolar transistor IC which is an example of a conventional semiconductor device. Referring to FIG. 28, the conventional bipolar IC will now be described.

Referring to FIG. 28, the bipolar IC is provided with a pnp bipolar transistor and a npn bipolar transistor. In bipolar IC, n-type epitaxial layers 104a–104c, 104f–104h are formed on a p$^-$-type substrate 101 by an epitaxial growth method. n$^+$-type buried regions 102a and 102b are formed in the boundary region between p$^-$-type substrate 101 and n-type epitaxial layers 104a–104c, 104f–104h. n$^+$-type buried region 102a electrically isolates the pnp bipolar transistor from p$^-$-type substrate 101. n$^+$-type buried region 102b forms a low resistance portion in a collector region of the npn bipolar transistor.

A p-type buried region 103b is formed on n$^+$-type buried region 102a. p-type buried region 103b operates as a collector region of the pnp bipolar transistor. The bipolar IC is further provided with p$^+$-type diffusion regions 105b and 105c, which are in contact with p-type buried region 103b, and extend to the top surfaces, i.e., the main surfaces of n-type epitaxial layers 104a–104c, 104f–104h. p$^+$-type diffusion regions 105b and 105c form a collector leader portion of the pnp bipolar transistor. An n-type epitaxial layer 104c is located in a region surrounded by p-type buried region 103b and p$^+$-type diffusion regions 105b and 105c. n-type epitaxial layer 104c forms a base region of the pnp bipolar transistor. A p$^+$-type diffusion region 106b serving as an emitter region of the pnp bipolar transistor is formed at the main surface of n-type epitaxial layer 104c. A p$^+$-type diffusion region 106a is likewise formed in p$^+$-type diffusion region 105b. This p$^+$-type diffusion region 106a is provided for lowering the resistance of the collector leader portion of the pnp bipolar transistor. n-type epitaxial layer 104c is provided with an n$^+$-type diffusion region 107a. n$^+$-type diffusion region 107a is provided for lowering the base leader resistance. The pnp bipolar transistor is surrounded by n-type epitaxial layers 104b and 104f serving as an element isolating region.

An oxide film 108 is formed on the top surfaces of n-type epitaxial layers 104a–104c, 104f–104h. Oxide film 108 is provided with a contact hole 109a located above p$^+$-type diffusion region 106a. In a region located above p$^+$-type diffusion region 106b, oxide film 108 is provided with a contact hole 109b. In a region located above n$^+$-type diffusion region 107a, oxide film 108 is provided with a contact hole 109c.

Electrodes 110a–110c are formed on oxide film 108. Electrode 110a is electrically connected to p$^+$-type diffusion region 106a through contact hole 109a. Electrode 110a serves as a collector leader electrode. Electrode 110b is electrically connected to p$^+$-type diffusion region 106b through contact hole 109b. Electrode 110b serves as an emitter leader electrode. Electrode 110c is electrically connected to n$^+$-type diffusion region 107a through contact hole 109c. Electrode 110c serves as a base leader electrode. The pnp bipolar transistor shown in FIG. 28 is of a vertical type, as can also be seen from FIG. 28.

In the region located above n$^+$-type buried region 102b, a p$^+$-type diffusion region 106c is formed at the top surface of n-type epitaxial layer 104g. n$^+$-type buried region 102b forms a high resistance portion of the collector region of the npn bipolar transistor. An n$^+$-type diffusion region 107c is formed at the top surface of p$^+$-type diffusion region 106c. An n$^+$-type diffusion region 107b is formed at the top surface of n-type epitaxial layer 104g. n-type epitaxial layer 104g serves as a high resistance portion of the collector region of the npn bipolar transistor. p$^+$-type diffusion region 106c serves as a base region of the npn bipolar transistor. n$^+$-type diffusion region 107c serves as an emitter region of the npn bipolar transistor. n$^+$-type diffusion region 107b is provided for lowering the collector leader resistance of the npn bipolar transistor.

Oxide film 108 is formed on the top surface of n-type epitaxial layer 104g as already described. In a region located above n$^+$-type diffusion regions 107b and 107c as well as p$^+$-type diffusion region 106c, oxide film 108 is provided with contact holes 109d–109f. In regions located above contact holes 109d–109f, electrodes 110d–110f are formed on oxide film 108, respectively. Electrode 10d is connected to n$^+$-type diffusion region 107b through contact hole 109d. This electrode 110d serves as a collector leader electrode. Electrode 110e is electrically connected to n$^+$-type diffusion region 107c through contact hole 109e. Therefore, electrode 110e serves as an emitter leader electrode. Electrode 110f is electrically connected to p$^+$-type diffusion region 106c through contact hole 109f. This electrode 110f serves as a base leader electrode. This npn bipolar transistor is surrounded by an element isolating region which is formed of p-type buried regions 103c and 103d as well as p$^+$-type diffusion regions 105d and 105e. In a region opposed to the npn bipolar transistor with the pnp bipolar transistor therebetween, the bipolar IC is provided with an additional npn bipolar transistor, although not shown. The element isolating region formed of p-type buried region 103a and p$^+$-type diffusion region 105a serves as the element isolating region for this additional npn bipolar transistor. n-type epitaxial layer 104a serves as a high resistance portion of the collector region of the above additional npn bipolar transistor. An additional npn bipolar transistor is formed in a position opposed to the pnp bipolar transistor with the npn bipolar transistor therebetween. n-type epitaxial layer 104h forms a high resistance portion of the collector region of this additional npn bipolar transistor.

Referring to FIGS. 29 to 32, description will now be made on the method of manufacturing the bipolar IC shown in FIG. 28. FIGS. 29 to 32 are schematic cross sections or schematic perspective views for showing the method of manufacturing the bipolar IC, which is an example of the conventional semiconductor device and is shown in FIG. 28.

As shown in FIG. 29, n+-type buried regions 102a and 102b are formed at the top surface of p−-type substrate 101. p-type buried regions 103a–103d are formed at predetermined regions of the top surface of p−-type substrate 101.

Then, an epitaxial method is conducted to from n-type epitaxial layer 104 (see FIG. 30) on the top surface of p−-type substrate 101. When conducting this epitaxial growth method, electrically conductive impurities diffuse from n+-type buried regions 102a and 102b as well as p-type buried regions 103a–103d into n-type epitaxial layer 104. A thermal oxide film 111 (see FIG. 30) is formed on the top surface of n-type epitaxial layer 104. In this manner, the structure shown in FIG. 30 is obtained.

In thermal oxide film 111, openings (not shown) are then formed in regions where p+-type diffusion regions 105a–105e (see FIG. 28), which will form the element isolation region and the collector leader portion, are to be formed. These openings may be formed in such a manner that a resist film covering a region other than the foregoing regions, in which the openings are to be formed, is formed by photolithography on the surface of thermal oxide film 11, and etching is effected on the thermal oxide film 111 masked with this resist film for removing portions thereof. p-type impurities are diffused into n-type epitaxial layer 104 through the above openings formed in thermal oxide film 111 so that p+-type diffusion regions 105a–105e (see FIG. 31) are formed. p+-type diffusion regions 105a–105e thus formed are in contact with p-type buried regions 103a–103d. Owing to provision of p+-type diffusion regions 105a–105e, n-type epitaxial layer 104 (see FIG. 30) is divided into n-type epitaxial layers 104a–104c, 104f–104h as shown in FIG. 31. After removing the thermal oxide film 111 by etching or the like, an oxide film 116 (see FIG. 31) is formed by the thermal oxidation method. Thereby, the structure shown in FIG. 31 is obtained.

Then, a resist film is formed on oxide film 116. Using this resist film as a mask, boron ions are implanted into predetermined regions so that p+-type diffusion regions 106a–106c (see FIG. 32) are formed. Thermal processing is executed after this implantation of boron ions.

Then, the oxide film 116 is partially removed to form openings (not shown) in regions where n+-type diffusion regions 107a–107c (see FIG. 32) are to be formed. n-type impurities are diffused through these openings into the predetermined regions in n-type epitaxial layers 104c and 104g as well as p+-type diffusion region 106c so that n+-type diffusion regions 107a–107c are formed. Thereafter, thermal processing is effected on n+-type diffusion regions 107a–107c. In this thermal processing, the top surfaces of n+-type diffusion regions 107a–107c within the openings formed in oxide film 116 are thermally oxidized to form thermal oxide films. As a result, the whole surface of the substrate is covered with an oxide film 117 as shown in FIG. 32.

An oxide film doped with phosphorus is formed as a protective film on oxide film 117 by a CVD (Chemical Vapor Deposition) method or the like. This oxide film formed by the CVD method and oxide film 117 form oxide film 108 (see FIG. 28).

Thereafter, contact holes 109a–109f are formed in predetermined regions of oxide film 108. Contact holes 109d, 109e and 109f are a collector contact, an emitter contact and a base contact in the npn bipolar transistor, respectively. In the pnp bipolar transistor, contact holes 109a–109c are a collector contact, an emitter contact and a base contact, respectively. Thereafter, electrodes 110a–110f, which are made of metal such as aluminum and serve as interconnection layers, are formed on oxide film 108. In this manner, the structure shown in FIG. 28 is formed.

In the case where the foregoing bipolar transistor is used in an output portion of a semiconductor device, the emitter, base and collector forming the bipolar transistor must have large sizes because a large current must flow through the output portion. More specifically, the contact area of each of the emitter region, base region and collector region must be large so that a large current can flow. For this purpose, as shown in FIG. 33, such measures are employed that the plurality of emitter regions, base regions and collector regions are arranged in parallel. FIG. 33 is a schematic perspective view showing another example of the conventional semiconductor device provided with a vertical pnp bipolar transistor, which is formed of a structure having a current drive capability corresponding to three transistors.

The example of the conventional semiconductor device shown in FIG. 33 will now be described.

Referring to FIG. 33, the semiconductor device is provided with n-type epitaxial layers 104a–104g on p−-type substrate 101, similarly to the semiconductor device shown in FIG. 28. n+-type buried region 102 and p-type buried regions 103a and 103c are formed in a boundary region between p−-type substrate 101 and n-type epitaxial layers 104a–104g. n+-type buried region 102 electrically isolates the pnp bipolar transistor from p−-type substrate 101. p-type buried region 103b is formed on n+-type buried region 102. p-type buried region 103b serves as a collector region of the pnp bipolar transistor. p+-type diffusion regions 105b–105e serving as the collector leader portion is formed in the predetermined region on p-type buried region 103b. p+-type diffusion regions 105b–105e and p-type buried region 103b surround n-type epitaxial layers 104c–104e. n-type epitaxial layers 104b and 104f serving as the element isolating region of the pnp bipolar transistor surround p-type buried region 103b. p+-type diffusion regions 105a and 105f surrounding p-type buried region 103b are formed in the regions located above p-type buried regions 103a and 103c, respectively. p-type buried regions 103a and 103c as well as p+-type diffusion regions 105a and 105f form the element isolation of an npn bipolar transistor (not shown). n-type epitaxial layers 104a and 104g form a high resistance portion of the collector region of this unillustrated npn bipolar transistor.

p+-type diffusion regions 106b, 106d and 106f as well as n+-type diffusion regions 107a–107c are formed in predetermined regions in n-type epitaxial layers 104c–104e. n-type epitaxial layers 104c–104e serve as the base region of the pnp bipolar transistor. p+-type diffusion regions 106b, 106d and 106f serve as the emitter region of the pnp bipolar transistor. n+-type diffusion regions 107a–107c have a function of lowering the leading resistance of the base region of the pnp bipolar transistor.

In p+-type diffusion regions 105b–105e, there are formed p+-type diffusion regions 106a, 106c, 106e and 106g, which have a function of lowering a leader resistance of the collector.

An oxide film 108 is formed on the top surfaces of n-type epitaxial layers 104a–104g. Oxide film 108 is provided at predetermined regions with contact holes 109a–109j, respectively. Contact holes 109a, 109d, 109g and 109j are collector contacts. Contact holes 109b, 109e, 109h are emitter contacts. Contact holes 109c, 109f and 109i are base contacts. Electrodes 110a–110j made of metal such as aluminum have portions located in contact holes 109a–109j, respectively, and extend therefrom onto the top surface of oxide film 108. Electrodes 110a, 110d, 110g and 110j are collector leader electrodes. Electrodes 110b, 110e and 110h are emitter leader electrodes, and electrodes 110c, 110f and 110i are base leader electrodes.

FIGS. 34 and 35 are schematic perspective views showing another example of the method of manufacturing the conventional semiconductor device shown in FIG. 33. Referring to FIGS. 34 and 35, description will now be made on the method of manufacturing the bipolar IC which is an example of the semiconductor device, and is shown in FIG. 33. The method of manufacturing the semiconductor device shown in FIG. 33 is basically similar to the method of manufacturing the semiconductor device shown in FIGS. 29 to 32. Thus, processing is performed to from n$^+$-type buried region 102 (see FIG. 34) at the main surface of p$^-$-type substrate 101 (shown in FIG. 34). Then, p-type buried regions 103a–103c (see FIG. 34) are formed at the main surface of p$^-$-type substrate 101. An epitaxial growth method is conducted to form the n-type epitaxial layer (not shown) on the main surface of p$^-$-type substrate 101. Thereafter, thermal oxidation is conducted to form a thermal oxide film (not shown) on the top surface of the n-type epitaxial layer, similarly to the step shown in FIG. 30.

The thermal oxide film is partially removed to form openings (not shown). p-type impurities are diffused into predetermined regions of the n-type epitaxial layer through the openings so that p$^+$-type diffusion regions 105a–105f (see FIG. 34) are formed. p-type buried regions 103a and 103c as well as p$^+$-type diffusion regions 105a–105f divide the n-type epitaxial layer into n-type epitaxial layers 104a–104g (see FIG. 34). After forming p$^+$-type diffusion regions 105a–105f, the thermal oxide film is once removed. The thermal oxidation method is executed again to form oxide film 116 (see FIG. 34) on the upper surfaces of n-type epitaxial layers 104a–104g. In these manners, the structure shown in FIG. 34 is obtained.

Thereafter, a resist film is formed on oxide film 116. Using this resist film as a mask, boron ions are implanted into the predetermined region, and then the thermal oxidation is performed. In this manner, p$^+$-type diffusion regions 106a–106g (see FIG. 35) are formed. Thereafter, the resist film is removed. Oxide film 116 is partially removed from portions located on the regions where n$^+$-type diffusion regions 107a–107c (see FIG. 35) are to be formed. Thereby, openings are formed. Through these openings, n-type impurities are diffused into the predetermined regions of n-type epitaxial layers 104c–104e so that n$^+$-type diffusion regions 107a–107c are formed. Thermal oxidation processing is performed simultaneously with the thermal processing, which is performed for activating n$^+$-type diffusion regions 107a–107c, so that thermal oxide films are formed in the foregoing openings, respectively. In this manner, the top surfaces of n-type epitaxial layers 104a–104g are covered with oxide film 117 (see FIG. 35). Thereby, the structure shown in FIG. 35 is obtained.

Using oxide film 117 as a protective film, the CVD method or the like is then conducted to form an oxide film doped with phosphorus. As a result, the oxide film doped with phosphorus and oxide film 117 form oxide film 108 (see FIG. 33).

Thereafter, contact holes 109a–109j are formed in predetermined regions of oxide film 108 through steps similar to those shown in FIGS. 29 to 32. Electrodes 110a–110j are formed on contact holes 109a–109j. In this manner, the structure shown in FIG. 33 is obtained.

In the semiconductor device shown in FIG. 33, the pnp bipolar transistor for output is provided with the plurality of emitter regions, base regions and collector regions, which are formed in parallel, for increasing the current drive capability. Therefore, the pnp bipolar transistor occupies a large area on the substrate.

p$^+$-type diffusion regions 105b–105e serving as the collector leader portion are formed by diffusing the p-type conductive impurities into the n-type epitaxial layer as described above. When the conductive impurities diffuses to a predetermined depth, they also diffuse laterally. Therefore, the area occupied by the bipolar transistor can be reduced only to a limited extent.

However, further miniaturization and increase in density of the semiconductor device have been increasingly demanded. In the bipolar transistor for the output described above, therefore, it is strongly required to reduce an occupied area while maintaining a required value of the current drive capability.

SUMMARY OF THE INVENTION

An object of the invention is to provide a semiconductor device allowing reduction in area occupied by a bipolar transistor as well as a method of manufacturing the same.

Another object of the invention is to provide a semiconductor device, which can reliably keep a sufficient current drive capability while reducing an area occupied by a bipolar transistor, as well as a method of manufacturing the same.

According to an aspect of the invention, a semiconductor device includes a substrate, a first conductivity type region, a collector region, a base region and an emitter region. The first conductivity type region is formed on the substrate, and has a main surface. The collector region is formed in the first conductivity type region. The base region is located in the first conductivity type region and on the collector region. The emitter region is located in the first conductivity type region and on the base region. The first conductivity type region is provided with a groove extending from the main surface of the first conductivity type region to the collector region, and an isolation groove disposed around a vertical bipolar transistor including the collector, base and emitter regions. The groove is filled with a conductor of the second conductivity type. The isolation groove is filled with an isolation conductor of the second conductivity type.

In the prior art, a collector leader region is formed by diffusing impurities of the second conductivity type into the first conductivity type region. When diffusing the impurities of the second conductivity type to a predetermined depth, the impurities of the second conductivity type also diffuse and expand laterally. Therefore, the area occupied by the vertical bipolar transistor can be reduced only to a limited extent. According to the invention, however, the groove for the collector leader region is formed in the first conductivity type region, and the groove is filled with this conductor. Thereby, the width of the groove can be sufficiently reduced so that the width of the collector leader region can be reliably reduced as compared with the case where the collector leader region is formed by diffusing the impurities. As a result, the area occupied by the vertical bipolar transistor can be reduced. Accordingly, the sizes of the semiconductor device can be easily reduced.

By utilizing the isolation groove for element isolation, the width of element isolation can be reduced as compared with the conventional case where the element isolation is formed by the diffusing step. Therefore, the area occupied by the element isolation can be reduced so that the sizes of the semiconductor device can be further reduced.

The semiconductor device of the above aspect may include an additional collector region of the second conductivity type, an additional base region of the first conductivity type and an additional emitter region of the second conductivity type. The additional collector region may be formed in a region surrounded by the isolation groove in the first conductivity type region, and the additional base region may be located in the first conductivity type region and on the additional collector region. The additional emitter region may be located in the first conductivity type region and on the additional base region. The first conductivity type region may be provided with an additional groove extending from the main surface of the first conductivity type region to the additional collector region. The additional groove may be filled with an additional conductor of the second conductivity type.

In the above case, the plurality of collector regions, base regions and emitter regions are disposed in the region surrounded by the isolation groove, whereby it is possible and easy to provide the semiconductor device which includes the bipolar transistor having a high current drive capability. The additional conductor filling the additional groove is used as an additional collector leader region connected to the additional collector region, whereby the width of the additional collector leader region can be smaller than that in the prior art. Therefore, the area occupied by the bipolar transistor can be reliably reduced, and further the current drive capability can be high.

According to another aspect of the invention, a semiconductor device includes a substrate, a first conductivity type region, a collector region of a second conductivity type, a base region of a first conductivity type, an emitter region of the second conductivity type and a base leader electrode. The first conductivity type region is formed on the substrate, and has a main surface. The collector region is formed at the main surface of the first conductivity type region. The base region is disposed in the first conductivity type region, and neighbors to a periphery of the collector region. The emitter region is located in the first conductivity type region and is formed in a region opposed to the collector region with the base region therebetween. The base leader electrode is located in the first conductivity type region, and is formed in a region opposed to the emitter region with the collector region therebetween. A bipolar transistor including the collector, base and emitter regions is a lateral bipolar transistor. The collector region includes an impurity diffusion region of the second conductivity type formed at the main surface of the first conductivity type region, and a collector buried layer of the second conductivity type in contact with the lower side of the impurity diffusion region.

According to the above aspect, the collector buried region can be formed in the region deep from the main surface of the first conductivity type region, and such deep region cannot be reached in a general diffusion step without difficulty. It is possible to utilize, as the collector region, the collector buried layer of the second conductivity type, which is formed in the region deep from the main surface of the first conductivity type region. Therefore, the collector resistance can be smaller than that in the prior art. Therefore, the current drive capability of the bipolar transistor can be increased.

The base leader electrode is formed in the region opposed to the emitter region with the collector region therebetween. As a result, the lateral bipolar transistor includes the base leader electrode formed in a portion other than the portion between the collector and emitter regions. Consequently, in the semiconductor device employing the plurality of collector regions, base regions and emitter regions for achieving a further increased current drive capability, the base leader electrode which can be commonly utilized by the plurality of base regions can be formed in the region other than the portion between the collector and emitter regions. Therefore, the base leader electrode can be smaller in number than the plurality of base regions. Consequently, the area occupied by the bipolar transistor can be smaller than that in a conventional structure which employs base leader electrodes corresponding to the respective base regions.

In the semiconductor device of the above aspect, the collector region is preferably provided with a groove extending from the main surface of the first conductivity type region to the collector buried layer, and the impurity diffusion region preferably includes a conductor of the second conductivity type filling the groove.

According to the above structure, the width of the groove can be sufficiently reduced, whereby the width of the collector region can be reliably reduced as compared with the case where the collector region is formed by diffusing the impurities. As a result, the area occupied by the lateral bipolar transistor can be reduced. Accordingly, the sizes of the semiconductor device can be easily reduced.

In the semiconductor device of the above aspect, the emitter region is preferably provided with an additional groove formed at the main surface of the first conductivity type region, and preferably includes an additional conductor of the second conductivity type filling the additional groove.

In this case, since the conductor filling the additional groove is utilized as the emitter region, the width of the emitter region can be smaller than that of a conventional emitter region formed in the diffusion step. As a result, the area occupied by the bipolar transistor can be reduced.

In the semiconductor device of the above aspect, the emitter region preferably includes an additional impurity diffusion region of the second conductivity type reaching the main surface of the first conductivity type region, and an emitter buried layer of the second conductivity type in contact with the lower side of the additional impurity diffusion region.

According to the above aspect, the emitter buried region can be formed in the region, which is deep from the main surface of the first conductivity type region, and cannot be reached in a general diffusion step without difficulty. Since the emitter buried layer is utilized as the emitter region, the contact area between the emitter region and the base region can be further increased. Consequently, the current drive capability of the bipolar transistor can be further increased.

In the semiconductor device of the above aspect, the emitter region is preferably provided with an additional groove extending from the main surface of the first conductivity type region to the emitter buried layer, and the additional impurity diffusion region preferably includes an additional conductor of the second conductivity type filling the additional groove.

In this case, since the conductor filling the additional groove is utilized as the emitter region, the width of the emitter region can be smaller than that of the conventional emitter region formed in the diffusion step. Consequently, the area occupied by the bipolar transistor can be further reduced.

In the semiconductor device of the above aspect, the collector buried layer may be located at a lower level than the emitter region viewed from the main surface of the first conductivity type region, and may extend to a region other than the region located immediately under the emitter region.

In this case, since the collector buried layer has the extended form, the surface area of the collector buried layer can be large (and thus the contact area between the collector and base regions can be large) so that the collector resistance can be reduced. Consequently, the current drive capability can be further increased.

Since the collector buried layer is not present immediately under the emitter region, a breakdown voltage between the collector and emitter can be larger than that in the case where the collector buried layer extends immediately under the emitter region.

In the semiconductor device of the above aspect, the collector buried layer may be located at a lower level than the emitter region viewed from the main surface of the first conductivity type region, and may extend to a region located immediately under the emitter region.

In this case, since the collector buried layer extends to the position immediately under the emitter region, the bipolar transistor including these emitter, collector and base regions can perform an operation similar to that of a vertical bipolar transistor. As a result, the current drive capability similar to that of the conventional vertical bipolar transistor can be obtained.

Preferably, the semiconductor device of the above aspect further includes an additional collector region of the second conductivity type, an additional base region of the first conductivity type, an additional emitter region of the second conductivity type and a lower level buried layer of the first conductivity type. The additional collector region is formed at the main surface of the first conductivity type region. The additional base region is located in the first conductivity type region, and neighbors to the additional collector region. The additional emitter region is located in the first conductivity type region, and is formed in a region opposed to the additional collector region with the additional base region therebetween. An additional bipolar transistor including the additional collector region, the additional base region and the additional emitter region is a lateral bipolar transistor. The lower level buried layer is formed under the collector buried layer, and is connected to the base region and the additional base region. The base leader electrode is formed at the main surface of the first conductivity type region, and is electrically connected to the lower level buried layer.

In this case, the base leader electrode can operate as the base leader electrode common to the base region and the additional base region. As a result, the base leader electrode can be smaller in number than the base regions in the structure provided with the plurality of emitter regions, base regions and collector regions. Consequently, the area occupied by the bipolar transistor can be smaller than that in the conventional structure where the base leader electrodes are formed corresponding to the respective base regions.

According to still another aspect of the invention, the semiconductor device includes a substrate, a first conductivity type region, a collector region of a second conductivity type, a base region of a first conductivity type, an emitter region of the second conductivity type, and a base leader electrode. The first conductivity type region is formed on the substrate, and has a main surface. The collector region is formed at the main surface of the first conductivity type region. The base region is located in the first conductivity type region, and neighbors to the periphery of the collector region. The emitter region is located in the first conductivity type region, and is formed in a region opposed to the collector region with the base region therebetween. The base leader electrode is located in the first conductivity type region, and is formed in a region opposed to the emitter region with the collector region therebetween. A bipolar transistor including the collector, base and emitter regions is a lateral bipolar transistor. The collector region includes a conductor of the second conductivity type filling a groove formed at the main surface of the first conductivity type region, and an impurity diffusion layer of the second conductivity type formed around the groove.

In the above structure, since the conductor filling the groove and the impurity diffusion layer formed around the groove can be utilized as the collector region, the area occupied by the collector region can be smaller than that occupied by a conventional collector region formed in the diffusion step. As a result, an area occupied by the bipolar transistor can be reduced, and therefore the sizes of the semiconductor device can be easily reduced.

The base leader electrode is formed in the region opposed to the emitter region with the collector region therebetween. In this structure, the lateral bipolar transistor includes the base leader electrode formed in a portion other than the portion between the collector and emitter regions. Consequently, in the semiconductor device employing the plurality of collector regions, base regions and emitter regions for achieving a further increased current drive capability, the base leader electrode which can be commonly utilized by the plurality of base regions can be formed in the region other than the portion between the collector and emitter regions. Therefore, the base leader electrode can be smaller in number than the plurality of base regions. Consequently, the area occupied by the bipolar transistor can be smaller than that in a conventional structure which employs base leader electrodes corresponding to the respective base regions.

In the semiconductor device of the above aspect, a buried layer of the first conductivity type located under the collector region may be formed in the first conductivity type region, and may be in contact with the buried layer.

In this case, since the collector region extends to a deep region provided with the buried layer, the surface area of the collector region can be increased. As a result, a high current drive capability can be achieved in the bipolar transistor.

In the above case, the base region located between the emitter and collector regions can be electrically connected to the base leader electrode via the buried layer of the first conductivity type. The concentration of the first conductivity type impurities in the buried layer of the first conductivity type may be sufficiently increased, whereby the base leader resistance can be reduced.

In the semiconductor device of the above aspect, the emitter region may be in contact with the buried layer.

In this case, since the emitter region is likewise extended to a deep region in contact with the buried layer, the emitter region can have a large surface area. As a result, the current drive capability can be improved.

In the semiconductor device of the above aspect, the emitter region is preferably provided with an additional groove formed at the main surface of the first conductivity type region. The emitter region preferably includes an additional conductor of the second conductivity type filling the additional groove and an additional impurity diffusion layer of the second conductivity type formed around the additional groove.

Similarly to the collector region, the area occupied by the emitter region can be smaller than that occupied by the conventional emitter region formed in the diffusion step. Consequently, the area occupied by the bipolar transistor can be reduced.

According to a further aspect of the invention, a method of manufacturing a semiconductor device includes the following steps. A base buried layer of a first conductivity type is formed at a top surface of a substrate. A buried layer containing impurities of a second conductivity type is formed on the base buried layer. A first conductivity type region is formed on the top surface of the substrate by an epitaxial growth method, and a collector region is formed by diffusion of impurities of the second conductive type from the buried layer into the first conductivity type region. A groove reaching the collector region and an isolation groove disposed around the collector region are formed at the top surface of the first conductivity type region. The groove and the isolation groove in the first conductivity type region are filled with a conductor of the second conductivity type. Impurities of the second conductivity type are introduced into a region located within the first conductivity type region and spaced from the groove to form an emitter region of the second conductivity type.

According to the above method, the conductor filling the groove can be utilized as the collector leader region. By filling the groove and the isolation groove with the conductor of the second conductivity type, it is possible to form easily the collector leader region and the isolation structure occupying a smaller area that a collector leader region and an isolation structure formed in the conventional diffusion step. As a result, an area occupied by the bipolar transistor can be reduced.

In further another aspect, a method of manufacturing a semiconductor device includes the following steps. A base buried layer of a first conductivity type is formed at a top surface of a substrate. A buried layer containing impurities of a second conductivity type is formed in the base buried layer. A first conductivity type region is formed on the top surface of the substrate by an epitaxial growth method, and a collector buried layer of the second conductivity type forming a collector region is formed by diffusion of impurities of the second conductive type from the buried layer into the first conductivity type region. An impurity diffusion region of the second conductivity type forming the collector region is formed in a region extending from the top surface of the first conductivity type region to the collector buried layer. Impurities of the second conductivity type are introduced into a region located within the first conductivity type region and spaced from the impurity diffusion region to form an emitter region of the second conductivity type.

In the above aspect, since the collector buried layer is utilized as the collector region, the collector region can have an increased surface area. As a result, the semiconductor device provided with the bipolar transistor having an increased current drive capability can be easily obtained.

In yet another aspect, a method of manufacturing a semiconductor device includes the following steps. A buried layer containing impurities of a first conductivity type is formed at a top surface of a substrate. A first conductivity type region is formed on the top surface of the substrate by an epitaxial growth method, and a lower level buried layer is formed by diffusion of impurities of the first conductive type from the buried layer into the first conductivity type region. A groove is formed at the top surface of the first conductivity type region. The groove in the first conductivity type region is filled a conductor of the second conductivity type forming a collector region. An impurity diffusion region of the second conductivity type forming the collector region is formed around the groove in the first conductivity type region. Impurities of the second conductivity type are introduced into a region located within the first conductivity type region and spaced from the groove to form an emitter region of the second conductivity type.

In the above aspect, the conductor of the second conductivity type filling the groove and the impurity diffusion region can be utilized as the collector region. The collector region utilizing the above groove can have a width smaller than that of a collector region formed in the conventional diffusion step without difficulty. As a result, an area occupied by the bipolar transistor can be reliably reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
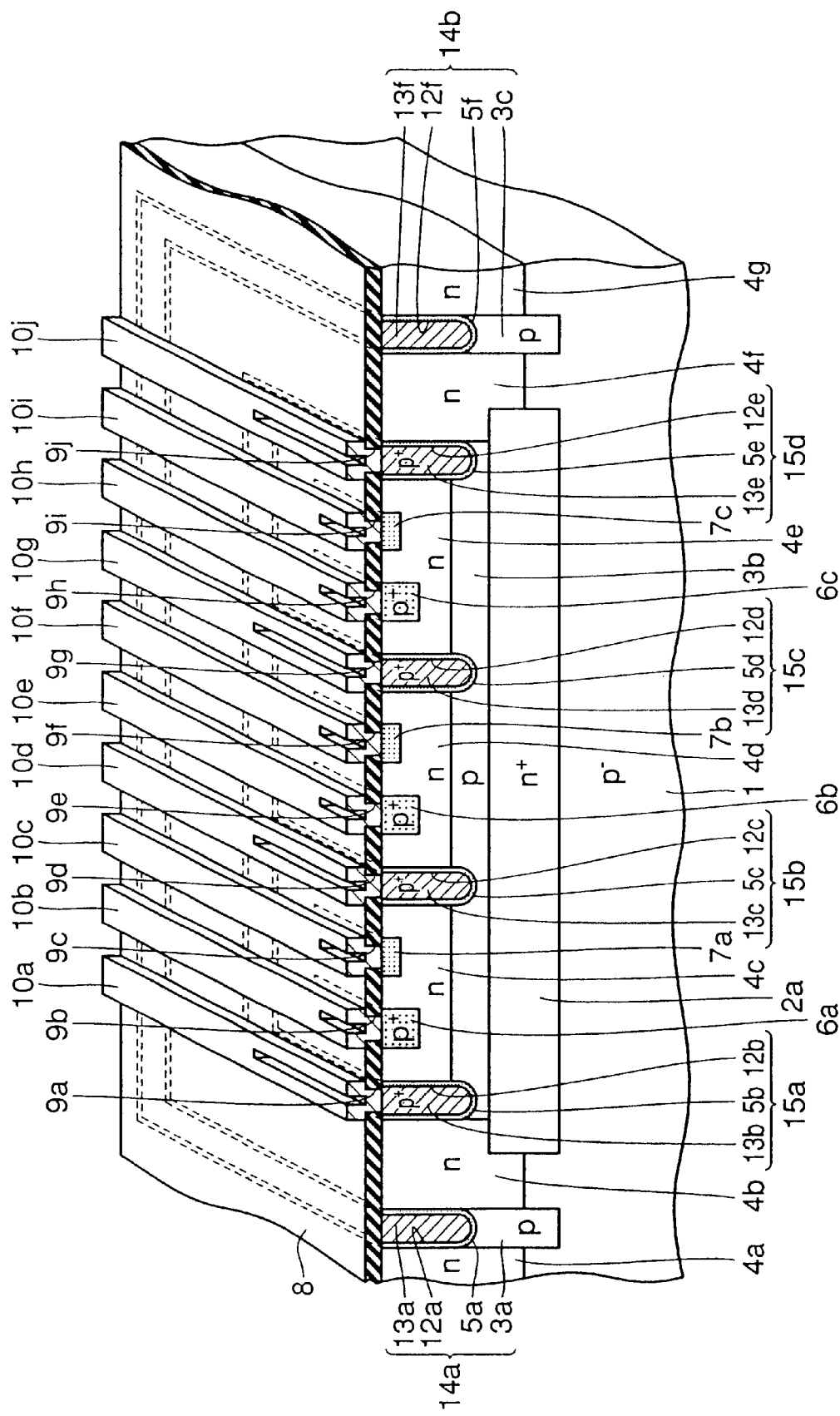
FIG. 1 is a schematic perspective view showing a first embodiment of the semiconductor device according to the invention.

Embodiments of the invention will now be described below with reference to the drawings. In the drawings, the same or corresponding portions bear the same reference numbers, and description thereof is not repeated.
(First Embodiment)

A semiconductor device shown in FIG. 1 includes a vertical pnp bipolar transistor which is formed of a structure having a current drive capability corresponding to three transistors. Referring to FIG. 1, description will now be made on the semiconductor device of a first embodiment of the invention.

Referring to FIG. 1, the semiconductor device includes a p$^-$-type substrate 1, on which n-type epitaxial layers 4a–4g serving as a first conductivity type region are formed. An n$^+$-type buried region 2a as well as p-type buried regions 3a and 3c surrounding n$^+$-type buried region 2a are formed in a boundary region between p$^-$-type substrate 1 and n-type epitaxial layers 4a–4g. n$^+$-type buried region 2a electrically isolates the pnp bipolar transistor from p$^-$-type substrate 1. A p-type buried region 3b is formed on n$^+$-type buried region 2. p-type buried region 3b serves as a collector region of the pnp bipolar transistor. Collector leader portions (collector leader regions) 16a–15d are formed in predetermined regions on p-type buried region 3b, respectively. Collector leader portions 15a–15d are formed of grooves 12b–12e formed at the top surfaces and therefore the main surfaces of the n-type epitaxial layers, p-type polycrystalline silicon films 13b–13e which serve as conductors and additional conductors filling grooves 12b–12e, respectively, and p$^+$-type diffusion regions 5b–5e formed around grooves 12b–12e, respectively. Grooves 12b–12e have portions reaching p-type buried region 3b serving as the collector region. p-type polycrystalline silicon films 13b–13e are doped with impurities such as boron of which conductivity type is p-type. n-type epitaxial layers 4c–4e are formed in regions surrounded by collector leader portions 15a–15d and p-type buried region 3b. n-type epitaxial layers 4b and 4f serving as the element isolating region of the pnp bipolar transistor surround p-type buried region 3b.

Grooves 12a and 12f, which serve as isolation grooves and surround the vertical pnp bipolar transistor including p-type buried region 3b, are formed at the top surfaces of the n-type epitaxial layers located on p-type buried regions 3a and 3c. Grooves 12a and 12f have a continuous form surrounding p-type buried region 3b. Grooves 12a and 12f are filled with p-type polycrystalline silicon films 13a and 13f serving as an isolation conductor. p$^+$-type diffusion regions 5a and 5f are formed around grooves 12a and 12f, respectively. Grooves 12a and 12f, p-type polycrystalline silicon films 13a and 13f, p$^+$-type diffusion regions 5a and 5f, and p-type buried regions 3a and 3c provide element isolations 14a and 14b of npn bipolar transistors (not shown). n-type epitaxial layers 4a and 4g form high resistance portions of the collector regions of the npn bipolar transistors (not shown).

p$^+$-type diffusion regions 6a–6c and n$^+$-type diffusion regions 7a–7c are formed in predetermined regions of n-type epitaxial layers 4c–4e. n-type epitaxial layers 4c–4e serve as base regions of the pnp bipolar transistor. n-type epitaxial layers 4c–4e serving as the base region and additional base region are located above p-type buried region 3b serving as the collector region and additional collector region, as can be seen from FIG. 1. p$^+$-type diffusion regions 6a–6c serve as the emitter region of the pnp bipolar transistor. p$^+$-type diffusion regions 6a–6c serving as the emitter region and additional emitter region are located above portions of n-type epitaxial layers 4c–4e serving as the base regions, respectively. n$^+$-type diffusion regions 7a–7c have a function of lowering the leader resistance of the base region of the pnp bipolar transistor.

An oxide film 8 is formed on the top surfaces of n-type epitaxial layers 4a–4g. Oxide film 8 is provided at predetermined regions with contact holes 9a–9j. Contact holes 9a, 9d, 9g and 9j are collector contacts. Contact holes 9b, 9e and 9h are emitter contacts. Contact holes 9c, 9f and 9i are base contacts. Electrodes 10a–10j made of metal such as aluminum have portions located in contact holes 9a–9j, respectively, and extend onto the top surface of oxide film 8. Electrodes 10a, 10d, 10g and 10j are collector leader electrodes. Electrodes 10b, 10e and 10h are emitter leader electrodes. Electrodes 10c, 10f and 10i are base leader electrodes.

In the prior art, collector leader portions 15a–15d are produced by diffusing impurities, of which conductivity type is the p-type, into the n-type epitaxial layers. In the process of diffusing the p-type impurities to a position at a predetermined depth, the p-type impurities also expand in the lateral direction. Therefore, the width of each of collector leader portions 15a–15d can be reduced only to a limited extent in the prior art. Further, collector leader portions 15a–15d must be spaced by a predetermined distance or more from other diffusion regions such as p+-type diffusion regions 6a–6c and n+-type diffusion regions 7a–7c. In the prior art, therefore, an area occupied by the bipolar transistor can be reduced only to a limited extent. According to the invention, however, grooves 12a–12e are formed as collector leader portions 15a–15d, and are filled with p-type polycrystalline silicon films 13b–13e serving as the conductors, whereby the widths of grooves 12a–12e can be sufficiently reduced, and thereby the width of each of collector leader portions 15a–15d can be reliably reduced as compared with the case where collector leader portions 15a–15d are formed by diffusing the impurities. As a result, the area occupied by the vertical bipolar transistor can be reduced. Accordingly, the sizes of the semiconductor device can be easily reduced.

By utilizing grooves 12a and 12f for forming element isolations 14a and 14b, the width of the element isolation can be reduced as compared with the conventional case where the element isolation is formed in the diffusion step. Therefore, the area occupied by element isolations 14a and 14b can be reduced, and therefore the sizes of the semiconductor device can be reduced.

By arranging the plurality of collector leader portions 15a–15d, the plurality of n-type epitaxial layers 4c–4e serving as the base regions and the plurality of p+-type diffusion regions 6a–6c serving as the emitter regions, it is possible to achieve easily the semiconductor device provided with the bipolar transistor having a high current drive capability. In the case where the plurality of collector leader portions 15a–15d are employed, grooves 12b–12e can be utilized, as is done in the invention, whereby the area occupied by the bipolar transistor can be reduced, and at the same time a high current drive capability can be achieved.

Figure 2:
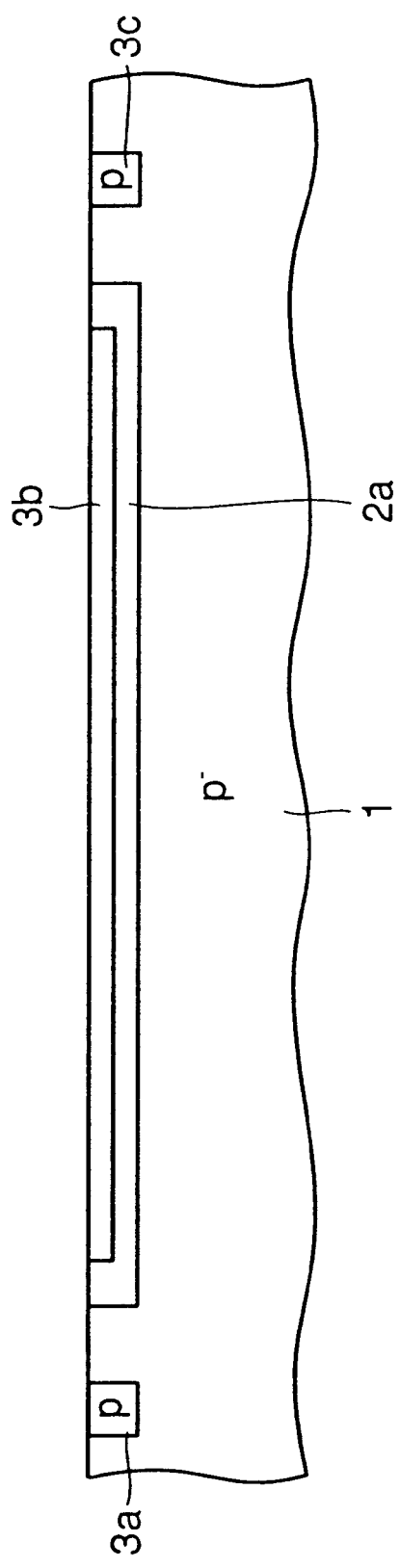
FIGS. 2 and 3 are schematic cross sections showing first and second step of the method of manufacturing the semiconductor device shown in FIG. 1, respectively.
Figure 3:
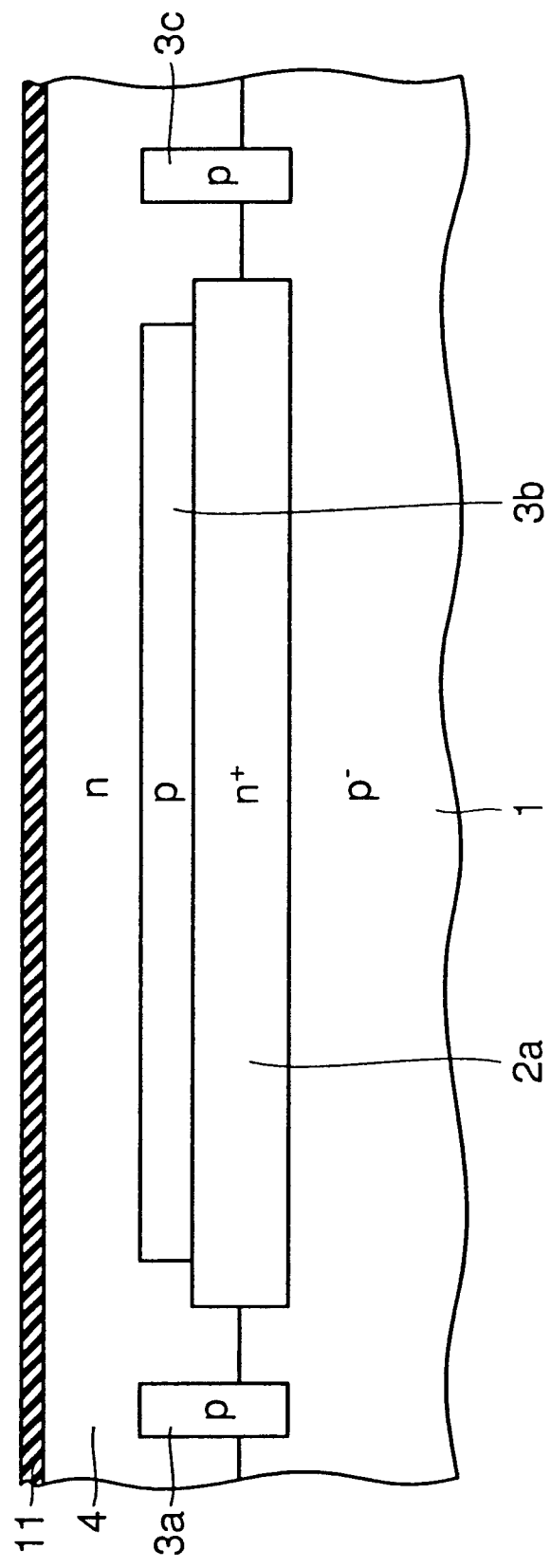
Figure 4:
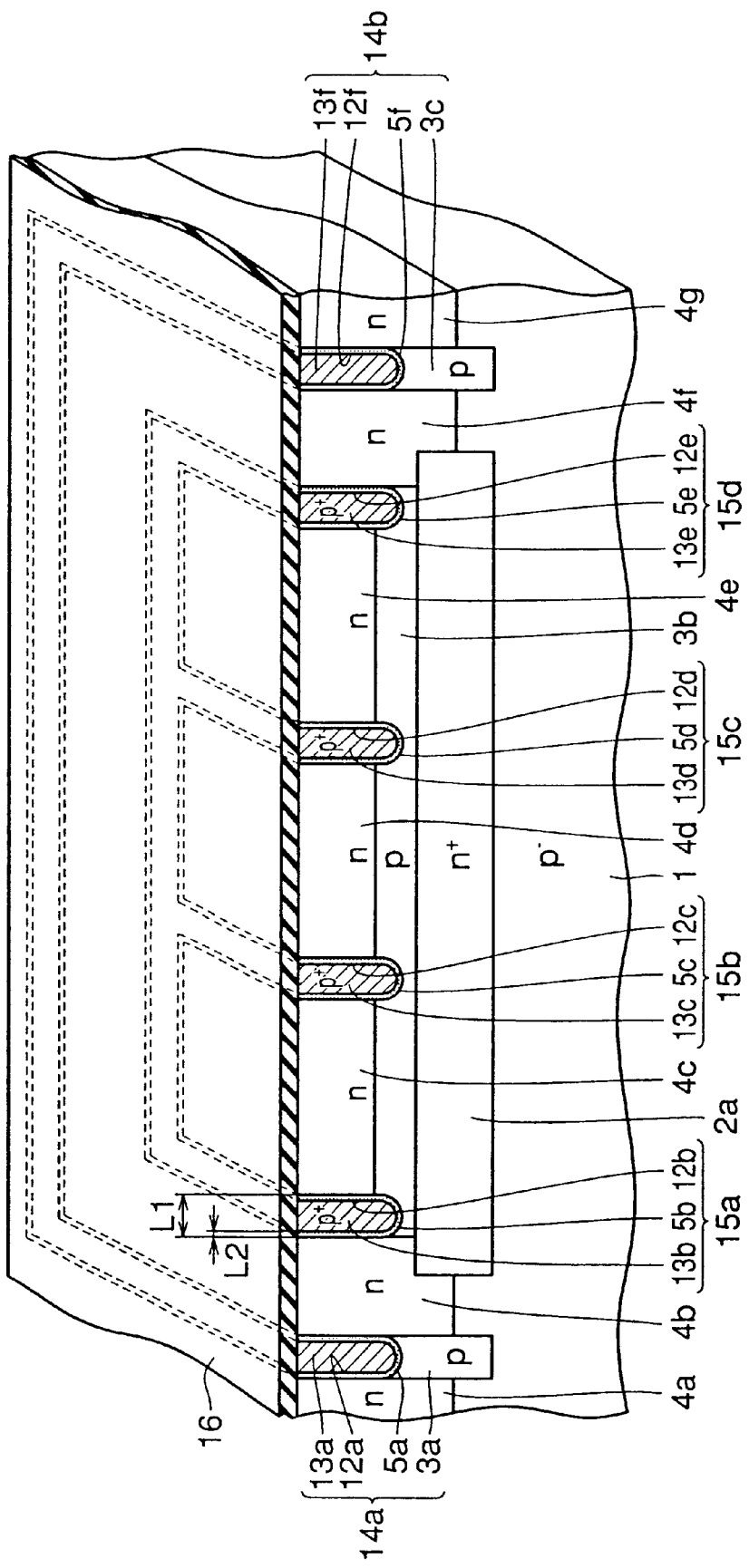
FIG. 4 is a schematic perspective view showing a third step of the method of manufacturing the semiconductor device shown in FIG. 1.

Referring to FIGS. 2–4, a method of manufacturing the semiconductor device shown in FIG. 1 will now be described.

First, n+-type buried region 2a (see FIG. 2) is formed at the main surface of p−-type substrate 1 (see FIG. 2). Then, p-type buried regions 3a–3c (see FIG. 2) are formed at the main surface of p−-type substrate 1. In this manner, the structure shown in FIG. 2 is formed.

Then, the epitaxial growth method is conducted to form n-type epitaxial layer 4 (see FIG. 3) on the main surface of p−-type substrate 1. During execution of this epitaxial growth method, electrically conductive impurities diffuse from n+-type buried region 2a and p-type buried regions 3a–3c into n-type epitaxial layer 4. Then, a thermal oxide film 11 (see FIG. 3) is formed on the top surface of n-type epitaxial layer 4. In this manner, the structure shown in FIG. 3 is obtained.

Then, thermal oxide film 11 is partially removed to form openings (not shown). Etching or the like is effected on n-type epitaxial layer 4 masked with thermal oxide film 11 provided with the openings to form grooves 12a–12f (see FIG. 4). A p-type polycrystalline silicon film (not shown) is deposited, e.g., by the CVD method on the inner sides of grooves 12a–12f and the top surface of thermal oxide film 11. Etching is effected to remove the p-type polycrystalline silicon film located on the top surface of thermal oxide film 11. In this manner, p-type polycrystalline silicon films 13a–13f covering the inner sides of grooves 12a–12f are obtained. By the step of depositing these p-type polycrystalline silicon films as well as a subsequent thermal processing, p+-type diffusion regions 5a–5f (see FIG. 1) are formed around grooves 12a–12f, respectively. The lateral expansion of each of p+-type diffusion regions 5a–5f is smaller than that in the prior art. Junction between p-type polycrystalline silicon films 13a–13f and n-type epitaxial layer 4c an hardly achieve good leak characteristics. By the junction of p+-type diffusion regions 5a–5f with n-type epitaxial layer 4, good leak characteristics can be ensured. p-type buried regions 3a and 3c as well as grooves 12a–12f divide n-type epitaxial layer 4 into n-type epitaxial layers 4a–4g (see FIG. 4). Thereafter, thermal oxide film 11 is once removed. Then, another oxide film 16 (see FIG. 4) is formed on the top surfaces of n-type epitaxial layers 4a–4g by the thermal oxidation method. Thereby, the structure shown in FIG. 4 is obtained.

Thereafter, a resist film (not shown) is formed on oxide film 16. Using this resist film as a mask, boron ions are implanted into the predetermined regions, and thereafter thermal processing is performed. In this manner, p+-type diffusion regions 6a–6c (see FIG. 1) are formed. Thereafter, the resist film is removed. Oxide film 16 is partially removed from the regions at which n+-type diffusion regions 7a–7c (see FIG. 1) are to be formed. Thereby, openings (not shown) are formed. Through these openings, n-type impurities are diffused into predetermined regions in n-type epitaxial layers 4c–4e so that n+-type diffusion regions 7a–7c are formed. Thermal processing is performed for activating n+-type diffusion regions 7a–7c. At the same time, thermal oxidation is performed so that the thermal oxide films are formed at.the top surfaces of n-type epitaxial layers 4c–4e located at the bottoms of the foregoing openings. In this manner, the top surfaces of n-type epitaxial layers 4a–4g are covered with the oxide film (not shown) again.

Then, an oxide film doped with phosphorus is formed as a protective film on the oxide film, e.g., by the CVD method. As a result, the oxide film doped with phosphorus and the foregoing oxide film form oxide film 8 (see FIG. 1).

Thereafter, contact holes 9a–9j are formed in predetermined regions of oxide film 8 as shown in FIG. 1. Electrodes 10a–10j are formed on contact holes 9a–9j, respectively. In this manner, the structure shown in FIG. 1 can be obtained.

(Second Embodiment)

Figure 5:
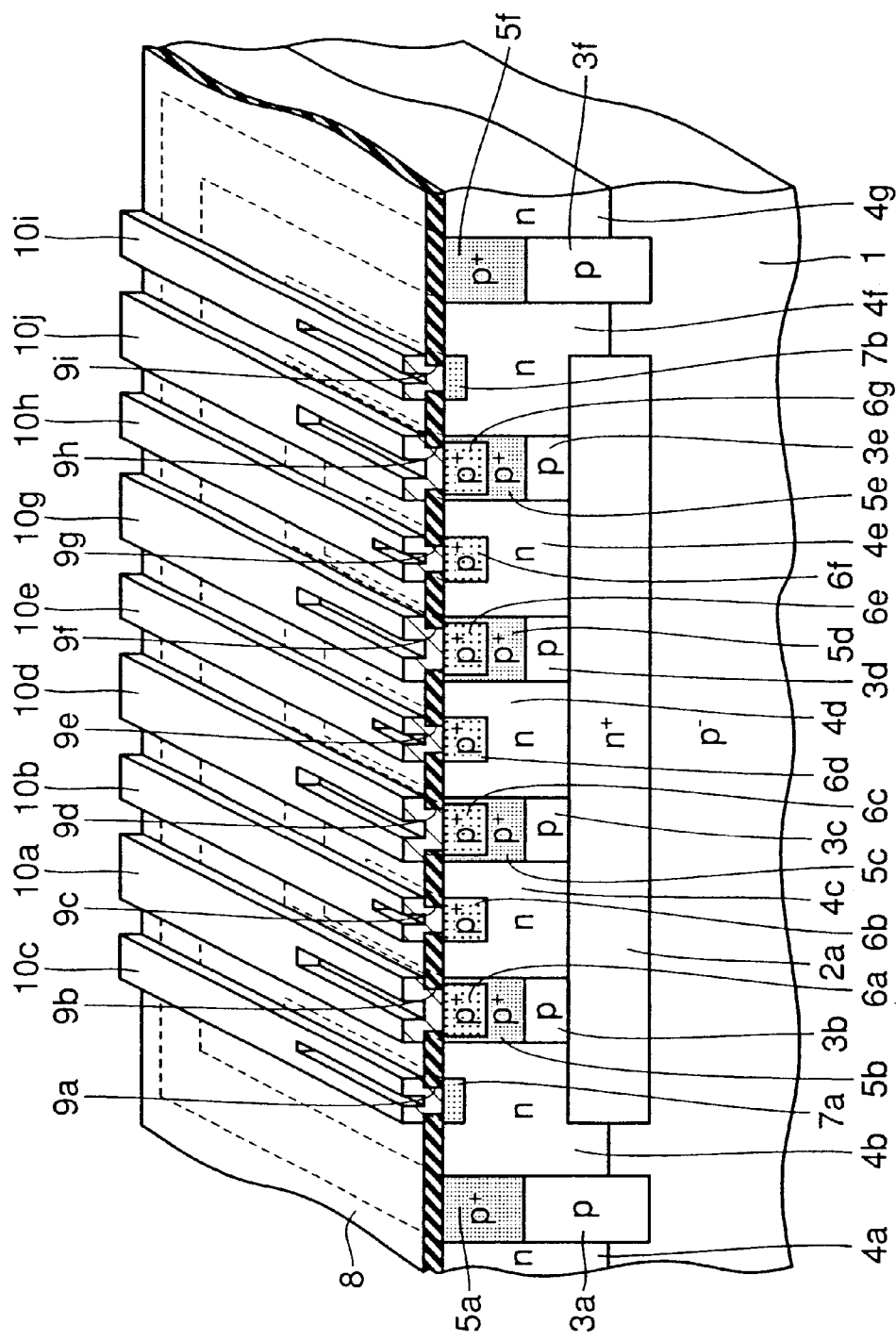
FIG. 5 is a schematic perspective view showing a semiconductor device of a second embodiment of the invention.

A semiconductor device shown in FIG. 5 includes a lateral pnp bipolar transistor, which is prepared by changing a conventional vertical bipolar transistor into a lateral bipolar transistor having a high current drive performance, and configuring it to occupy a reduced area. The lateral pnp bipolar transistor has a structure of which current drive capability corresponds to three transistors. Referring to FIG. 5, the semiconductor device of the second embodiment of the invention will now be described.

Referring to FIG. 5, the semiconductor device includes p−-type substrate 1 serving as the substrate, on which n-type epitaxial layers 4a–4g serving as the first conductivity type region are formed. n+-type buried region 2a and p-type buried regions 3a and 3f surrounding n+-type buried region 2a are formed in the boundary region between p−-type substrate 1 and n-type epitaxial layers 4a–4g. n+-type buried region 2a electrically isolates the pnp bipolar transistor from p−-type substrate 1. p-type buried regions 3b–3e are formed on n+-type buried region 2a. p+-type diffusion regions 5b–5e are formed on p-type buried regions 3b–3e, respectively. p-type buried regions 3b–3e serving as the collector buried layers and p+-type diffusion regions 5b–5e serving as the impurity diffusion regions serve as the collector regions of the pnp bipolar transistor.

p-type buried regions 3b–3e and p+-type diffusion regions 5b–5e, which serve as the collector regions and additional collector regions, as well as n$^+$-type buried region 2a surround n-type epitaxial layers 4c–4e. Thus, p-type buried regions 3b–3e and p$^+$-type diffusion regions 5b–5e are connected and disposed in the form surrounding n-type epitaxial layers 4c–4e. n-type epitaxial layers 4b and 4f serving as the element isolating region of the pnp bipolar transistor surround p-type buried regions 3b–3e and p$^+$-type diffusion regions 5b–5e.

p$^+$-type diffusion regions 5a and 5f are formed in the regions located above p-type buried regions 3a and 3f, respectively, and surround the vertical pnp bipolar transistor including p-type buried region 3b. p$^+$-type diffusion regions 5a and 5f as well as p-type buried regions 3a and 3f form the element isolation of the npn bipolar transistor (not shown). n-type epitaxial layers 4a and 4g form high resistance portions of the collector regions of npn bipolar transistors other than the above.

p$^+$-type diffusion regions 6a–6g are formed in the predetermined regions of n-type epitaxial layers 4c–4e and p$^+$-type diffusion regions 5b–5e. n$^+$-type diffusion regions 7a and 7b are formed in the predetermined regions of n-type epitaxial layers 4b and 4f. n-type epitaxial layers 4c–4e serve as the base regions of the pnp bipolar transistor. n-type epitaxial layers 4c–4e serving as the base region and additional base region are disposed closely around p-type buried regions 3b–3e and p$^+$-type diffusion regions 5b–5e serving as the collector region and additional collector region, as can be seen from FIG. 5. n-type epitaxial layers 4c–4e are electrically connected to n-type epitaxial layers 4b and 4f via n$^+$-type buried region 2a.

As already described, p$^+$-type diffusion regions 6a, 6c, 6e and 6g are formed in p$^+$-type diffusion regions 5b–5e, respectively. p$^+$-type diffusion regions 6a, 6c, 6e and 6g have a function of lowering the leader resistance of the collector. p$^+$-type diffusion regions 6b, 6d and 6f serve as the emitter regions of the pnp bipolar transistor. p$^+$-type diffusion regions 6b, 6d and 6f serving as the emitter region and additional emitter region are formed in the regions, which are opposed to p-type buried regions 3b–3e and p$^+$-type diffusion regions 5b–5e through the portions of n-type epitaxial layers 4c–4e serving as the base regions. n$^+$-type diffusion regions 7a and 7b have a function of lowering the leader resistance of the base region of the pnp bipolar transistor.

Oxide film 8 is formed on the top surfaces of n-type epitaxial layers 4a–4g. Oxide film 8 is provided at predetermined regions with contact holes 9a–9i. Contact holes 9b, 9d, 9f and 9h are collector contacts. Contact holes 9c, 9e and 9g are emitter contacts. Contact holes 9a and 9i are base contacts. Electrodes 10a–10e and 10g–10j made of metal such as aluminum have portions located in contact holes 9a–9i, and extend onto the top surface of oxide film 8. Electrodes 10a, 10d, 10g and 10j are collector leader electrodes, and electrodes 10b, 10e and 10h are emitter leader electrodes. Electrodes 10c and 10i are base leader electrodes.

p-type buried regions 3b–3e serving as the collector buried layers can be formed in a region, which is deep from the main surface of the n-type epitaxial layer, and therefore cannot be reached in an usual diffusion step. By utilizing p-type buried regions 3b–3e as the collector regions, the surface area of the collector regions can be increased so that the collector resistance can be lower than that in the prior art. Accordingly, the current drive capability can be increased as compared with the conventional lateral bipolar transistor. Thereby, it is possible to increase the current drive capability in one bipolar transistor structure (e.g., the bipolar transistor structure formed of p-type buried region 3b and p$^+$-type diffusion regions 5b and 6a serving as the collector regions, n-type epitaxial layer 4c serving as the base region, and p$^+$-type diffusion region 6b serving as the emitter region), and thereby the number of the bipolar transistor structures which are required for obtaining the intended current drive capability can be reduced. Consequently, an area occupied by the bipolar transistors in the semiconductor device can be reduced.

Electrode 10c serving as the base leader electrode is formed in the region opposed to p$^+$-type diffusion region 6b serving as the emitter region with p-type buried region 3b and p$^+$-type diffusion region 5b serving as the collector regions therebetween. Electrode 10i serving as the base leader electrode is formed in the region opposed to p$^+$-type diffusion region 6f serving as the emitter regions with p-type buried region 3e and p$^+$-type diffusion region 5e serving as the collector regions therebetween. Thus, the base leader electrode is formed in a portion other than the portion between the collector regions and the emitter regions in the lateral bipolar transistor. As a result, in the structure where the plurality of collector regions, the plurality of base regions and the plurality of emitter regions are formed for obtaining a further increased current drive capability as shown in FIG. 5, base leader electrodes 10c and 10i which can be utilized commonly to the plurality of base regions can be formed in the region other than the region between the collector and the emitter regions. Therefore, base leader electrodes 10c and 10i can be smaller in number than the plurality of n-type epitaxial layers 4c–4e serving as the base regions. Consequently, the area occupied by the bipolar transistor can be reduced as compared with the conventional case where the plurality of base leader electrodes are formed corresponding to the respective n-type epitaxial layers 4c–4e serving as the base regions.

However, the base leader resistance may rise. Therefore, the number and arrangement of the base leader electrodes must be determined in view of the electric characteristics of the bipolar transistor. In the semiconductor device shown in FIG. 5, base leader electrodes 10c and 10i are arranged on the opposite ends of the bipolar transistor for preventing deviation or shifting of the flow paths of the base current. The base leader electrodes 10c and 10i may be arranged symmetrical with respect to a central point of the region occupied by the bipolar transistor.

The semiconductor device shown in FIG. 5 can be manufactured through the steps which are basically similar to those for manufacturing the semiconductor device shown in FIGS. 2 to 4.

First, the n$^+$-type buried region is formed at the main surface of p$^-$-type substrate 1 (see FIG. 5). Then, the p-type buried region is formed at the main surface of p$^-$-type substrate 1. Then, the n-type epitaxial layer is formed on the main surface of p$^-$-type substrate 1 by the epitaxial growth method. When this epitaxial growth method is executed, conductive impurities diffuse from the n$^+$-type buried region and the p-type buried region into the n-type epitaxial layer so that n$^+$-type buried region 2a (see FIG. 5) and p-type buried regions 3a–3f (see FIG. 5) are formed. By a step similar to the step shown in FIG. 3, thermal oxide film 11 (see FIG. 3) is formed on the top surface of the n-type epitaxial layer.

Then, thermal oxide film 11 is partially removed to form openings (not shown). Through these openings, p-type impurities are diffused into the predetermined region of the n-type epitaxial layer so that p$^+$-type diffusion regions 5a–5f (see FIG. 5) reaching p-type buried regions 3a–3f are formed, respectively. p-type buried regions 3a–3f and p+-type diffusion regions 5a–5f divide the n-type epitaxial layer into n-type epitaxial layers 4a–4g (see FIG. 5). After forming p+-type diffusion regions 5a–5f, the thermal oxide film is once removed. Then, the thermal oxidation method is executed to form an oxide film on the top surfaces of n-type epitaxial layers 4a–4g again.

Thereafter, a resist film is formed on the oxide film. Using this resist film as a mask, boron ions are implanted into predetermined regions, and then thermal processing is performed. In this manner, p+-type diffusion regions 6a–6g (see FIG. 5) are formed. Thereafter, the resist film is removed. Openings are formed by partially removing the oxide film from portions above the regions in which n+-type diffusion regions 7a and 7b (see FIG. 5) are to be formed. Through these openings, n-type impurities are diffused into the predetermined regions in n-type epitaxial layers 4b and 4i so that n+-type diffusion regions 7a and 7b are formed. The thermal oxidation is performed simultaneously with the thermal processing which is performed for activating n+-type diffusion regions 7a and 7b. Thereby, the thermal oxide films are formed in the foregoing openings, respectively. As a result, the top surfaces of n-type epitaxial layers 4a–4g are covered with the oxide film again.

Then, an oxide film doped with phosphorus is formed as a protective film on the above oxide film by the CVD method or the like. This oxide film doped with phosphorus and the previously formed oxide film form oxide film 8 (see FIG. 5).

Through steps similar to those shown in FIGS. 29 to 32, contact holes 9a–9i are formed in predetermined regions of oxide film 8. Electrodes 10a 20e and 10g–10i are formed on contact holes 9a–9i. In this manner, the structure shown in FIG. 5 is obtained.

Figure 6:
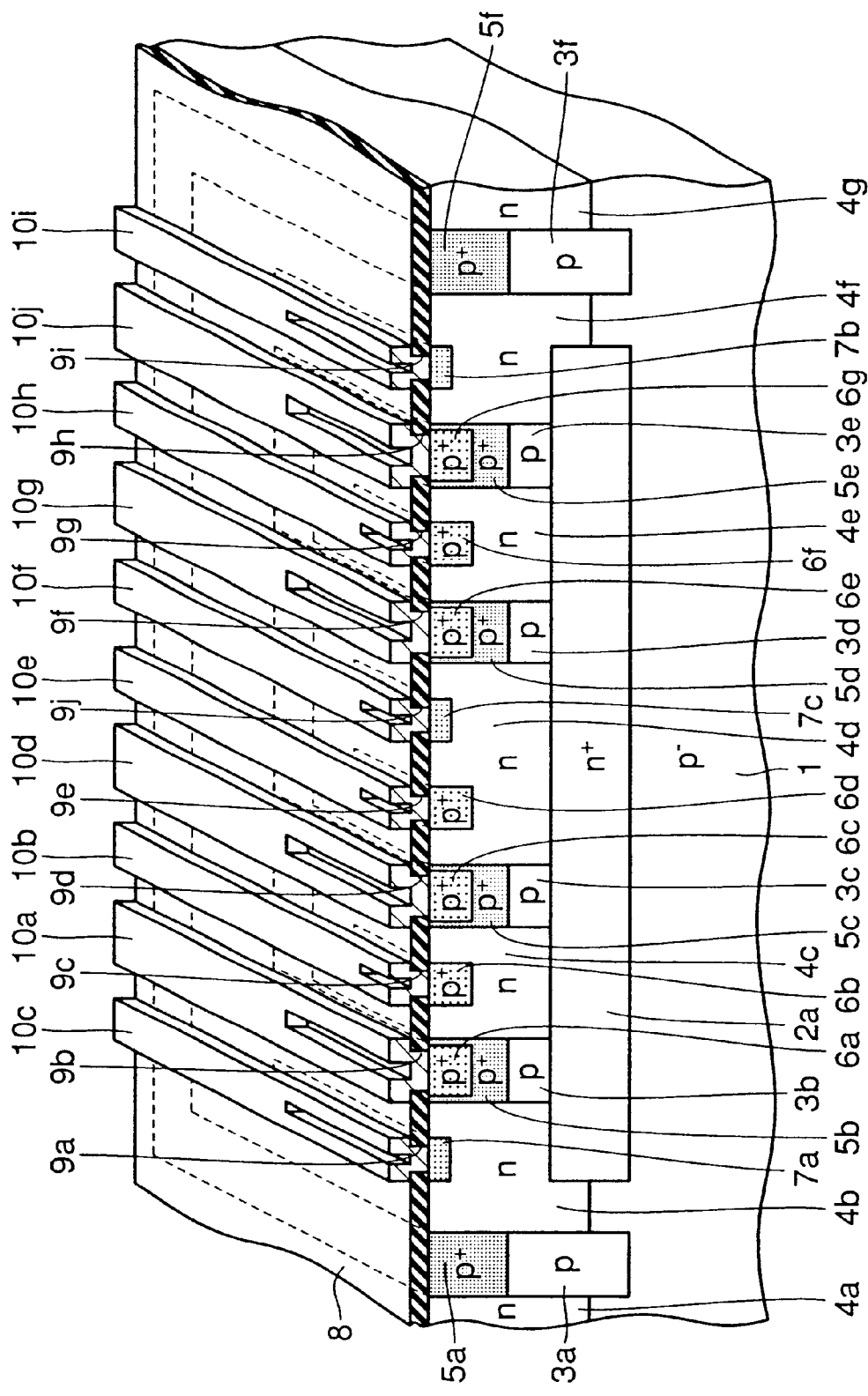
FIG. 6 is a schematic perspective view showing a modification of the semiconductor device of the second embodiment according to the invention shown in FIG. 5.

Referring to FIG. 6, a modification of the semiconductor device of the second embodiment of the invention will now be described.

Referring to FIG. 6, a semiconductor device has a structure which is basically similar to that of the semiconductor device shown in FIG. 5, but differs therefrom in that n+-type diffusion region 7c is formed in the substantially central portion (i.e., region between p+-type diffusion regions 6d and 5d) of the bipolar transistor. Oxide film 8 is provided with a contact hole 9j located above n+-type diffusion region 7c. Electrode 10f, which serves as the base leader electrode, and is in contact with n+-type diffusion region 7c, is formed above contact hole 9j.

Even if the bipolar transistor structures (p+-type diffusion regions 6b, 6d and 6f forming the emitter regions) arranged in parallel increase in number, the base current can be sufficiently flowed without deviation because the base leader electrode is formed substantially in the central portion of the bipolar transistor. If the number of p+-type diffusion regions 6b, 6d and 6f forming the emitter regions exceeds three (i.e., if the number of the bipolar transistor structures exceeds three), the base leader electrodes can be smaller in number than the emitter regions. Therefore, the area occupied by the bipolar transistor can be reduced.

The semiconductor device shown in FIG. 6 can be manufactured in the method basically similar to that of manufacturing the semiconductor device shown in FIG. 5.
(Third Embodiment)

Figure 7:
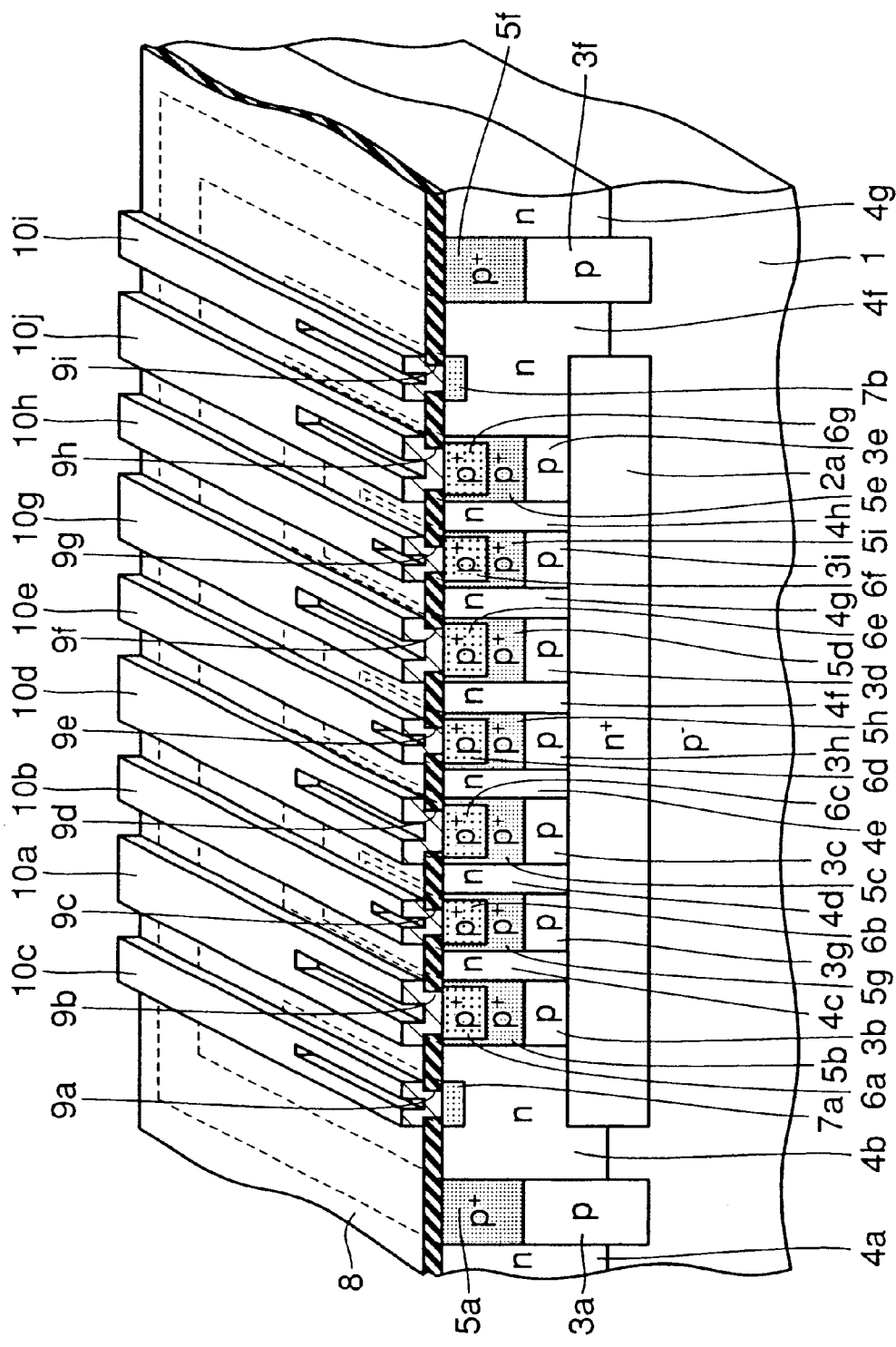
FIG. 7 is a schematic perspective view showing a semiconductor device of a third embodiment of the invention.

Referring to FIG. 7, a semiconductor device of a third embodiment of the invention will now be described.

Referring to FIG. 7, the semiconductor device has a structure basically similar to the structure of the semiconductor device shown in FIG. 5, but differs from the semiconductor device shown in FIG. 5 in the structure of the emitter region. In the semiconductor device shown in FIG. 7, the emitter regions is formed of p-type buried regions 3g–3i serving as the emitter buried layers, p+-type diffusion regions 5g–5i serving as other impurity diffusion regions, and p+-type diffusion regions 6b, 6d and 6f. p+-type diffusion regions 5g–5i have portions extended to the main surface (top surface) of the n-type epitaxial layer.

The above structure can achieve the effects similar to those obtained by the semiconductor device shown in FIG. 5. p-type buried regions 3g–3i serving as the emitter buried layers can be formed at a large depth, which cannot be achieved in an usual diffusion step. Since p-type buried regions 3g–3i are utilized as the emitter regions, an area of contact between the emitter regions and n-type epitaxial layers 4c–4h serving as the base regions can be increased. Consequently, the current drive capability of the bipolar transistor can be further increased.

Even by the structure which utilizes only p+-type diffusion regions 5g–5i and p+-type diffusion regions 6b, 6d and 6f as the emitter regions, the contact area between the emitter regions and the base regions can be larger than that in the semiconductor device shown in FIG. 5. Therefore, the current drive capability of the bipolar transistor can be improved as compared with the semiconductor device shown in FIG. 5. The semiconductor device shown in FIG. 7 can be manufactured in a method which is similar to the method of manufacturing the semiconductor device shown in FIG. 5.

A modification of the semiconductor device of the third embodiment of the invention will now be described with reference to FIG. 8.

Figure 8:
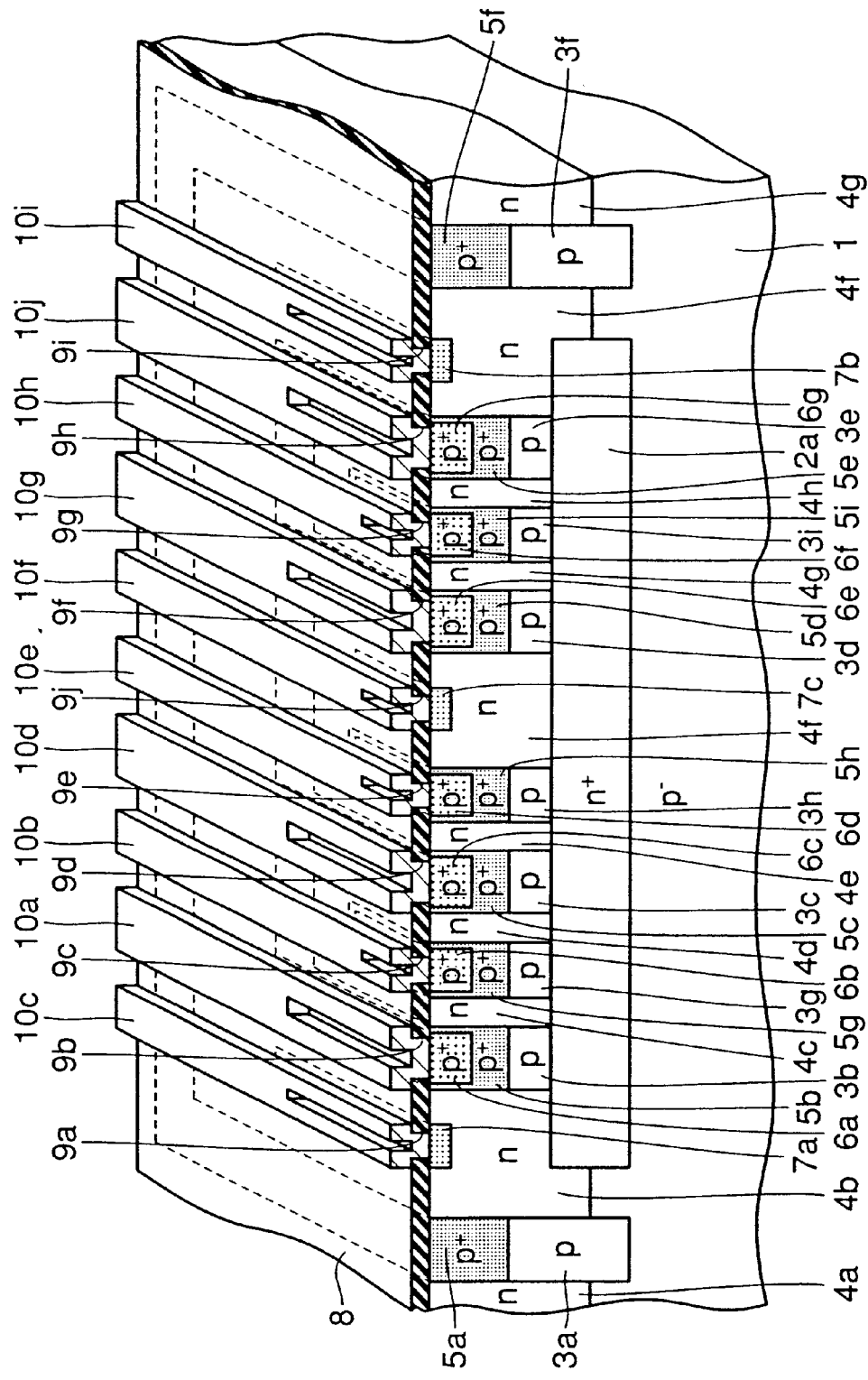
FIG. 8 is a schematic perspective view showing a modification of the semiconductor device of the third embodiment according to the invention shown in FIG. 7.

Referring to FIG. 8, the semiconductor device has a structure basically similar to that of the semiconductor device shown in FIG. 7, but differs therefrom in that n+-type diffusion region 7c is formed in the substantially central portion (i.e., region located between p+-type diffusion regions 6d and 5d) of the bipolar transistor similarly to the semiconductor device shown in FIG. 6. Oxide film 8 is provided with contact hole 9j located above n+-type diffusion region 7c. Electrode 10f, which serves as the base leader electrode, and is in contact with n+-type diffusion region 7c, is formed above contact hole 9j. The structure described above can achieve the effects similar to those obtained by the semiconductor device shown in FIG. 6 in addition to those obtained by the semiconductor device shown in FIG. 7. The semiconductor device shown in FIG. 8 can be manufactured in a method which is basically similar to the method of manufacturing the semiconductor device shown in FIG. 7.
(Fourth Embodiment)

A semiconductor device of a fourth embodiment of the invention will now be described with reference to FIG. 9.

Figure 9:
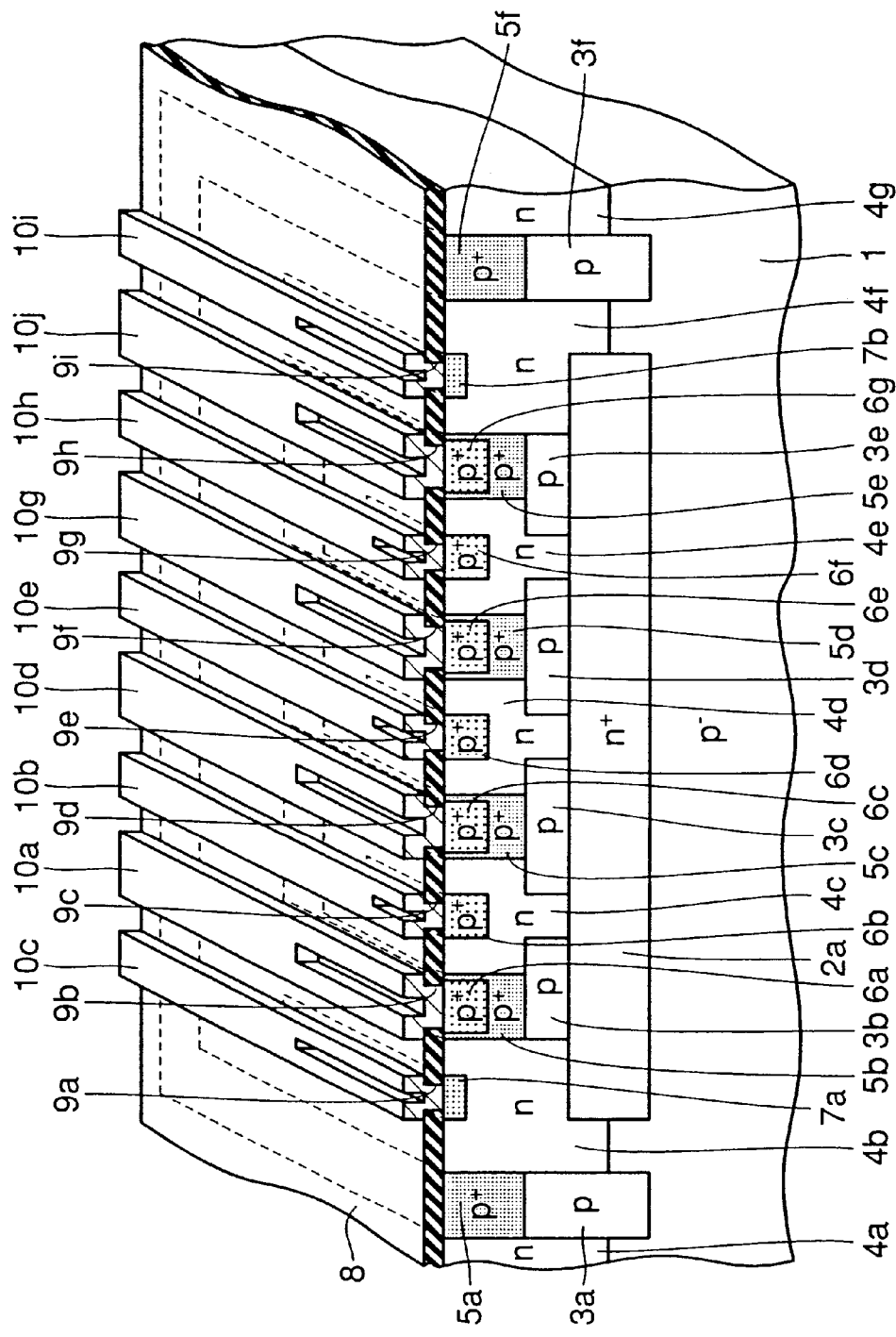
FIG. 9 is a schematic perspective view showing a semiconductor device of a fourth embodiment of the invention.

Referring to FIG. 9, the semiconductor device has a structure basically similar to that of the semiconductor device shown in FIG. 5, but differs therefrom in the forms or configurations of p-type buried regions 3b–3e serving as the collector buried layers forming the collector regions. p-type buried regions 3b–3e serving as the collector buried layers are located at deeper positions than p+-type diffusion regions 6b, 6d and 6f serving as the emitter regions viewed from the main surfaces (top surfaces) of n-type epitaxial layers 4a–4g, and extend in the regions other than the regions located immediately under p+-type diffusion regions 6b, 6d and 6f. Thus, p-type buried regions 3b–3e are not present in the regions located under p+-type diffusion regions 6b, 6d and 6f.

In the above structure, the p-type buried regions 3b–3e serving as the collector buried layers can have larger surface areas than those of the semiconductor device of the second embodiment of the invention. Therefore, the area of contact between the collector and base regions can be increased so that the collector resistance can be reduced. As a result, the current drive capability can be further increased.

Figure 33:
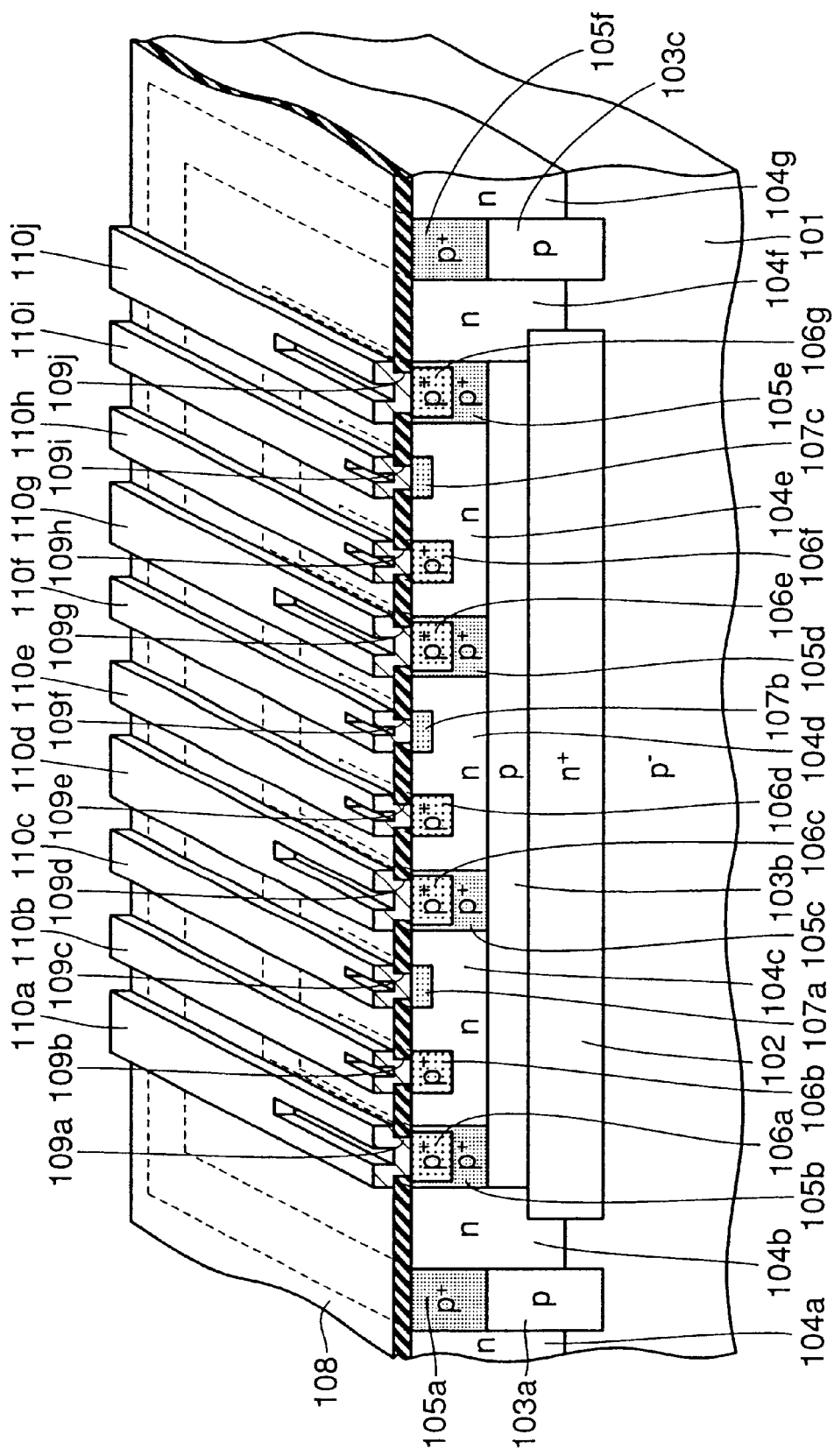
FIG. 33 is a schematic perspective view showing another example of the conventional semiconductor device.
Figure 34:
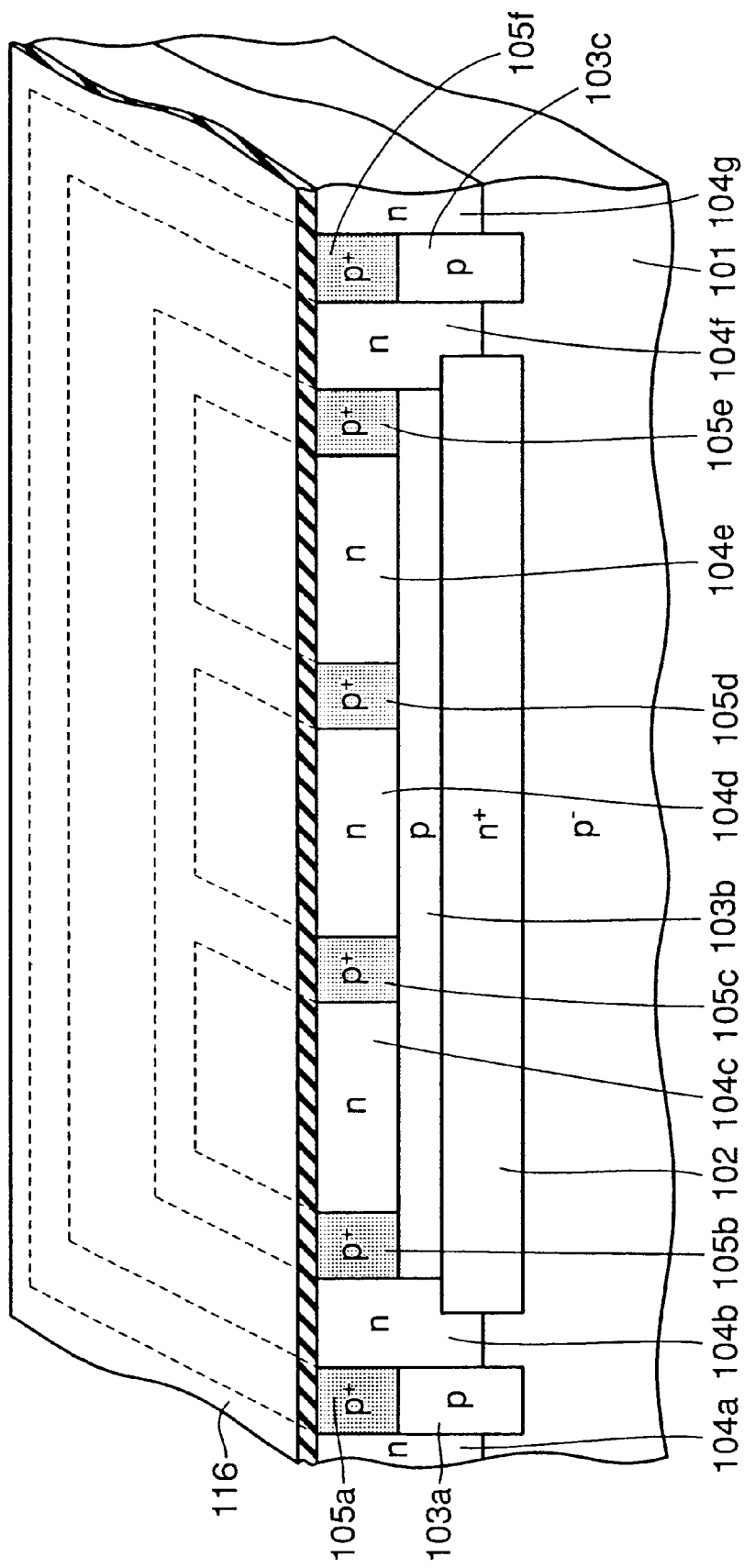
FIGS. 34 and 35 are schematic perspective views showing first and second steps in another example of the method of manufacturing the conventional semiconductor device shown in FIG. 33, respectively.
Figure 35:
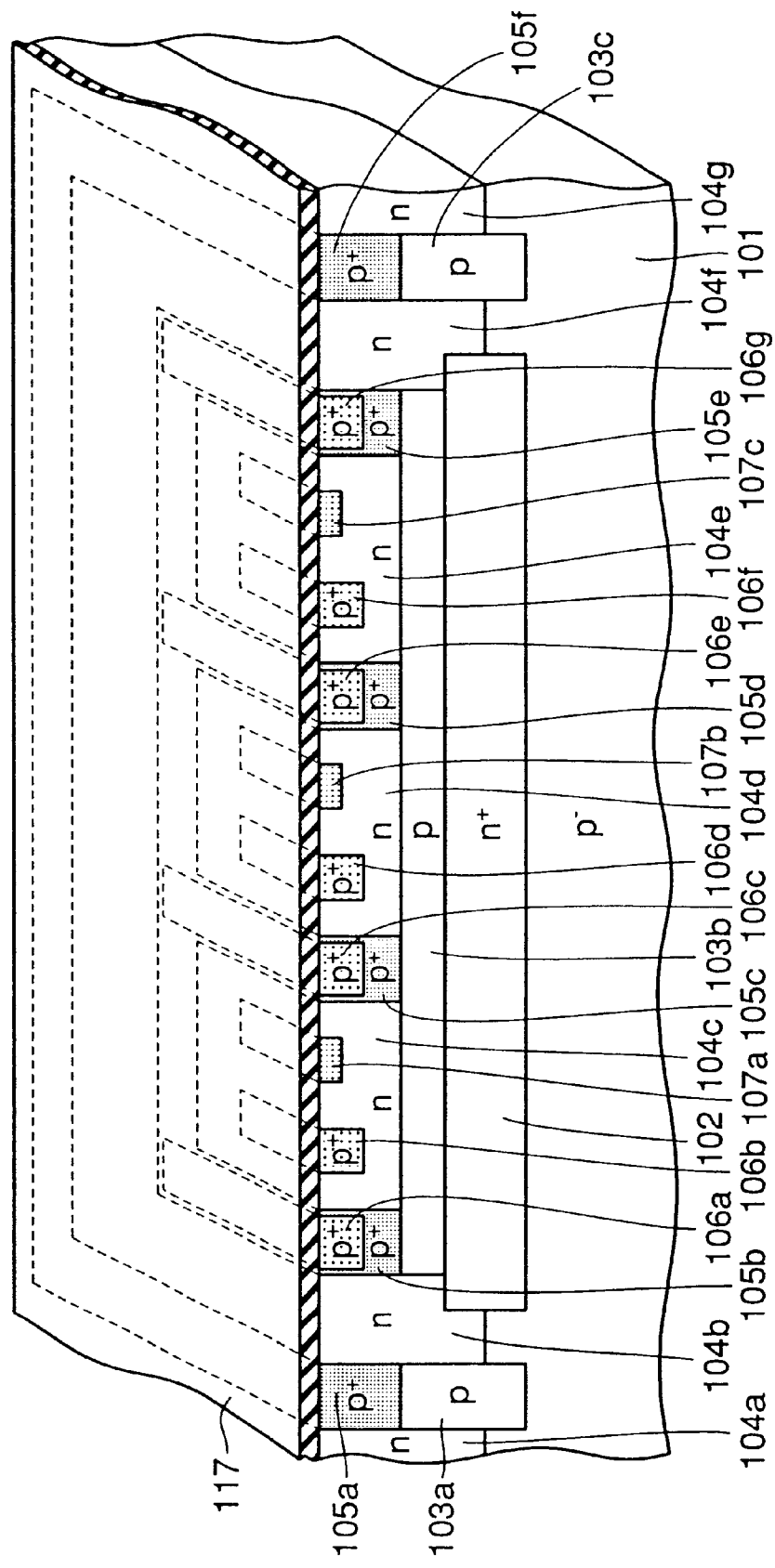

Since p-type buried regions $3b$–$3e$ are not present immediately under p$^+$-type diffusion regions $6b$, $6d$ and $6f$, the breakdown voltage between the collector and the emitter can be increased as compared with the conventional semiconductor device having p-type buried region $103b$ (see FIG. 33) extended to the position immediately under the emitter regions as shown in FIG. 33. The semiconductor device shown in FIG. 9 can be manufactured in a method basically similar to that of manufacturing the semiconductor device shown in FIG. 5.

A modification of the semiconductor device of the fourth embodiment of the invention will now be described below with reference to FIG. 10.

Figure 10:
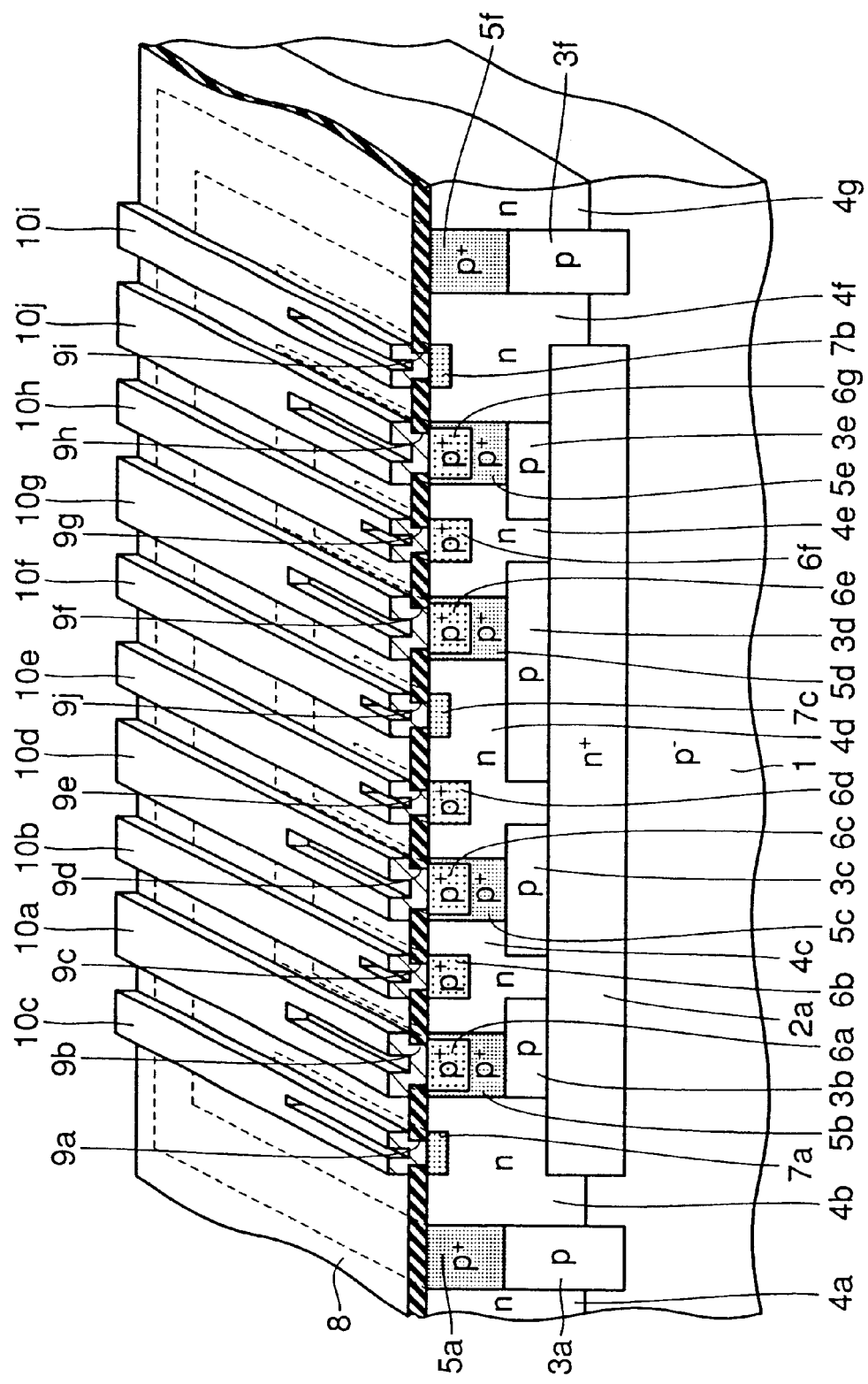
FIG. 10 is a schematic perspective view showing a modification of the semiconductor device of the fourth embodiment according to the invention shown in FIG. 9.

Referring to FIG. 10, the semiconductor device has a structure basically similar to that of the semiconductor device shown in FIG. 9, but differs therefrom in that n$^+$-type diffusion region $7c$ is formed in a substantially central portion (i.e., a region located between p$^+$-type diffusion regions $6d$ and $5d$) of the bipolar transistor similarly to the semiconductor device shown in FIG. 6. Oxide film 8 is provided with contact hole $9j$ located above n$^+$-type diffusion region $7c$. Electrode $10f$, which serves as the base leader electrode, and is in contact with n$^+$-type diffusion region $7c$, is formed above contact hole $9j$. The structure described above can achieve the effects similar to those obtained by the semiconductor device shown in FIG. 6 in addition to those obtained by the semiconductor device shown in FIG. 9. The semiconductor device shown in FIG. 10 can be manufactured in a method which is basically similar to the method of manufacturing the semiconductor device shown in FIG. 9.

(Fifth Embodiment)

A semiconductor device of a fifth embodiment of the invention will now be described with reference to FIG. 11.

Figure 11:
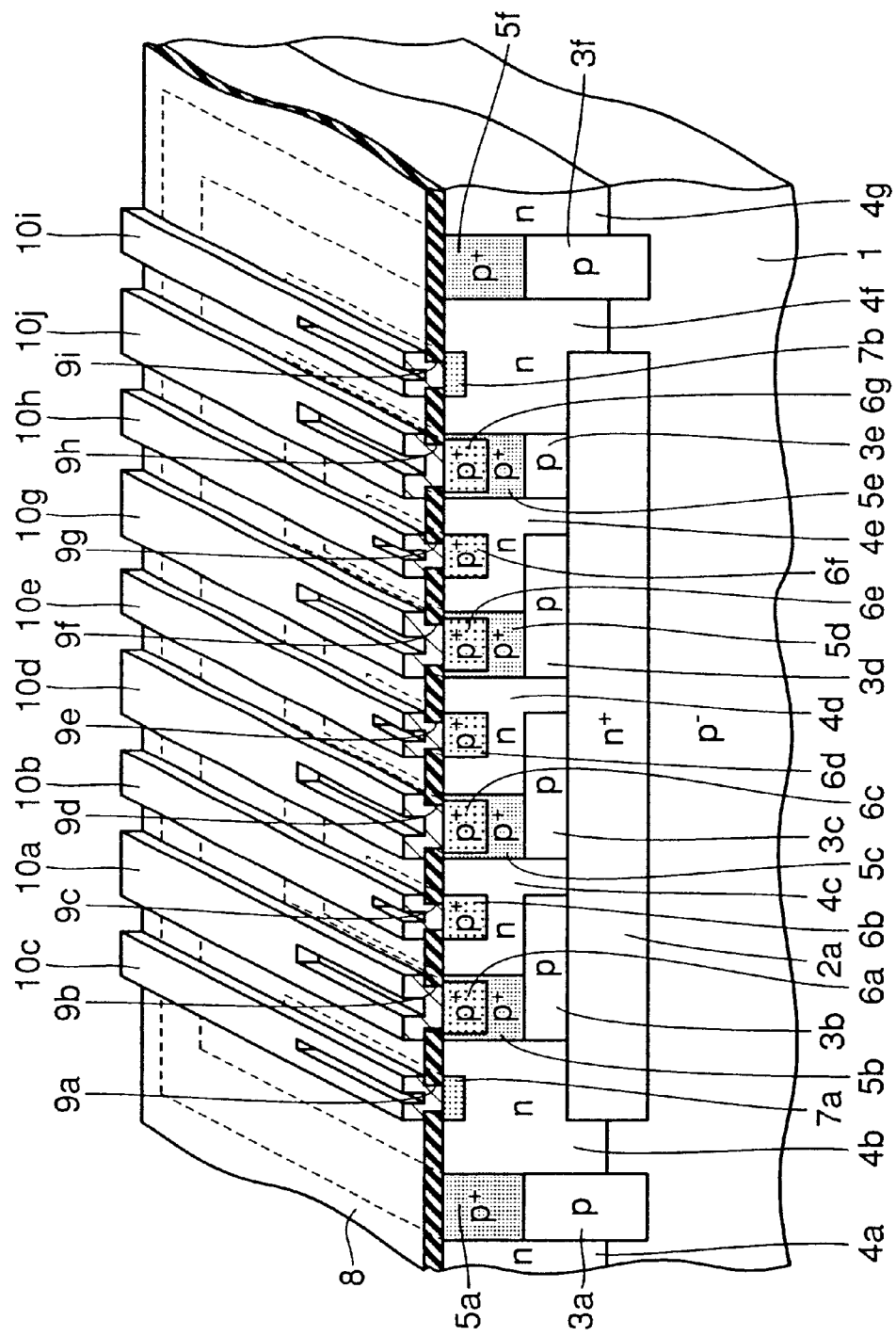
FIG. 11 is a schematic perspective view showing a semiconductor device of a fifth embodiment of the invention.

Referring to FIG. 11, the semiconductor device has a structure basically similar to that of the semiconductor device shown in FIG. 5, but differs therefrom in the forms or configurations of p-type buried regions $3b$–$3e$ serving as the collector buried layers forming the collector regions. p-type buried regions $3b$–$3d$ serving as the collector buried layers are located at deeper positions than p$^+$-type diffusion regions $6b$, $6d$ and $6f$ serving as the emitter regions viewed from the main surfaces (top surfaces) of n-type epitaxial layers $4a$–$4g$, and have portions extended to the regions located immediately under p$^+$-type diffusion regions $6b$, $6d$ and $6f$.

In this case, the bipolar transistor shown in FIG. 11 can operate similarly to the vertical bipolar transistor. Consequently, it can achieve the current drive capability substantially equal to that of the conventional vertical bipolar transistor. However, the breakdown voltage between the collector and the emitter is lower than that in the semiconductor device of the fourth embodiment of the invention.

A modification of the semiconductor device of the fifth embodiment of the invention will now be described below with reference to FIG. 12.

Figure 12:
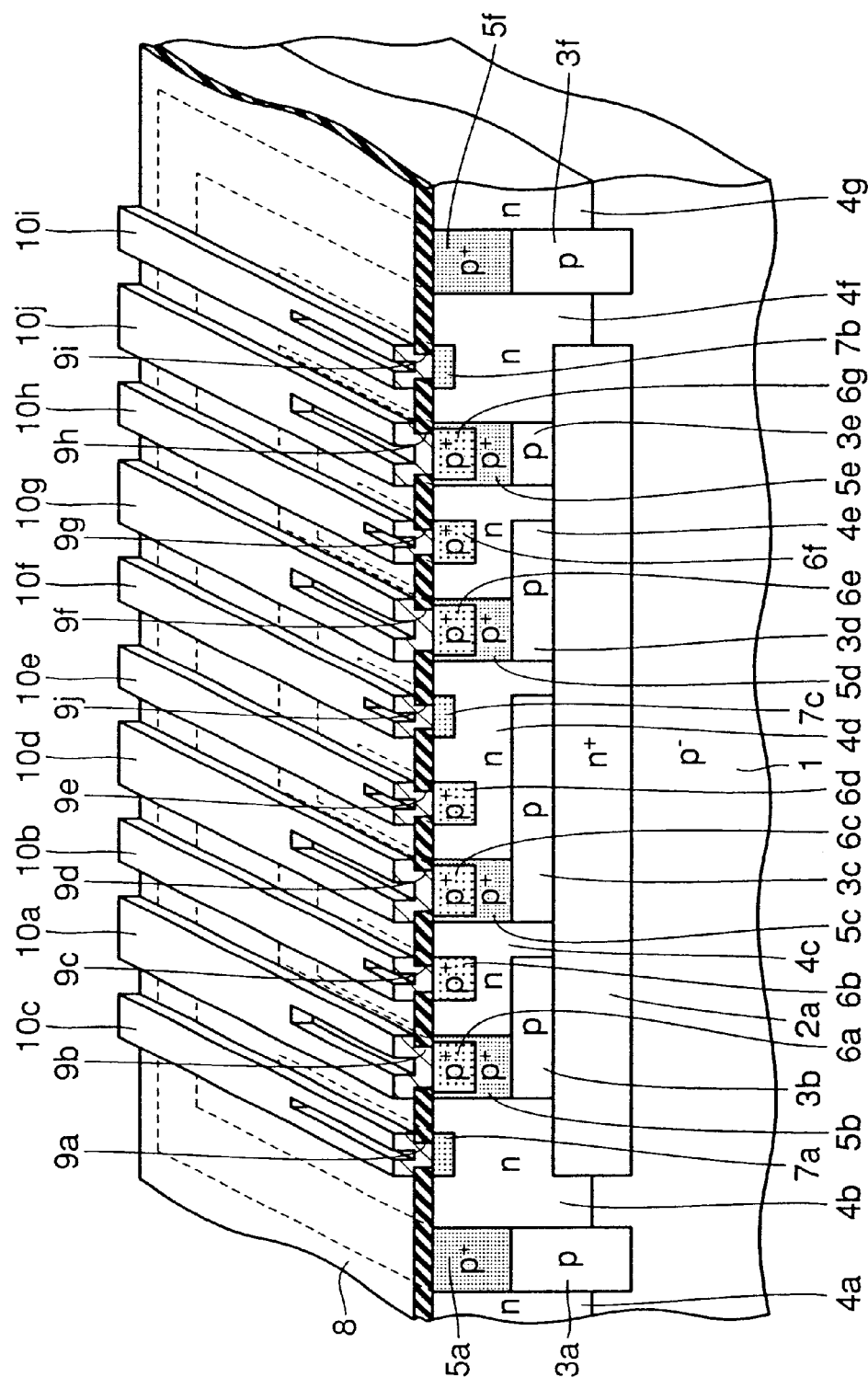
FIG. 12 is a schematic perspective view showing a modification of the semiconductor device of the fifth embodiment according to the invention shown in FIG. 11.

Referring to FIG. 12, the semiconductor device has a structure basically similar to that of the semiconductor device shown in FIG. 11, but differs therefrom in that n$^+$-type diffusion region $7c$ is formed in a substantially central portion (i.e., a region located between p$^+$-type diffusion regions $6d$ and $5d$) of the bipolar transistor similarly to the semiconductor device shown in FIG. 6. Oxide film 8 is provided with contact hole $9j$ similarly to the semiconductor device shown in FIG. 6. Electrode $10f$, which serves as the base leader electrode, is formed above contact hole $9j$. The structure described above can achieve the effects similar to those obtained by the semiconductor device shown in FIG. 6 in addition to those obtained by the semiconductor device shown in FIG. 11.

The semiconductor devices shown in FIGS. 11 and 12 can be manufactured in a method which is basically similar to the method of manufacturing the semiconductor device shown in FIG. 5.

p-type buried regions $3b$–$3e$ may have various configurations other than those of p-type buried regions $3b$–$3e$ of the fourth and fifth embodiments of the invention described above. For example, p-type buried regions $3b$–$3e$ may extend from regions immediately under p$^+$-type diffusion regions $6b$, $6d$ and $6f$ to p$^+$-type diffusion regions $5b$–$5e$, and may be cut at other portions, respectively. In this case, the current drive capability is higher than the bipolar transistor of the fourth embodiment of the invention, and is lower than the bipolar transistors shown in FIGS. 11 and 12 described above. The breakdown voltage between the collector and the emitter is lower than that of the bipolar transistor of the fourth embodiment of the invention, and is higher than the bipolar transistors shown in FIGS. 11 and 12.

(Sixth Embodiment)

A semiconductor device of a sixth embodiment of the invention will now be described with reference to FIG. 13.

Figure 13:
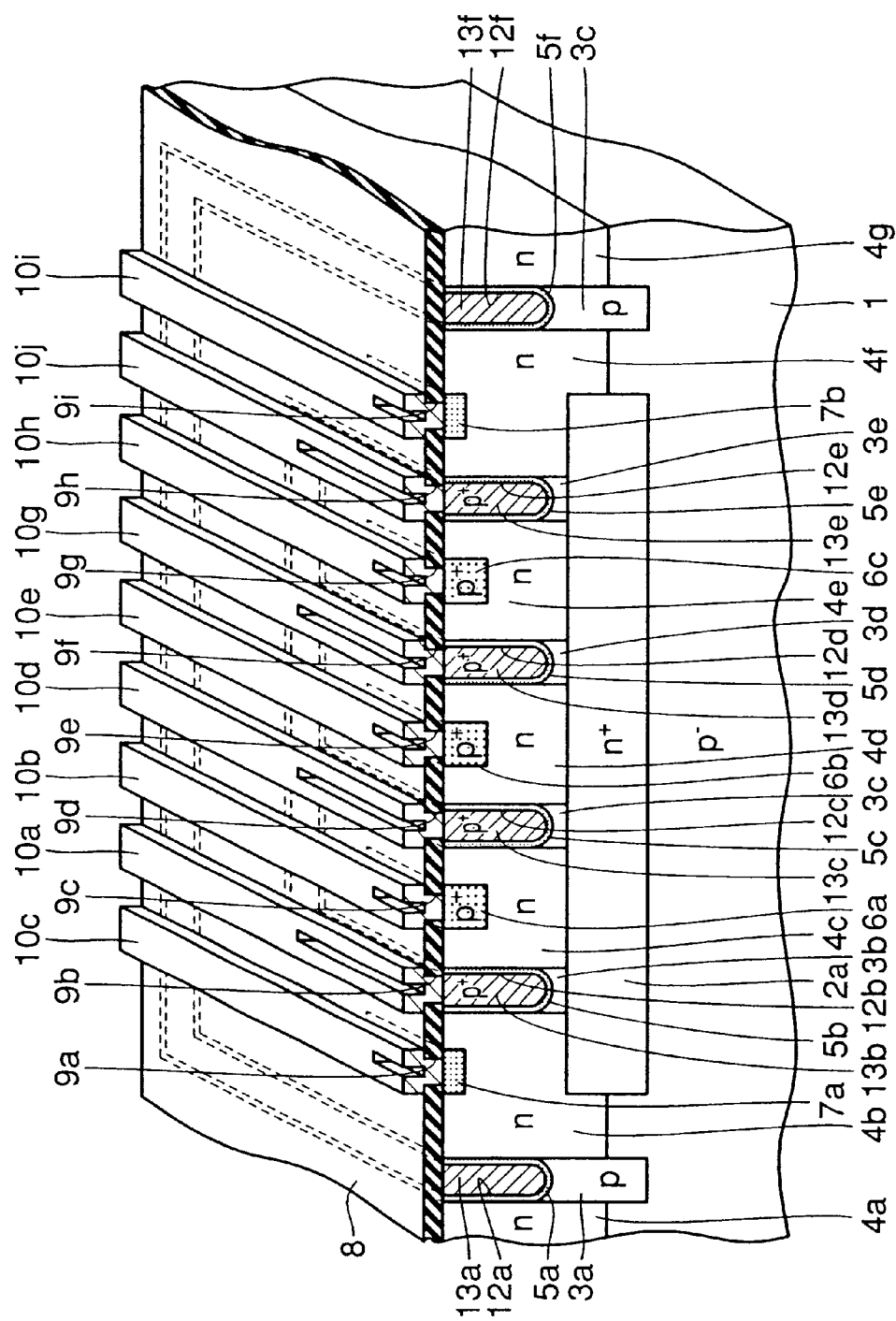
FIG. 13 is a schematic perspective view showing a semiconductor device of a sixth embodiment of the invention.

Referring to FIG. 13, the semiconductor device has a structure basically similar to that of the semiconductor device shown in FIG. 5, but differs therefrom in the structures of the collector region and the element isolation. The collector regions are provided with grooves $12b$–$12e$, which extend from the main surfaces of the n-type epitaxial layers $4a$–$4g$ to p-type buried regions $3b$–$3e$ serving as the collector buried layers. Grooves $12b$–$12e$ are filled with p-type polycrystalline silicon films $13b$–$13e$ serving as the conductors of the second conductivity type, similarly to the semiconductor device shown in FIG. 1. p$^+$-type diffusion regions $5b$–$5e$ are formed around the grooves. The collector regions are formed of p-type buried regions $3b$–$3e$, p-type polycrystalline silicon films $13b$–$13e$ and p$^+$-type diffusion regions $5b$–$5e$. The element isolation structure of the trench type utilizing grooves $12a$ and $12f$ is employed as the element isolation similarly to the semiconductor device of the first embodiment.

According to the above structure, the effect of reducing the areas occupied by the collector regions and the element isolation can be achieved similarly to the first embodiment of the invention, in addition to the effects achieved by the second embodiment of the invention. Therefore, the area occupied by the bipolar transistor can be reduced.

A modification of the semiconductor device of the sixth embodiment of the invention will now be described below with reference to FIG. 14.

Figure 14:
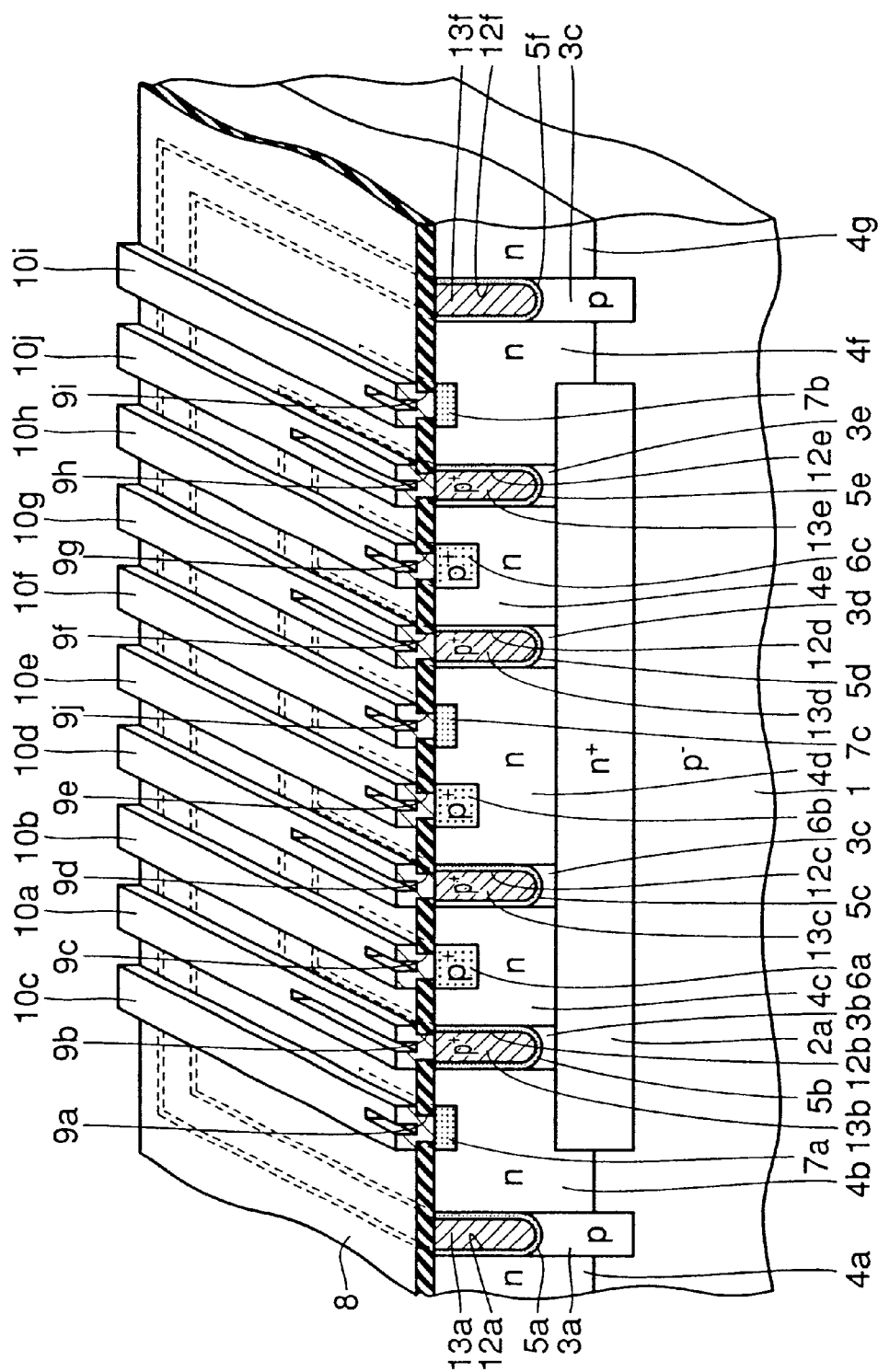
FIG. 14 is a schematic perspective view showing a modification of the semiconductor device of the sixth embodiment according to the invention shown in FIG. 13.

Referring to FIG. 14, the semiconductor device has a structure basically similar to that of the semiconductor device shown in FIG. 13, but differs therefrom in that n$^+$-type diffusion region $7c$ is formed in a substantially central portion (i.e., a region located between p$^+$-type diffusion region $6d$ and groove $12d$) of the bipolar transistor similarly to the semiconductor device shown in FIG. 6. Oxide film 8 is provided with contact hole $9j$ similarly to the semiconductor device shown in FIG. 6. Electrode $10f$, which serves as the base leader electrode, is formed above contact hole $9j$. The structure described above can achieve the effects similar to those obtained by the semiconductor device shown in FIG. 6 in addition to those obtained by the semiconductor device shown in FIG. 13.

The semiconductor devices shown in FIGS. 13 and 14 can be manufactured in a method which is basically similar to the method of manufacturing the semiconductor device shown in FIG. 5. Grooves 12a–12f, p-type polycrystalline silicon films 13b–13e and p$^+$-type diffusion regions 5b–5e can be manufactured by utilizing the method of manufacturing the semiconductor device of the first embodiment of the invention.

(Seventh Embodiment)

A semiconductor device of a seventh embodiment of the invention will now be described with reference to FIG. 15.

Figure 15:
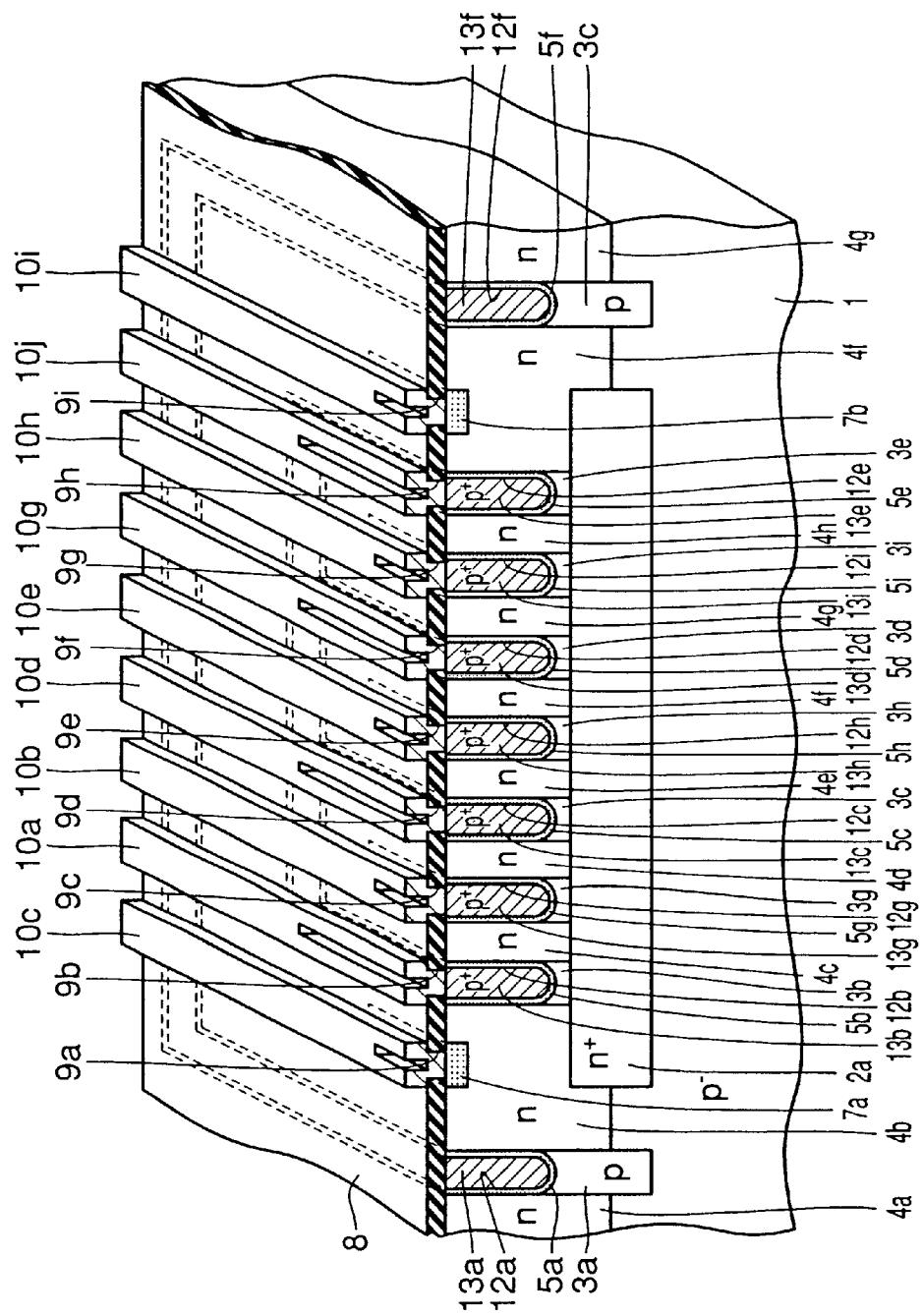
FIG. 15 is a schematic perspective view showing a semiconductor device of a seventh embodiment of the invention.

Referring to FIG. 15, the semiconductor device has a structure basically similar to that of the semiconductor device shown in FIG. 13, but differs therefrom in the structure of the emitter region. Similarly to the third embodiment of the invention, the emitter regions is provided with p-type buried regions 3g–3i serving as the emitter buried layers. Grooves 12g–12i are formed as additional grooves extending from the main surface of the n-type epitaxial layer to p-type buried regions 3g–3i. Grooves 12g–12i are filled with p-type polycrystalline silicon films 13g–13i serving as additional conductors of the second conductivity type. p$^+$-type diffusion regions 5g–5i are formed around grooves 12g–12i, respectively. The emitter regions are formed of p-type buried regions 3g–3i, p-type polycrystalline silicon films 13g–13i serving as other impurity diffusion regions, and p$^+$-type diffusion regions 5g–5i.

According to this structure, effects similar to those obtained by the sixth embodiment of the invention can be achieved. Further, by utilizing p-type polycrystalline silicon films 13g–13i filling grooves 12g–12i serving as the emitter regions, the width of the emitter region can be smaller than that of the emitter region formed in the conventional diffusion step. Consequently, the area occupied by the bipolar transistor can be further reduced.

If p-type buried regions 3g–3i are not formed, and only p-type polycrystalline silicon films 13g–13i filling grooves 12g–12i and p$^+$-type diffusion regions 5g–5i are formed. as the emitter regions, the surface area of the emitter region can be increased to exceed that in the sixth embodiment of the invention by providing grooves 12g–12i having a sufficiently large depth. In this case, therefore, the current drive capability can be increases as compared with the sixth embodiment of the invention.

A modification of the semiconductor device of the seventh embodiment of the invention will now be described below with reference to FIG. 16.

Figure 16:
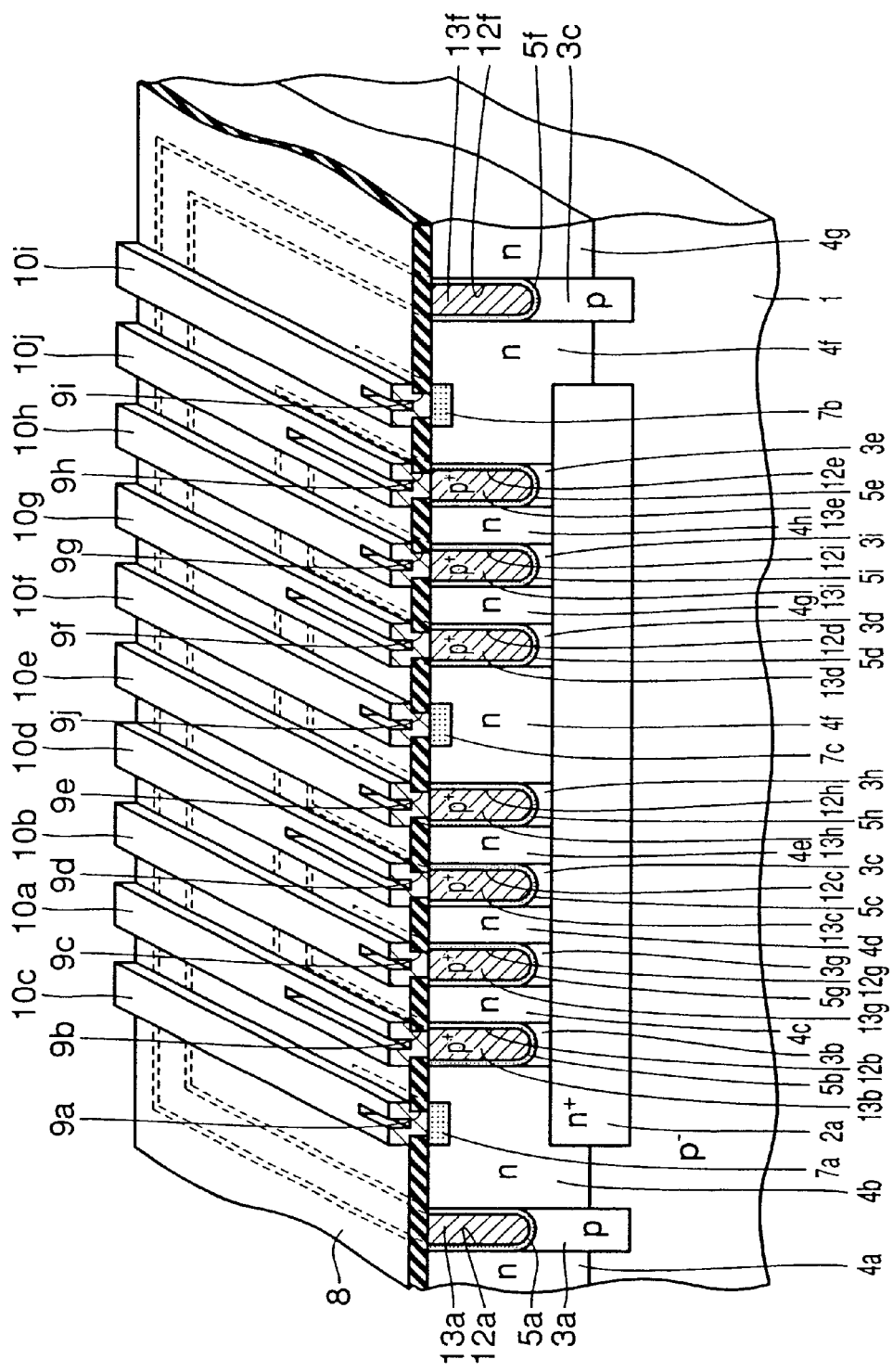
FIG. 16 is a schematic perspective view showing a modification of the semiconductor device of the seventh embodiment according to the invention shown in FIG. 15.

Referring to FIG. 16, the semiconductor device has a structure basically similar to that of the semiconductor device shown in FIG. 15, but differs therefrom in that n$^+$-type diffusion region 7c is formed in a substantially central portion (i.e., a region located between grooves 12h and 12d) of the bipolar transistor similarly to the semiconductor device shown in FIG. 6. Oxide film 8 is provided with contact hole 9j similarly to the semiconductor device shown in FIG. 6. Electrode 10f, which serves as the base leader electrode, is formed above contact hole 9j. The structure described above can achieve the effects similar to those obtained by the semiconductor device shown in FIG. 6 in addition to those obtained by the semiconductor device shown in FIG. 15.

The semiconductor devices shown in FIGS. 15 and 16 can be manufactured in a method which is similar to the method of manufacturing the semiconductor device shown in FIG. 13. Grooves 12g–12i, p-type polycrystalline silicon films 13g–13i and p$^+$-type diffusion regions 5g–5i can be manufactured by utilizing the method of manufacturing the semiconductor device of the first embodiment of the invention.

(Eighth Embodiment)

A semiconductor device of an eighth embodiment of the invention will now be described with reference to FIG. 17.

Figure 17:
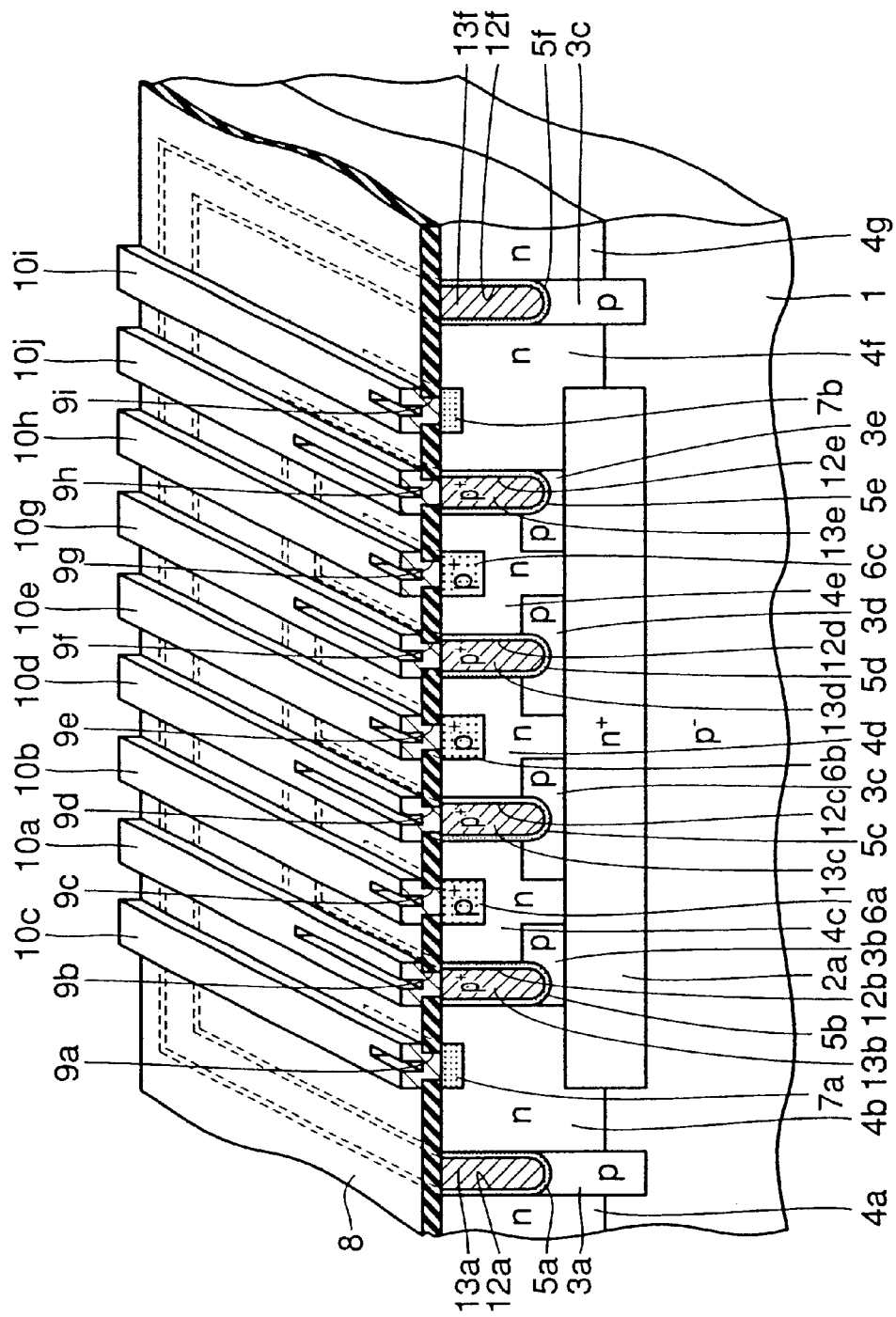
FIG. 17 is a schematic perspective view showing a semiconductor device of an eighth embodiment of the invention.

Referring to FIG. 17, the semiconductor device has a structure basically similar to that of the semiconductor device shown in FIG. 13, but differs therefrom in the configurations of p-type buried regions 3b–3e serving as the collector buried layers forming the collector regions. p-type buried regions 3b–3e serving as the collector buried layers are located at deeper positions than p$^+$-type diffusion regions 6a–6c serving as the emitter regions viewed from the main surfaces of n-type epitaxial layers 4a–4g, and extend in the regions other than the regions located immediately under p$^+$-type diffusion regions 6a–6c. Thus, p-type buried regions 3b–3e are not present in the regions located under p$^+$-type diffusion regions 6a–6c.

In the above structure, the p-type buried regions 3b–3e serving as the collector buried layers can have larger surface areas than those of the semiconductor device of the sixth embodiment of the invention. Therefore, the area of contact between the collector and base regions can be increased so that the collector resistance can be reduced. As a result, the current drive capability can be further increased.

Since p-type buried regions 3b–3e are not present immediately under p$^+$-type diffusion regions 6a–6c, the breakdown voltage between the collector and the emitter can be increased as compared with the structure having the collector buried layer extended to the position immediately under the emitter region.

A modification of the semiconductor device of the eighth embodiment of the invention will now be described below with reference to FIG. 18.

Figure 18:
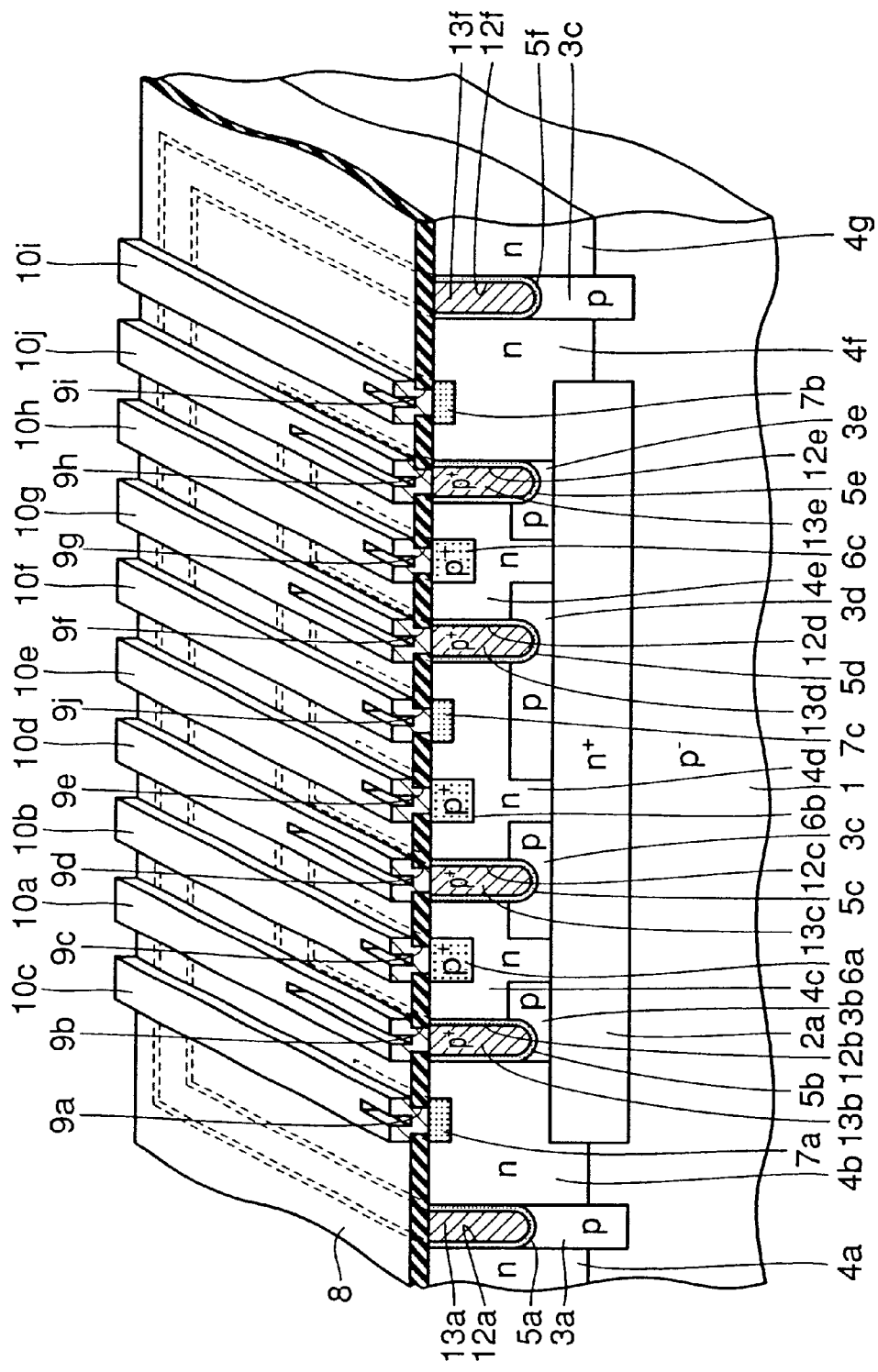
FIG. 18 is a schematic perspective view showing a modification of the semiconductor device of the eighth embodiment according to the invention shown in FIG. 17.

Referring to FIG. 18, the semiconductor device has a structure basically similar to that of the semiconductor device shown in FIG. 17, but differs therefrom in that n$^+$-type diffusion region 7c is formed in a substantially central portion (i.e., a region located between p$^+$-type diffusion region 6b and groove 12d) of the bipolar transistor similarly to the semiconductor device shown in FIG. 6. Oxide film 8 is provided with contact hole 9j similarly to the semiconductor device shown in FIG. 6. Electrode 10f, which serves as the base leader electrode, is formed above contact hole 9j. The structure described above can achieve the effects similar to those obtained by the semiconductor device shown in FIG. 6 in addition to those obtained by the semiconductor device shown in FIG. 17.

The semiconductor devices shown in FIGS. 17 and 18 can be manufactured in a method which is similar to the method of manufacturing the semiconductor device shown in FIGS. 13 and 14.

(Ninth Embodiment)

A semiconductor device of a ninth embodiment of the invention will now be described with reference to FIG. 19.

Figure 19:
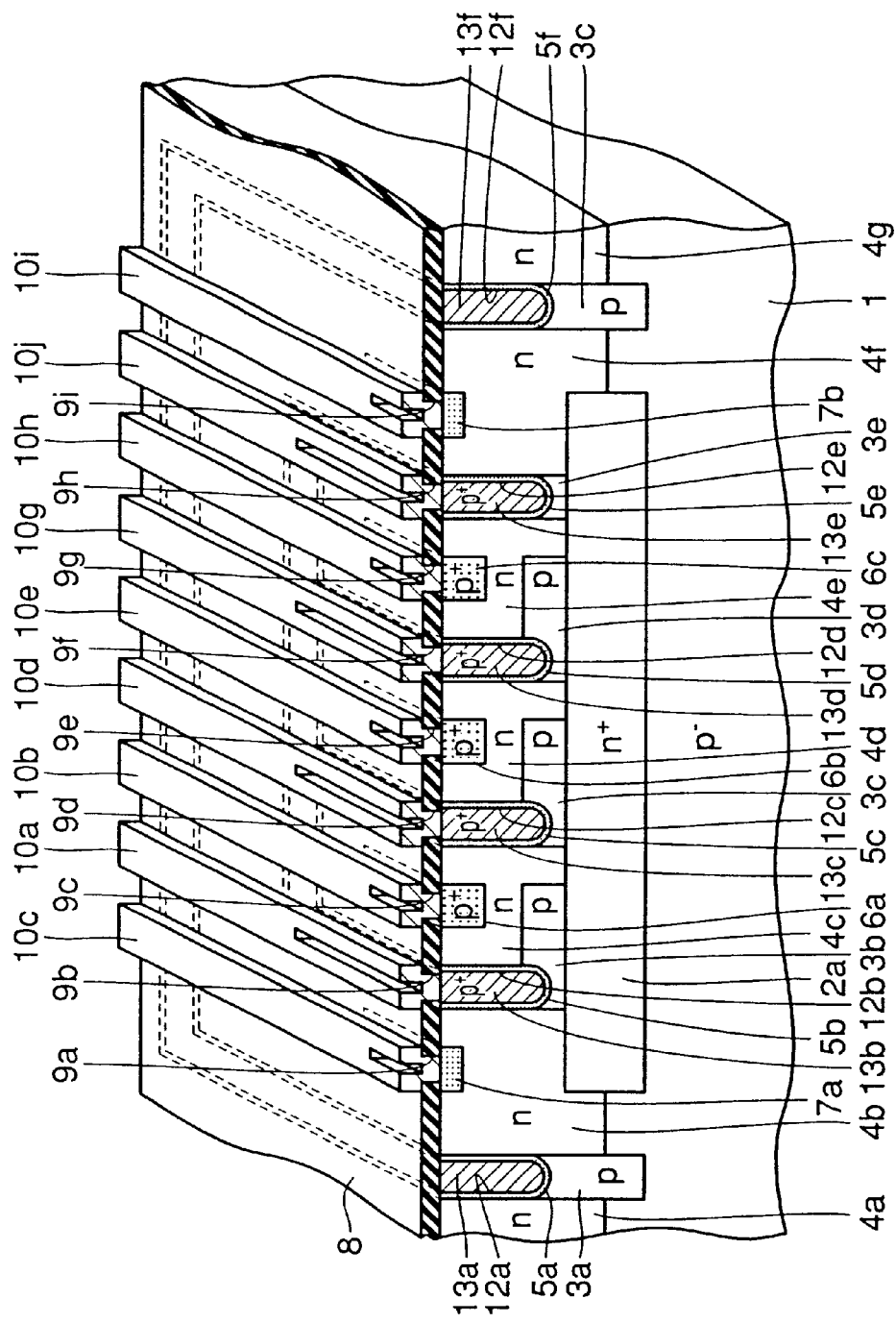
FIG. 19 is a schematic perspective view showing a semiconductor device of a ninth embodiment of the invention.

Referring to FIG. 19, the semiconductor device has a structure basically similar to that of the semiconductor device shown in FIG. 13, but differs therefrom in the configurations of p-type buried regions 3b–3e serving as the collector buried layers forming the collector regions. p-type buried regions 3b–3e serving as the collector buried layers are located at deeper positions than p$^+$-type diffusion regions 6a–6c serving as the emitter regions viewed from the main surfaces of n-type epitaxial layers 4a–4g, and have portions extended to the regions located immediately under p$^+$-type diffusion regions 6b, 6d and 6f.

In this case, the bipolar transistor shown in FIG. 19 can operate similarly to the vertical bipolar transistor. Consequently, it can achieve the current drive capability substantially equal to that of the conventional vertical bipolar transistor in the first embodiment of the invention.

A modification of the semiconductor device of the ninth embodiment of the invention will now be described below with reference to FIG. 20.

Figure 20:
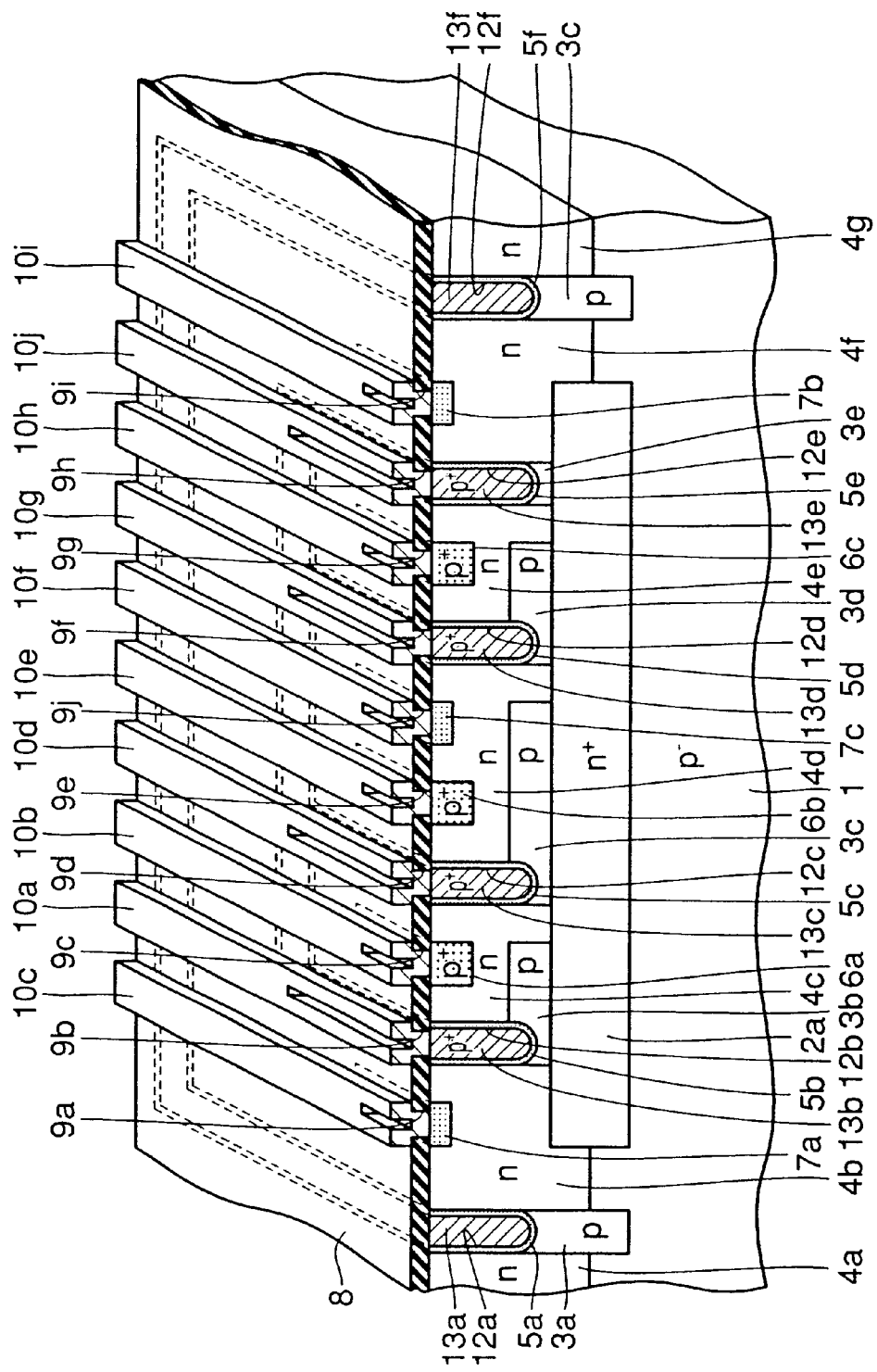
FIG. 20 is a schematic perspective view showing a modification of the semiconductor device of the ninth embodiment according to the invention shown in FIG. 19.

Referring to FIG. 20, the semiconductor device has a structure basically similar to that of the semiconductor device shown in FIG. 19, but differs therefrom in that n$^+$-type diffusion region 7c is formed in a substantially central portion (i.e., a region located between p$^+$-type diffusion region 6b and groove 12d) of the bipolar transistor similarly to the semiconductor device shown in FIG. 6. Oxide film 8 is provided with contact hole 9j similarly to the semiconductor device shown in FIG. 6. Electrode 10f, which serves as the base leader electrode, is formed above contact hole 9j. The structure described above can achieve the effects similar to those obtained by the semiconductor device shown in FIG. 6 in addition to those obtained by the semiconductor device shown in FIG. 19.

The semiconductor devices shown in FIGS. 19 and 20 can be manufactured in a method which is similar to the method of manufacturing the semiconductor device shown in FIGS. 13 and 14.

p-type buried regions 3b–3e may have various configurations other than those of p-type buried regions 3b–3e of the eighth and ninth embodiments of the invention described above. For example, p-type buried regions 3b–3e may extend from regions immediately under p$^+$-type diffusion regions 6b, 6d and 6f to p$^+$-type diffusion regions 5b–5e, and may be cut at other portions, respectively.

(Tenth Embodiment)

A semiconductor device of a tenth embodiment of the invention will now be described with reference to FIG. 21.

Figure 21:
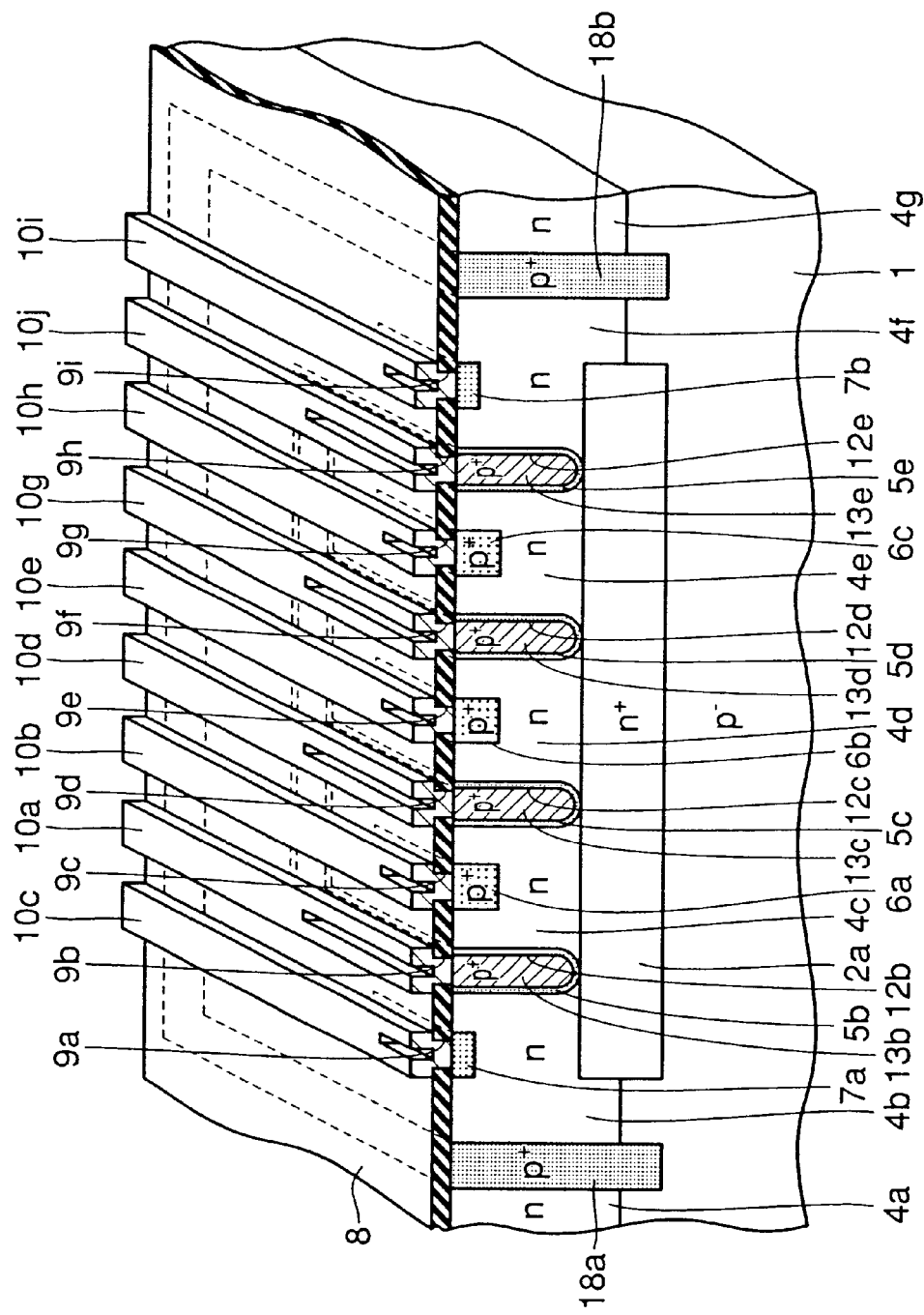
FIG. 21 is a schematic perspective view showing a semiconductor device of a tenth embodiment of the invention.

Referring to FIG. 21, the semiconductor device has a structure basically similar to that of the semiconductor device shown in FIG. 13, but differs therefrom in the structures of the collector region and the element isolation. Grooves 12b–12e are formed at the main surfaces of the n-type epitaxial layers 4a–4g, and are filled with p-type polycrystalline silicon films 13b–13e serving as the conductors. p$^+$-type diffusion regions 5b–5e serving as the impurity diffusion layers are formed around grooves 12b–12e, respectively. The collector regions are formed of p-type polycrystalline silicon films 13b–13e and p$^+$-type diffusion regions 5b–5e. Grooves 12b–12e have larger depths than grooves 12b–12e (see FIG. 13) of the sixth embodiment of the invention. The collector regions formed of p-type polycrystalline silicon films 13b–13e filling grooves 12b–12e as well as p$^+$-type diffusion regions 5b–5e can be located as close as possible to n$^+$-type buried region 2a in view of the breakdown voltage between the collector and the base. If the impurity concentrations of p$^+$-type diffusion regions 5b–5e and n$^+$-type buried region 2a are set to appropriate values, the above collector regions can be in contact with n$^+$-type buried region 2a as shown in FIG. 21. In this case, since the collector regions extend to a deep region where n$^+$-type buried region 2a is formed, the surface area of the collector regions can be increased. Accordingly, the current drive capability can be further improved. As the element isolation, p$^+$-type diffusion layers 18a and 18b surrounding the pnp bipolar transistor are formed.

According to the above structure, since p-type polycrystalline silicon films 13b–13e filling grooves 12b–12e as well as p$^+$-type diffusion regions 5b–5e formed around grooves 12b–12e can be utilized as the collector regions, the area occupied by the collector regions can be smaller than that occupied by the collector regions formed in the conventional diffusion step. As a result, the area occupied by the bipolar transistor can be reduced so that the sizes of the semiconductor device can be easily reduced.

Similarly to the sixth embodiment of the invention, electrodes 10c and 10i forming the base leader electrodes are formed in the portion other than the portion between the collector and emitter regions in the lateral bipolar transistor. As a result, in the case where the plurality of collector regions, the plurality of base regions and the plurality of emitter regions are formed for obtaining a further increased current drive capability as shown in FIG. 21, base leader electrodes 10c and 10i which can be utilized commonly to the plurality of base regions can be formed in the region other than the region between the collector and the emitter regions. Therefore, the number of base leader electrodes 10c and 10i can be smaller than the number of n-type epitaxial layers 4c–4e serving as the plurality of base regions. Consequently, the area occupied by the bipolar transistor can be reduced as compared with the conventional case where the plurality of base leader electrodes are formed corresponding to the n-type epitaxial layers 4c–4e serving as the base regions, respectively.

n-type epitaxial layers 4c–4e serving as the base regions located between the emitter regions and the collector regions are electrically connected to electrodes 10c and 10i serving as the base leader electrode via n$^+$-type buried region 2a and n-type epitaxial layers 4b and 4f. By sufficiently increasing the impurity concentration of n$^+$-type buried region 2a, the base leader resistance can be reduced.

Figure 22:
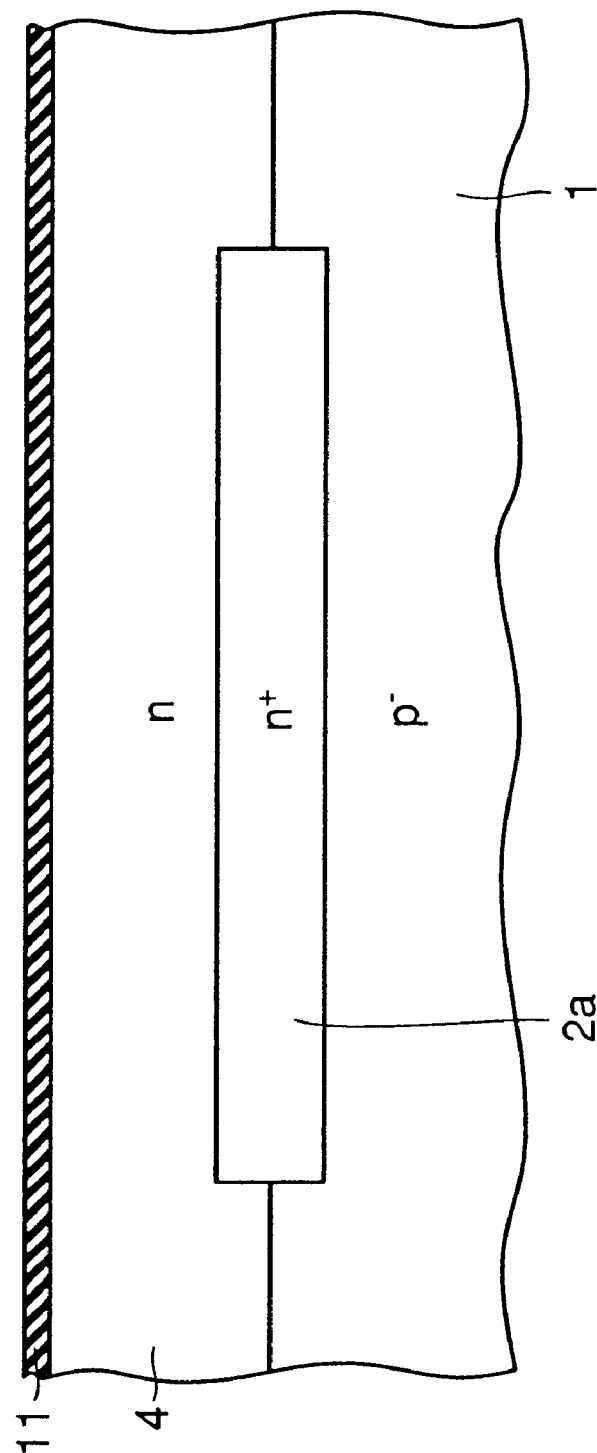
FIGS. 22 and 23 are schematic cross sections showing first and second steps of the method of manufacturing the semiconductor device shown in FIG. 21, respectively.
Figure 23:
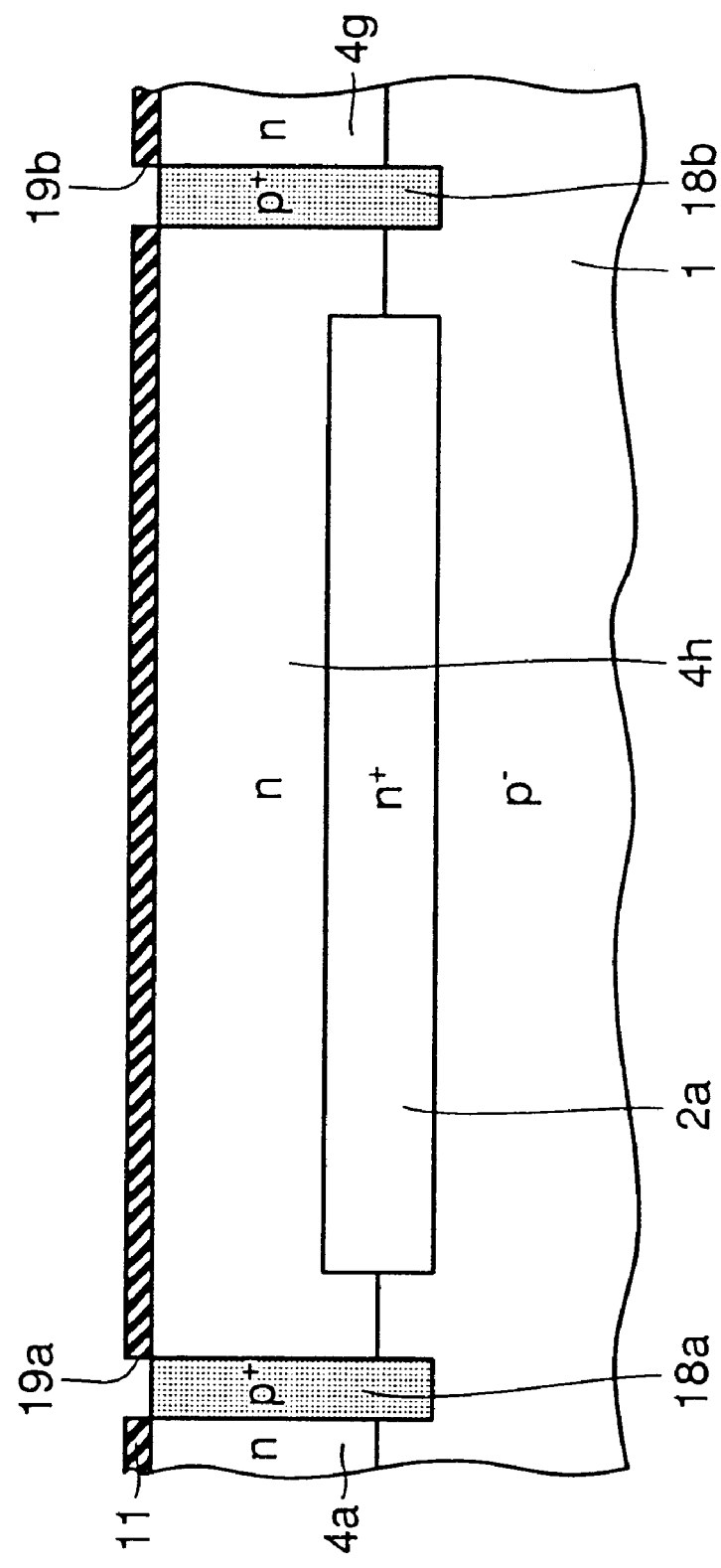
Figure 24:
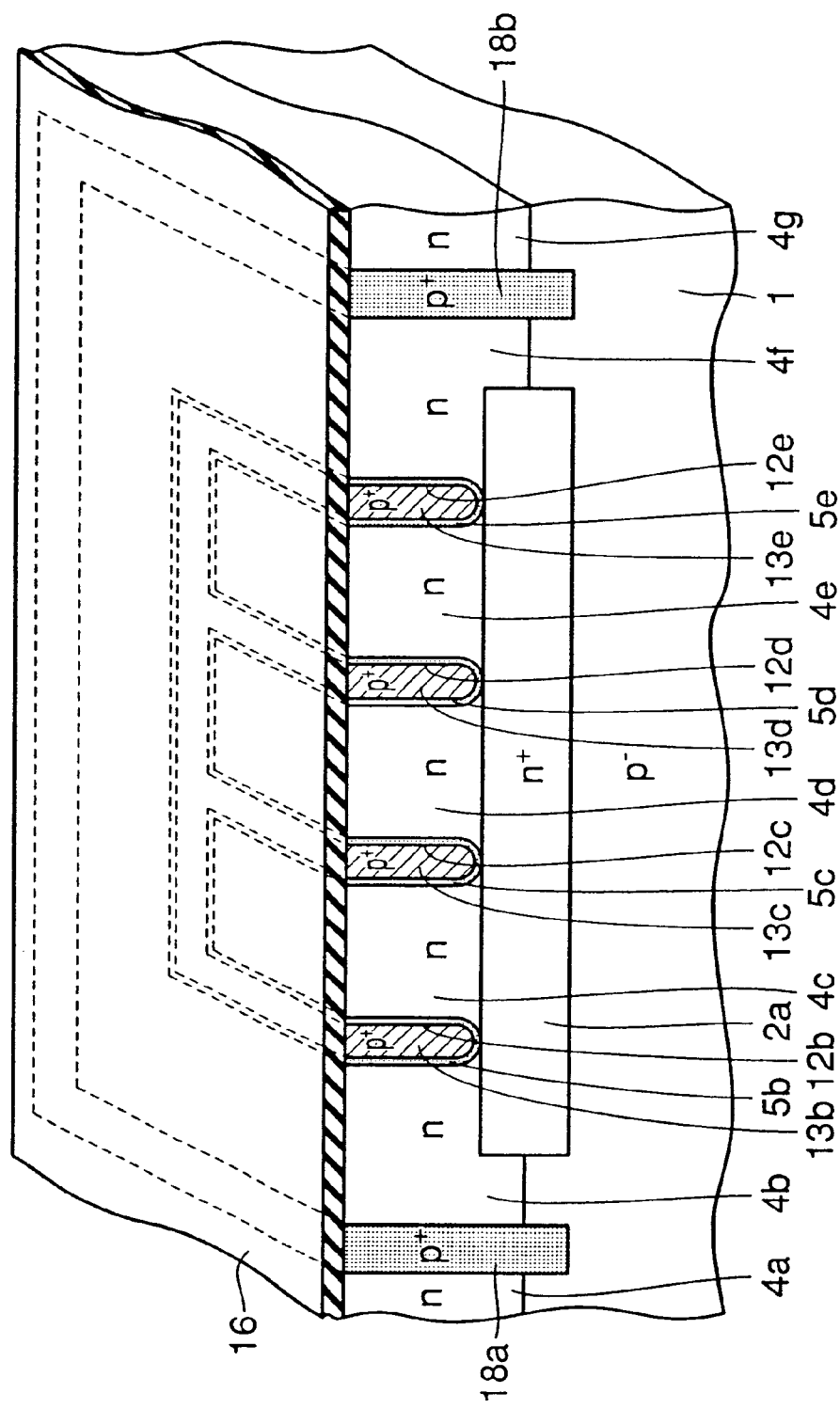
FIG. 24 is a schematic perspective view showing a third step of the method of manufacturing the semiconductor device shown in FIG. 21.

Referring to FIGS. 22–24, a method of manufacturing the semiconductor device shown in FIG. 21 will now be described.

First, the n$^+$-type buried region is formed at the main surface of p$^-$-type substrate 1 (see FIG. 22). Then, the epitaxial growth method is conducted to form n-type epitaxial layer 4 (see FIG. 22) on the main surface of p$^-$-type substrate 1. When this epitaxial growth method is being conducted, electrically conductive impurities diffuse from the n$^+$-type buried region into n-type epitaxial layer 4. Thereby, n$^+$-type buried region 2a (see FIG. 22) is formed. Then, thermal oxide film 11 (see FIG. 22) is formed on the top surface of n-type epitaxial layer 4 in a step similar to that shown in FIG. 3. In this manner, the structure shown in FIG. 22 is obtained.

Then, thermal oxide film 11 is partially removed to form openings 19a and 19b as shown in FIG. 23. Through these openings, p-type impurities are diffused into the predetermined regions of n-type epitaxial layer 4 so that p$^+$-type diffusion regions 18a and 18b reaching p$^-$-type substrate 1 are formed. p$^+$-type diffusion regions 18a and 18b divide n-type epitaxial layer 4 (see FIG. 22) into n-type epitaxial layers 4a, 4h and 4g.

After forming p$^+$-type diffusion regions 18a and 18b, thermal oxide film 11 is partially removed to form openings (not shown). In the region located under these openings, n-type epitaxial layer 4h is provided with grooves 12b–12e (see FIG. 24) at a depth reaching n$^+$-type buried region 2a. Grooves 12b–12e are filled with p-type polycrystalline silicon films 13b–13e in a method similar to that of the first embodiment of the invention. p-type polycrystalline silicon films 13b–13e may be doped with, e.g., boron. Thermal processing is performed to form p$^+$-type diffusion regions 5b–5e similarly to the first embodiment of the invention. Thereafter, the thermal oxide film is once removed. Thermal oxidation is performed again to form oxide film 16 on the top surfaces of n-type epitaxial layers 4a–4g. In this manner, the structure shown in FIG. 24 is obtained.

Thereafter, a resist film (not shown) is formed on oxide film 16. Using this resist film as a mask, boron ions are implanted into the predetermined regions, and then thermal oxidation is performed. In this manner, $p^+$-type diffusion regions 6a–6g (see FIG. 21) are formed. Thereafter, the resist film is removed. The oxide film are partially removed from portions located above the regions where $n^+$-type diffusion regions 7a and 7b (see FIG. 21) are to be formed, and thereby the openings are formed. Through these openings, n-type impurities are diffused into the predetermined regions in n-type epitaxial layers 4b and 4f so that $n^+$-type diffusion regions 7a and 7b are formed. The thermal oxidation is performed simultaneously with the thermal processing which is performed for activating $n^+$-type diffusion regions 7a and 7b. Thereby, the thermal oxide films are formed in the foregoing openings, respectively. As a result, the top surfaces of n-type epitaxial layers 4a–4g are covered with the oxide film again.

Then, an oxide film doped with phosphorus is formed as a protective film on the above oxide film by the CVD method or the like. This oxide film doped with phosphorus and the previously formed oxide film form oxide film 8 (see FIG. 21).

Contact holes 9a–9i are formed in predetermined regions of oxide film 8 (see FIG. 21). Electrodes 10a–10e and 10g–10i are formed on contact holes 9a–9i. In this manner, the structure shown in FIG. 21 is obtained.

The above manner can remove the steps of forming p-type buried regions 3a–3f required in the sixth embodiment of the invention, and therefore can simplify the steps.

A modification of the semiconductor device of the tenth embodiment of the invention will now be described below with reference to FIG. 25.

Figure 25:
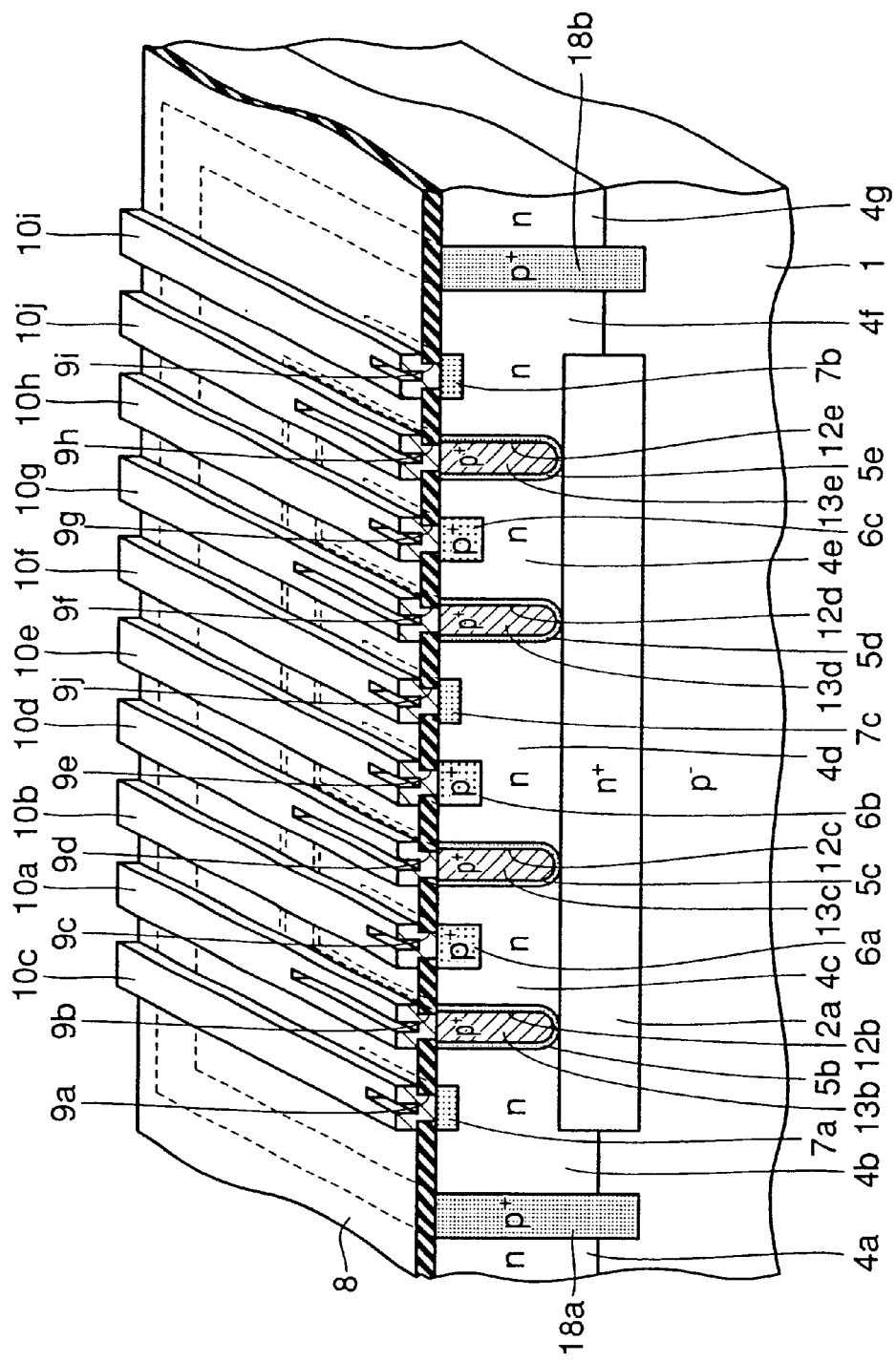
FIG. 25 is a schematic perspective view showing a modification of the semiconductor device of the tenth embodiment according to the invention shown in FIG. 21.

Referring to FIG. 25, the semiconductor device has a structure basically similar to that of the semiconductor device shown in FIG. 21, but differs therefrom in that $n^+$-type diffusion region 7c is formed in a substantially central portion (i.e., a region located between $p^+$-type diffusion region 6b and groove 12d) of the bipolar transistor similarly to the semiconductor device shown in FIG. 6. Oxide film 8 is provided with contact hole 9j similarly to the semiconductor device shown in FIG. 6. Electrode 10f, which serves as the base leader electrode, is formed above contact hole 9j. The structure described above can achieve the effects similar to those obtained by the semiconductor device shown in FIG. 6 in addition to those obtained by the semiconductor device shown in FIG. 21.

The semiconductor device shown in FIG. 25 can be manufactured in a method which is similar to the method of manufacturing the semiconductor device shown in FIG. 21.

(Eleventh Embodiment)

A semiconductor device of an eleventh embodiment of the invention will now be described with reference to FIG. 26.

Figure 26:
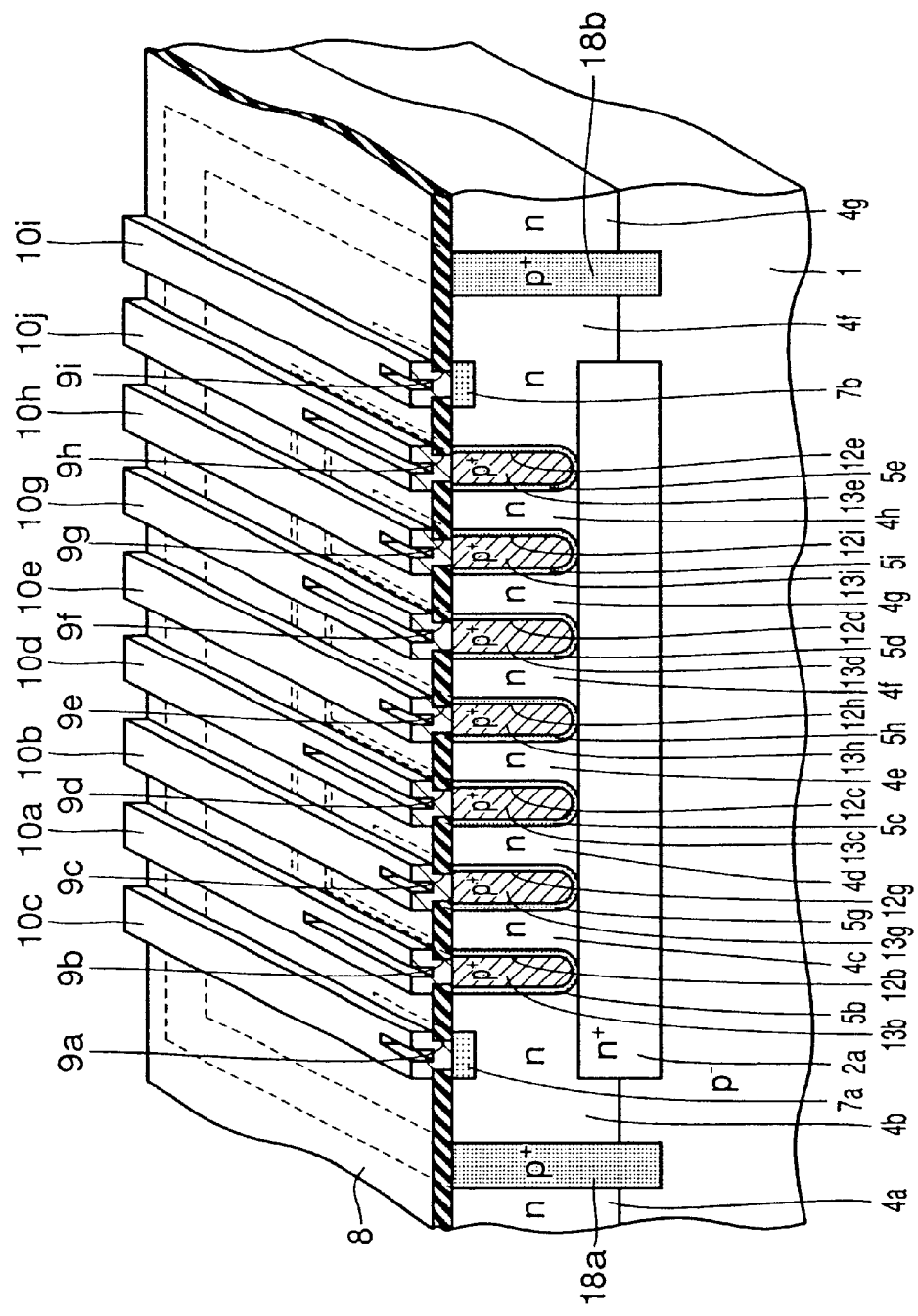
FIG. 26 is a schematic perspective view showing a semiconductor device of an eleventh embodiment of the invention.

Referring to FIG. 26, the semiconductor device has a structure basically similar to that of the semiconductor device shown in FIG. 21, but differs therefrom in the structure of the emitter region. In the semiconductor device shown in FIG. 26, grooves 12g–12i formed at the main surfaces of n-type epitaxial layers 4a–4g are filled with p-type polycrystalline silicon films 13g–13i serving as additional conductors. $p^+$-type diffusion regions 5g–5i serving as the additional impurity diffusion layers are formed around grooves 12b–12e. The emitter regions are formed of p-type polycrystalline silicon films 13g–13i and $p^+$-type diffusion regions 5g–5i. Owing to contact of $p^+$-type diffusion regions 5g–5i with $n^+$-type buried region 2a serving as the buried layer, the emitter regions are in contact with $n^+$-type buried region 2a.

In addition to the effects achieved by the semiconductor device of the tenth embodiment of the invention, the above structure can increase the surface area of the emitter regions because the emitter regions are likewise extended to a deep position in contact with $n^+$-type buried region 2a. Therefore, the current drive capability can be improved.

Since the emitter regions are formed by utilizing grooves 12g–12i, similarly to the collector regions, the area occupied by the emitter regions can be smaller than that of the emitter regions formed in the conventional diffusion step.

A modification of the semiconductor device of the eleventh embodiment of the invention will now be described below with reference to FIG. 27.

Figure 27:
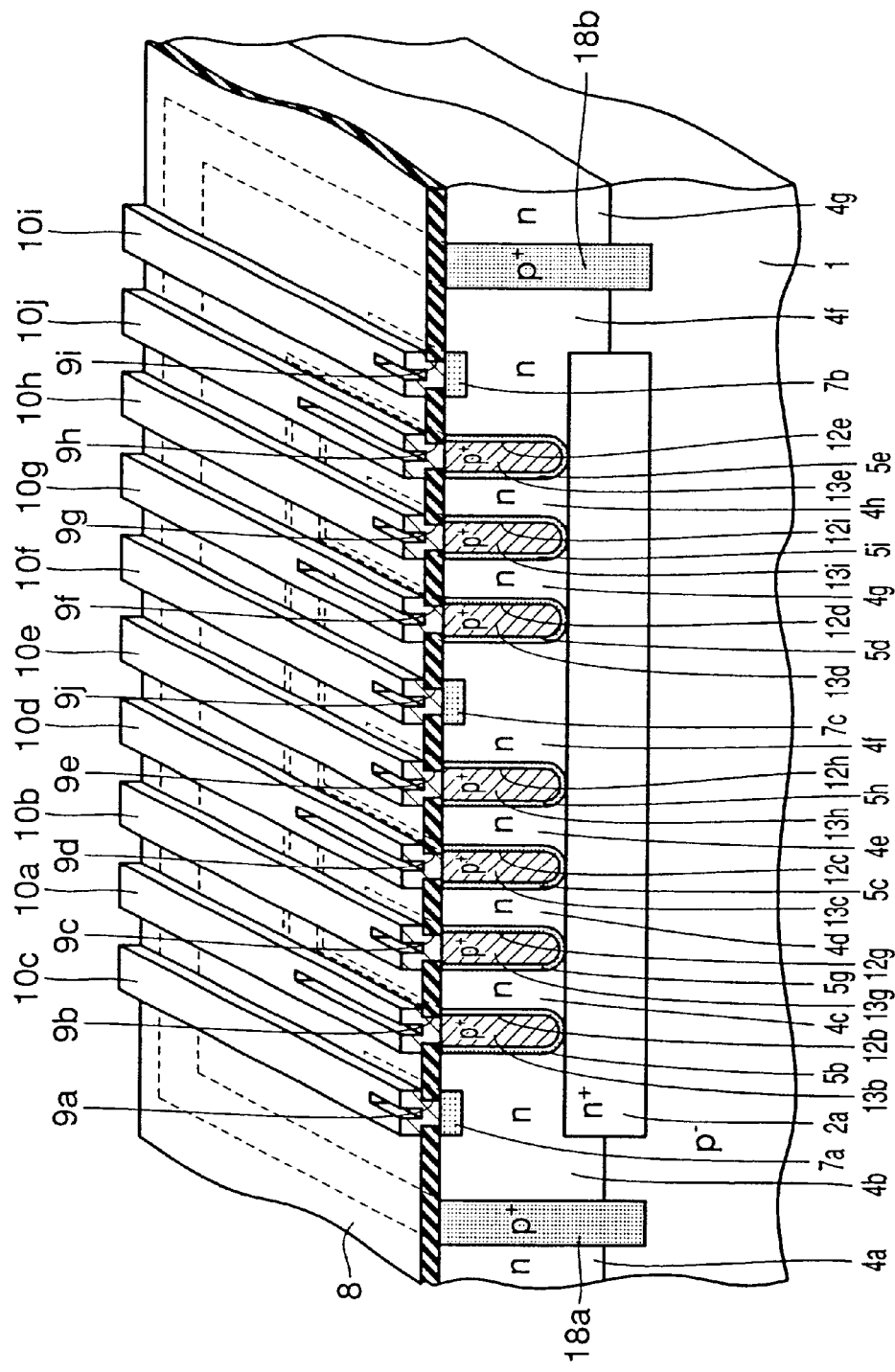
FIG. 27 is a schematic perspective view showing a modification of the semiconductor device of the eleventh embodiment according to the invention shown in FIG. 26.
Figure 28:
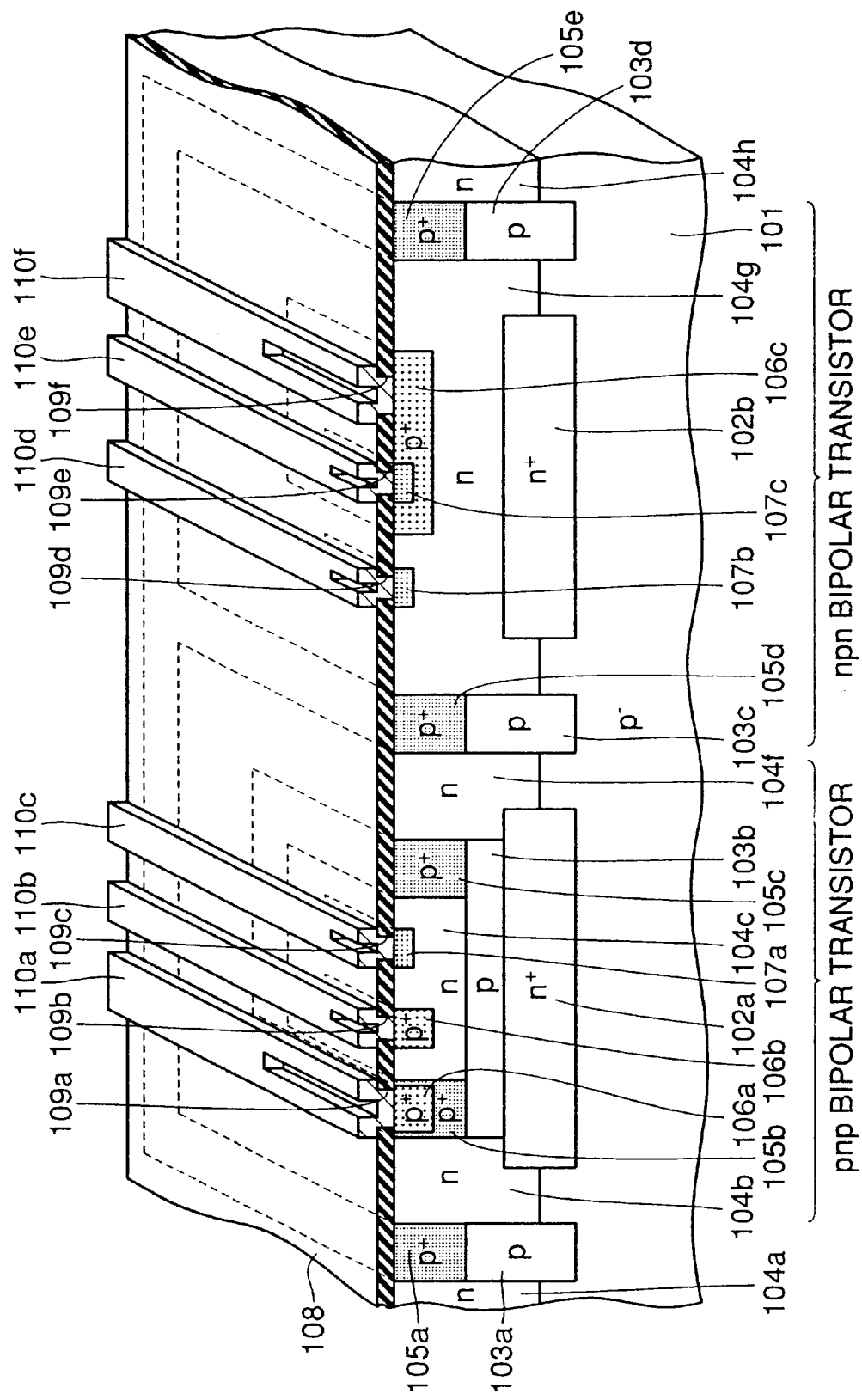
FIG. 28 is a schematic perspective view of a bipolar IC which is an example of a conventional semiconductor device.
Figure 29:
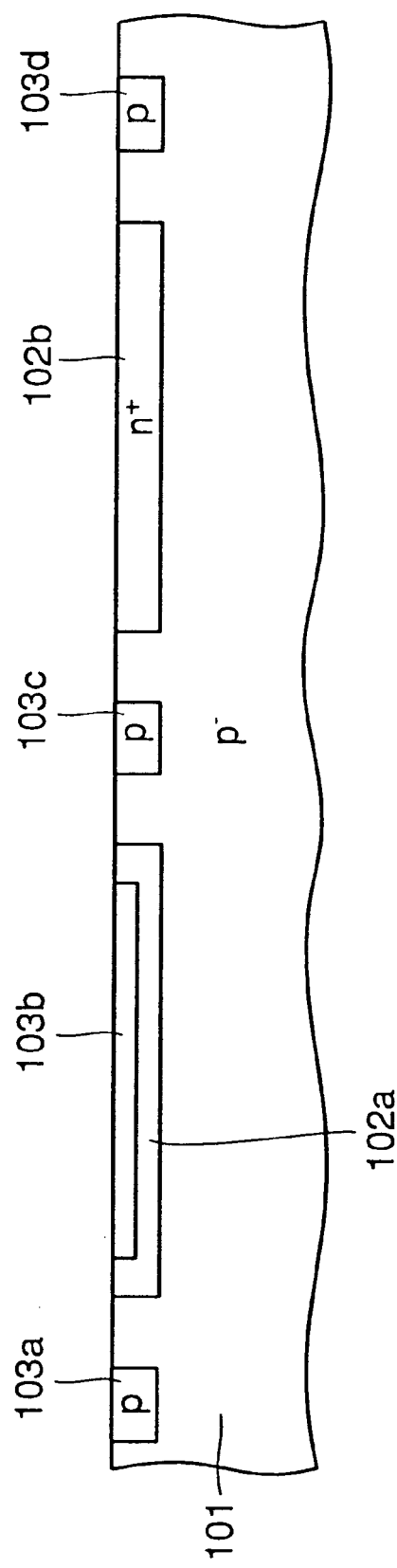
FIGS. 29 and 30 are schematic cross sections showing first and second steps in a method of manufacturing the bipolar IC which is an example of the conventional semiconductor device shown in FIG. 28, respectively.
Figure 30:
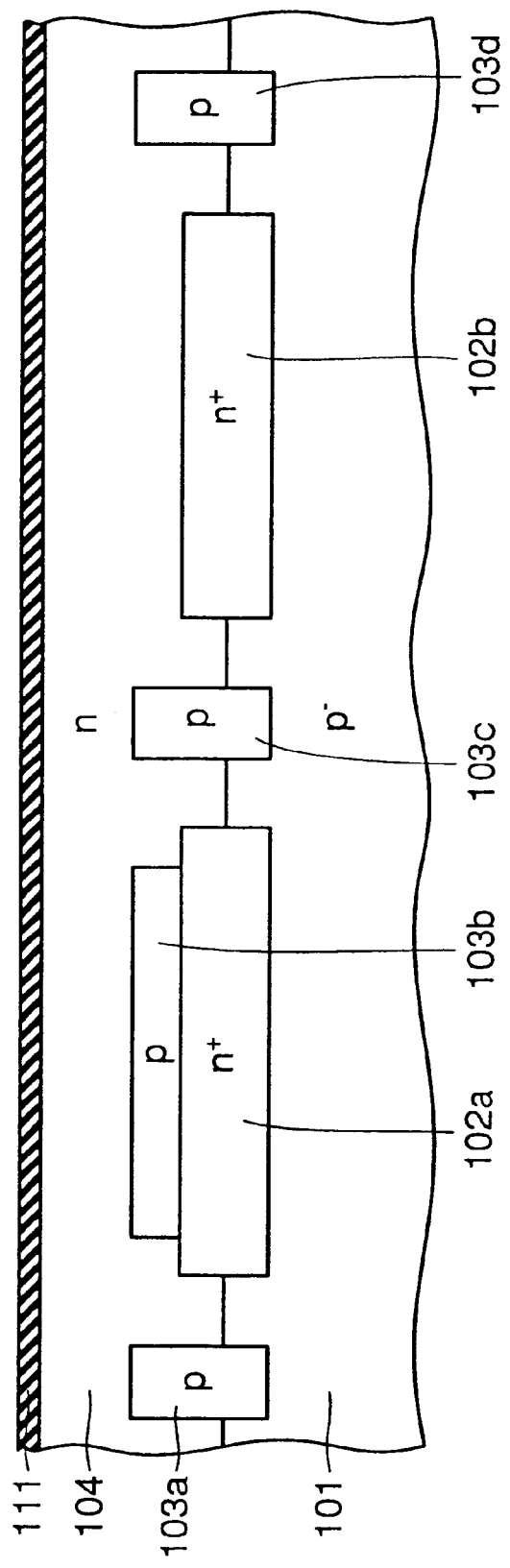
Figure 31:
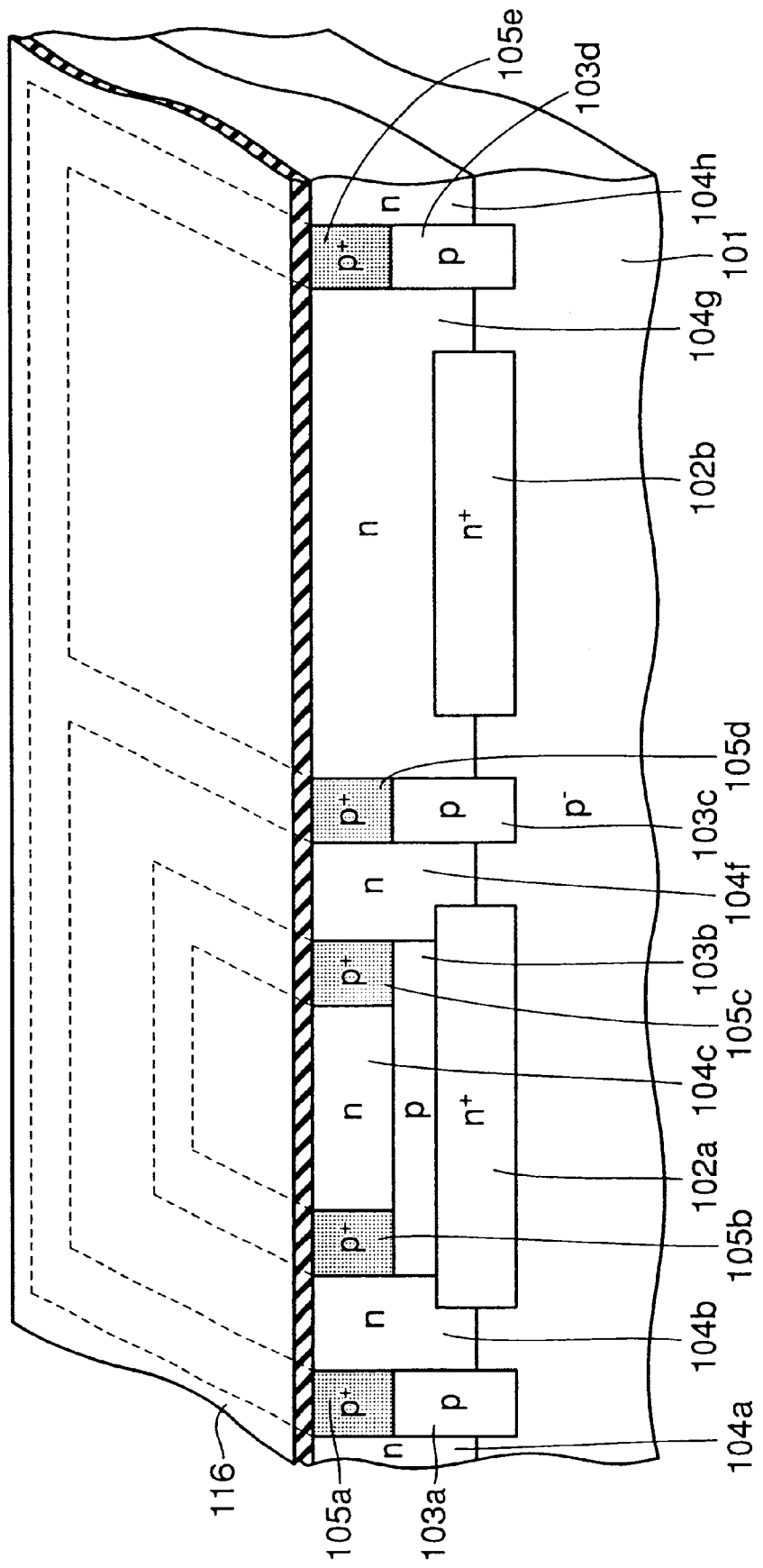
FIGS. 31 and 32 are schematic perspective views showing third and fourth steps in the method of manufacturing the bipolar IC which is an example of the conventional semiconductor device shown in FIG. 28, respectively.
Figure 32:
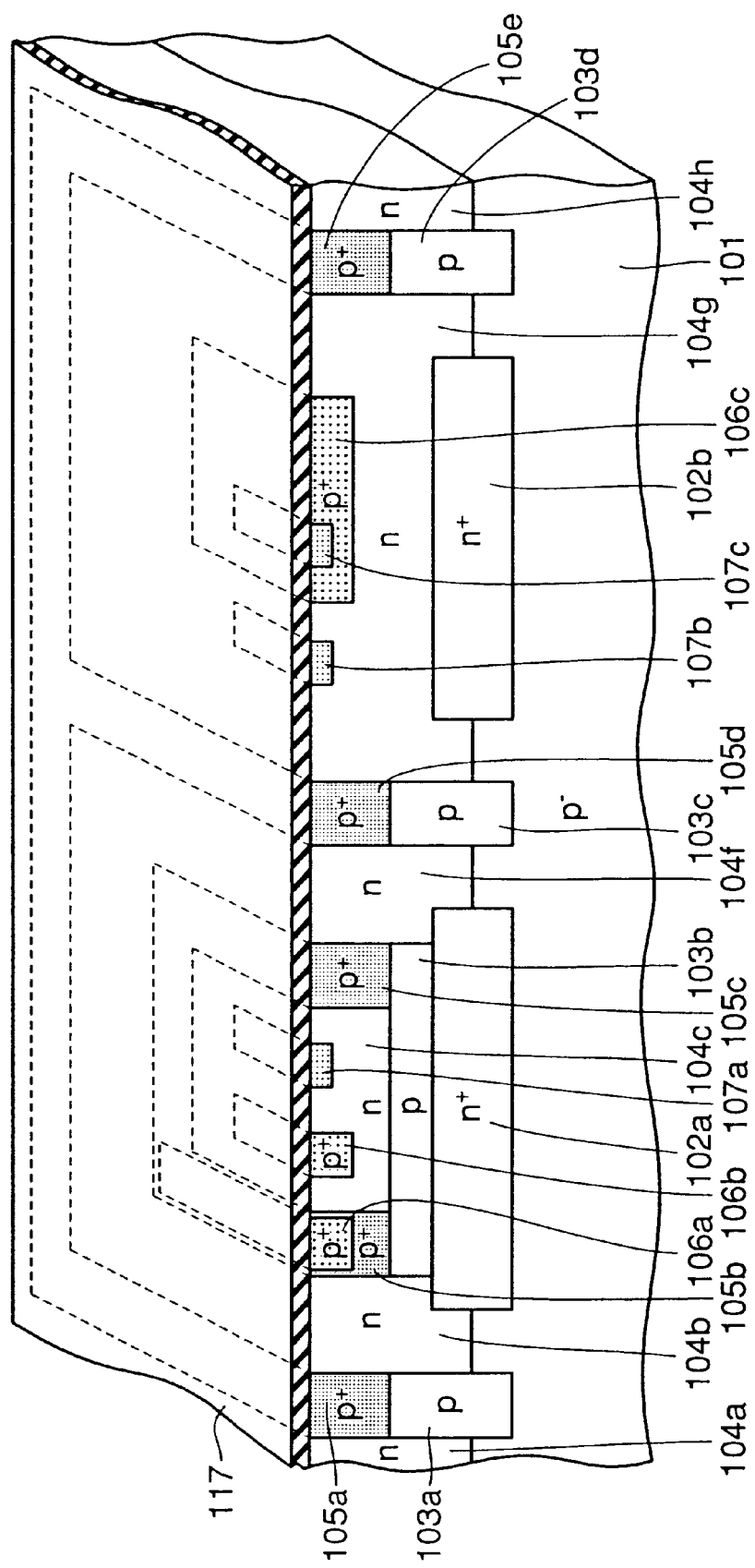

Referring to FIG. 27, the semiconductor device has a structure similar to that of the semiconductor device shown in FIG. 26, but differs therefrom in that $n^+$-type diffusion region 7c is formed in a substantially central portion (i.e., a region located between grooves 12h and 12d) of the bipolar transistor similarly to the semiconductor device shown in FIG. 6. Oxide film 8 is provided with contact hole 9j similarly to the semiconductor device shown in FIG. 6. Electrode 10f, which serves as the base leader electrode, is formed above contact hole 9j. The structure described above can achieve the effects similar to those obtained by the semiconductor device shown in FIG. 6 in addition to those obtained by the semiconductor device shown in FIG. 26.

The semiconductor device shown in FIGS. 26 and 27 can be manufactured in a method which is similar to the method of manufacturing the semiconductor device shown in FIG. 21.

The first to eleventh embodiments have been described in connection with the pnp bipolar transistor. However, the invention can be applied to the npn bipolar transistor in which case the p- and n-types are substituted for each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a substrate;
   a first conductivity type region formed on said substrate, and having a main surface;
   a collector region of a second conductivity type formed in said first conductivity type region;
   a base region of a first conductivity type located in said first conductivity type region and on said collector region;
   an emitter region of the second conductivity type located in said first conductivity type region and on said base region;
   said first conductivity type region being provided with a groove extending from the main surface of said first conductivity type region to said collector region, and an isolation groove disposed around a vertical bipolar transistor including said collector, base and emitter regions;
   a conductor of the second conductivity type filling said groove;
   an isolation conductor of the second conductivity type filling said isolation groove; and second conductivity type diffusion regions formed surrounding and in contact with the second conductivity type conductors filling said groove and said isolation groove.

2. The semiconductor device according to claim 1, further comprising:
an additional collector region of the second.conductivity type formed in a region surrounded by said isolation groove in said first conductivity type region;
an additional base region of the first conductivity type located in said first conductivity type region and on said additional collector region;
an additional emitter region of the second conductivity type located in said first conductivity type region and on said additional base region,
said first conductivity type region being provided with an additional groove extending from the main surface of said first conductivity type region to said additional collector region; and
an additional conductor of the second conductivity type filling said additional groove.

3. A semiconductor device comprising:
a substrate;
a first conductivity type region formed on said substrate, and having a main surface;
a collector region of a second conductivity type formed at the main surface of said first conductivity type region;
a base region of the first conductivity type disposed in said first conductivity type region, and neighboring to a periphery of said collector region;
an emitter region of the second conductivity type located in said first conductivity type region and formed in a region opposed to said collector region with said base region therebetween; and
a base leader electrode located in said first conductivity type region, and formed in a region opposed to said emitter region with said collector region therebetween, wherein
a bipolar transistor including said collector, base and emitter regions is a lateral bipolar transistor, and
said collector region includes an impurity diffusion region of the second conductivity type formed at the main surface of said first conductivity type region, and a collector buried layer of the second conductivity type in contact with the lower side of said impurity diffusion region, wherein
said impurity diffusion region of the second conductivity type has a bottom surface, and the collector buried layer of the second conductivity type is formed to be in contact with the bottom surface of the impurity diffusion region of the second conductivity type.

4. The semiconductor device according to claim 3, wherein
said collector region is provided with a groove extending from the main surface of said first conductivity type region to said collector buried layer, and
said impurity diffusion region includes a conductor of the second conductivity type filling said groove.

5. The semiconductor device according to claim 4, wherein
said emitter region is provided with an additional groove formed at the main surface of said first conductivity type region, and
said emitter region includes an additional conductor of the second conductivity type filling said additional groove.

6. The semiconductor device according to claim 3, wherein
said emitter region includes an additional impurity diffusion region of the second conductivity type reaching the main surface of said first conductivity type region, and
an emitter buried layer of the second conductivity type in contact with the lower side of said additional impurity diffusion region.

7. The semiconductor device according to claim 6, wherein
said emitter region is provided with an additional groove extending from the main surface of said first conductivity type region to said emitter buried layer, and
said additional impurity diffusion region includes an additional conductor of the second conductivity type filling said additional groove.

8. The semiconductor device according to claim 3, wherein
said collector buried layer is located at a lower level than said emitter region viewed from the main surface of said first conductivity type region, and extends to a region other than the region located immediately under said emitter region.

9. The semiconductor device according to claim 3, wherein
said collector buried layer is located at a lower level than said emitter region viewed from the main surface of said first conductivity type region, and extends to a region located immediately under said emitter region.

10. The semiconductor device according to claim 3 further comprising:
a plurality of bipolar transistors including said bipolar transistor and an additional bipolar transistor and a plurality of base leader electrodes, wherein said additional bipolar transistor comprises:
an additional collector region of the second conductivity type formed at the main surface of the first conductivity type region;
an additional base region of the first conductivity type located in said first conductivity type region, and neighboring to said additional collector region;
an additional emitter region of the second conductivity type located in said first conductivity type region, and formed in a region opposed to said additional collector region with said additional base region therebetween;
wherein said additional bipolar transistor being a lateral bipolar transistor;
a lower level buried layer of the first conductivity type formed under said collector buried layer, and connected to said base region and said additional base region;
a plurality of first $n^+$ diffusion regions formed at the main surface of said first conductivity type region; and
a plurality of first base leader electrodes being formed at the main surface of said first conductivity type region, and being electrically connected to said lower level buried layer, wherein
said first $n^+$ diffusion regions and said first base leader electrodes are arranged on an outer peripheral side of a region where the plurality of bipolar transistors are formed.

11. A semiconductor device comprising:
a substrate;
a first conductivity type region formed on said substrate, and having a main surface;

a collector region of a second conductivity type formed at the main surface of said first conductivity type region;

a base region of a first conductivity type located in said first conductivity type region, and neighboring to the periphery of said collector region;

an emitter region of the second conductivity type located in said first conductivity type region, and formed in a region opposed to said collector region with said base region therebetween; and a base leader electrode located in said first conductivity type region, and formed in a region opposed to said emitter region with said collector region therebetween, wherein a bipolar transistor including said collector, base and emitter regions is a lateral bipolar transistor, and said collector region includes a conductor of the second conductivity type filling a groove having a wall surface formed at the main surface of said first conductivity type region, and an impurity diffusion layer of the second conductivity type formed around said groove, wherein the impurity diffusion layer of the second conductivity type is arranged to cover the entire wall surface of said groove.

12. The semiconductor device according to claim 11, wherein a buried layer of the first conductivity type located under said collector region is formed in said first conductivity type region, and said collector region is in contact with said buried layer.

13. The semiconductor device according to claim 12, wherein said emitter region is in contact with said buried layer.

14. The semiconductor device according to claim 11, wherein said emitter region is provided with an additional groove formed at the main surface of said first conductivity type region, and and said emitter region includes an additional conductor of the second conductivity type filling said additional groove and an additional impurity diffusion layer of the second conductivity type formed around said additional groove.

15. The semiconductor device according to claim 10, wherein a second $n^+$ diffusion region is formed at the main surface of said first conductivity type region; and a second base leader electrode is formed at the main surface of said first conductivity type region, wherein said second $n^+$ diffusion region and said second base leader electrode are arranged inside the region where the plurality of bipolar transistors are formed.

* * * * *